(12) United States Patent
Ny et al.

(10) Patent No.: US 7,340,972 B2
(45) Date of Patent: Mar. 11, 2008

(54) APPARATUS AND METHOD FOR BALANCING AND FOR PROVIDING A COMPLIANT RANGE TO A TEST HEAD

(75) Inventors: Nil O. Ny, Yardley, PA (US); Henri M. Akouka, Moorestown, NJ (US); Alyn R. Holt, Cherry Hill, NJ (US)

(73) Assignee: inTEST Corporation, Cherry Hill, NJ (US)

( * ) Notice: Subject to any disclaimer, the term of this patent is extended or adjusted under 35 U.S.C. 154(b) by 0 days.

(21) Appl. No.: 11/376,584

(22) Filed: Mar. 15, 2006

(65) Prior Publication Data

US 2006/0156836 A1 Jul. 20, 2006

Related U.S. Application Data

(62) Division of application No. 10/381,322, filed as application No. PCT/US01/29530 on Sep. 20, 2001, now Pat. No. 7,084,358.

(60) Provisional application No. 60/301,228, filed on Jun. 27, 2001, provisional application No. 60/234,598, filed on Sep. 22, 2000.

(51) Int. Cl.
*G01D 21/00* (2006.01)
*B65G 9/075* (2006.01)
(52) U.S. Cl. ................... 73/866.5; 414/673
(58) Field of Classification Search .......... 73/866.5, 73/865.9; 324/158.1
See application file for complete search history.

(56) References Cited

U.S. PATENT DOCUMENTS

| | | | | |
|---|---|---|---|---|
| 4,589,815 A | * | 5/1986 | Smith | 324/758 |
| 4,696,197 A | | 9/1987 | Hannel | 74/89.32 |
| 4,705,447 A | * | 11/1987 | Smith | 414/590 |
| 4,893,047 A | * | 1/1990 | Honda | 310/323.02 |
| 5,149,029 A | * | 9/1992 | Smith | 248/124.2 |
| 5,568,056 A | | 10/1996 | Ishimoto | 324/754 |
| 5,606,262 A | * | 2/1997 | Montalbano et al. | 324/758 |
| 5,949,002 A | | 9/1999 | Alden | 73/866.5 |
| 6,006,616 A | | 12/1999 | Baker | 73/866.5 |
| 2004/0051517 A1 | * | 3/2004 | Holt et al. | 324/158.1 |
| 2006/0156850 A1 | * | 7/2006 | Mueller | 74/490.01 |

FOREIGN PATENT DOCUMENTS

JP 07240448 A 9/1995

OTHER PUBLICATIONS

International Search Report for corresponding PCT/US01/29530, issued Jan. 7, 2002.

* cited by examiner

*Primary Examiner*—Hezron Williams
*Assistant Examiner*—Tamiko Bellamy
(74) *Attorney, Agent, or Firm*—RatnerPrestia

(57) ABSTRACT

A load, such as an electronic test head, is supported. A force sensor detects a force received from the load, the force resulting from the load being imbalanced such that a torque is created about a rotational axis of the load. A source of force provides a counter force relative to the load in response to the force detected by the force sensor. A method of docking an electronic test head held in a test head manipulator to an electronic device handler is also provided. The method of docking includes measuring a magnitude of an imbalance force along or about at least one of a plurality of motion axes of the test head manipulator; and providing a counter force to the imbalance force.

68 Claims, 46 Drawing Sheets

APPARATUS AND METHOD FOR BALANCING AND FOR PROVIDING A COMPLIANT RANGE TO A TEST HEAD

RELATED APPLICATIONS

This application is a Divisional Application of U.S. application Ser. No. 10/381,322, filed Jul. 1, 2003 now U.S. Pat. No. 7,084,358, which is a National Phase of PCT/US01/29530, filed Sep. 20, 2001, which claims the benefit of U.S. Provisional Applications 60/234,598, filed Sep. 22, 2000 and 60/301,228, filed Jun. 27, 2001, all the contents of which are incorporated by reference.

FIELD OF THE INVENTION

The present invention relates to a method and apparatus for balancing a test head relative to one or more axes. Further, the invention provides a method and apparatus for providing a compliant range of motion to a test head relative to one or more axes.

BACKGROUND OF THE INVENTION

In the testing of integrated circuits, chips, and wafers, it is customary to use a system which includes a test head and equipment to handle the item to be tested. The handling equipment may be a packaged device handler, a wafer prober, or other apparatus. For simplicity, we will refer to such equipment as a "device handler" or simply "handler." The test head is "docked" to the handler. Circuit connections can then be made between the test head and the integrated circuit so that the test head may perform the appropriate tests.

In general there are two methods of docking, actuator-driven docking and manipulator driven docking. The technique known as "actuator-driven" docking was first disclosed in U.S. Pat. No. 4,589,815 (hereinafter '815) due to Smith and variations on it were later developed and disclosed in U.S. Pat. No. 5,654,631 due to Ames, U.S. Pat. No. 5,744,974 due to Bogden, U.S. Pat. No. 5,982,182 due to Chiu et al, U.S. Pat. No. 6,104,202, due to Slocum et al, and U.S. Pat. No. 5,821,764 also due to Slocum et al. All are incorporated by reference.

In a general sense, docking systems require "alignment structures" on one of the two items to be docked that engage with "alignment receptacles" on the other of the two items. In the '815 patent, guide pins are included as the alignment structures, and guide pin receptacles and gussets are included as the alignment receptacles. In the three patents due to Chiu et al. and Slocum et al., alignment in all six degrees of freedom is provided by a kinematic coupling, which provides six contact points between provided surfaces where "no more than two of the contact points are colinear." In these patents "kinematic surfaces" on one of the two items to be docked serve as alignment receptacles; and "kinematic mating surfaces" on the other of the two items function as alignment structures. In the preferred embodiments which are described in the patents, balls or spherical surfaces are the kinematic mating surfaces or alignment structures, and grooves are the kinematic surfaces or alignment receptacles. As is indicated in the patents, many other combinations of surfaces can be utilized.

The docking assembly described in the '815 patent is similar to the two-point docking assembly 1340 shown in part in the Vertical Plane Handler Position in FIG. 13 (and partially in cut away in the view in the lower left of FIG. 13) of the present application. In FIG. 13, only the half of the assembly that attaches to the test head is shown. These two-point docking assemblies both use two guide pins 912 and respective mating holes (not shown in FIG. 13) and two circular cams 910. When the cams 910 are rotated by handles 914 attached to them, the two halves of the dock are pulled together with the guide pins 912 becoming fully inserted into their mating holes (not shown). A wire cable 915 links the two cams 910 so that they rotate in synchronism. The cable arrangement enables the dock to be operated by applying force to just one or the other of the two handles 914. The handles are accordingly the docking actuator in this case.

Docks manufactured by Reid Ashman Manufacturing Company (RAM)[see web site and sales literature] are similar in concept to those described in the '815 patent. However, in the RAM dock linear cams are used instead of circular cams. Also the RAM dock uses rigid mechanical linkages and bell cranks instead of wire cables to synchronize the motion of the cams. The dock is actuated by one or the other of two handles that are coupled to respective bell cranks.

Powered actuators may be incorporated into docks in a variety of ways. For example a linear actuator, as previously described, may be readily added to impart docking actuation directly to the wire cable in the '815 dock or to the mechanical linkage or linear cams in other docks. The linear actuator may be any of several types including electrical motor powered, electrical solenoid, or pneumatic.

The docks described in U.S. Pat. Nos. 5,654,631 and 5,744,974 utilize guide pins and holes to align the two halves. However, the docks are actuated by vacuum devices which urge the two halves together when vacuum is applied. The two halves remain locked together so long as the vacuum is maintained.

The docks disclosed in U.S. Pat. Nos. 5,821,764, 5,982,182, and 6,104,202 use kinematic coupling techniques to provide the final alignment between the two halves. Guide pins may also be utilized to provide an initial alignment. The guide pins may be provided with a catch mechanism, which captures the guide pin in its hole and prevents it from escaping. The catch mechanism appears to activate automatically in the '764 and '202 patents; whereas, a motor driven device is utilized for each of the three guide pins in the '182 patent. Also in the '182 patent the three motors may be operated separately to effect planarization between the docked components. In all three disclosures a linear actuator is used to finally pull the two halves together. The linear actuator is disclosed as being of the pneumatic type.

The above discussion is intended to provide a brief overview of certain available actuator driven docking techniques. It is observed that the docks may be actuated by a variety of different devices.

An alternative approach, referred to a "manipulator-driven" docking, is described in, for example, U.S. Pat. Nos. 5,600,258 and 5,900,737 due to Graham et al. This alternative approach provides one or more powered and controlled axes ("controlled axes") of the manipulator to position the test head. For example, and as described in the mentioned patents, the vertical, pitch, and roll axes are controlled axes in the Graham patents. Systems are also known where only a single axis, such as the vertical axis or tumble axis, is controlled. Position sensors, are typically used to provide feedback to the controlled axes concerning the position of the test head relative to the device handler/prober. In docking, a controller (or operator) operates the controlled axis or axes to first bring the test head into a ready to dock configuration and then continues to operate the controlled axes to complete the docking. In [Graham et al] the sensors are used by the controller to orient the docking surface of the test head properly with the docking surface of the device handler/prober (typically coplanar) and to stop motion when docking is complete and the electrical connections between the test head and the device handler/prober have been adequately made. There is no dock actuator and typically there is no separate, independent latching mechanism that is independent of the manipulator axes. If there is no separate, independent latch, the manipulator axes must be locked in position to maintain the test head in the fully docked position.

Also in manipulator-driven docking systems, it is not always desirable or feasible for the test head to be balanced in all axes. An unbalanced test head leads to unpredictable and unwanted forces that must be overcome by the drive and control mechanisms, by the alignment mechanisms, and by the structure of the device handler/prober itself.

A docking system in which a mechanism that is separate and independent of the manipulator latches the test head to the handler/prober when fully docked is referred to as a "latched docking" system. A system in which the test head is held in the fully docked position only by locking the manipulator axes is referred to as a "non-latched docking" system. Typically, an actuator-driven docking system is a latched docking system, and a manipulator-driven docking system is a non-latched docking system. However, the other two combinations are possible.

In the design of manipulators for large test heads, it is desirable to have the test head essentially freely movable in up to six axes or degrees of motion freedom to facilitate ease of controlled motion. This is true for manual manipulation and safe powering of motion axes as discussed in PCT international patent application No. US00/00704 "TEST HEAD MANIPULATOR" and in U.S. Provisional Patent Application No. 60/186,196 "COUNTER BALANCED VERTICAL DOCKING MOTION IN A DRIVEN VERTICAL AXIS TEST HEAD MANIPULATOR". This is also true in docking/undocking with a device handler or prober, where motion is provided by a docking system as described in U.S. Pat. No. 4,589,815 due to Smith, U.S. Pat. Nos. 5,821,764 and 6,104,202 due to Slocum et al., or U.S. Pat. No. 5,982,182 due to Chin et al. Such freedom of motion or "compliant motion" is of particular importance in the process of docking the test head with the handler.

The two axes that provide motion parallel to the floor (side-to-side and in-out) and the axis that is perpendicular to the floor(up-down), are illustrated in FIG. 14. These three axes include the x-axis (side-to-side) 1315, the y-axis (in-out) 1325, and the z-axis (up-down) 1335. Also shown are three rotational axes including the pitch axis (x) 1310, the roll axis (y) 1320, and the swing (and yaw) axis (z) 1330. In the two axes that are parallel to the floor (x and y), motion freedom is normally provided by low friction bearings, rails, and the like or in an articulating arm as described in U.S. Pat. No. 4,527,942 also due to Smith. In the case of the vertical or up-down axis (z axis), it is typical to use counter weights to provide a substantially weightless condition to provide the desired freedom of motion at all times, except when an axis is deliberately locked by an operator. Other techniques in the up-down axis that are known are to use a spring mechanism as in U.S. Pat. No. 4,943,020 due to Beaucoup et al, pneumatic means such as in U.S. Pat. No. 5,931,048 due to Slocum et al., and U.S. Pat. Nos. 5,149,029 and 4,705,447 due to Smith. However, U.S. Pat. No 5,949,002 due to Alden points out certain difficulties with such approaches and proposes the use of a servo control loop incorporating a load cell force sensor. Techniques involving servo control loops with force and position feedback, however, are complex and expensive, and do not provide a simple way for an operator to override the system in case of a malfunction.

In the case of the pitch, roll, and yaw rotational motions, it is known to place the axes of rotations so that they pass nearly through the center of gravity of the test head and its attached mounting mechanisms and cables. This has been achieved in tumble mode manipulators by adding ballast counter-weights. On cable pivot manipulators, it has been achieved by providing a variety of spacers to vary the length of the inner cradle back on projected cable pivot manipulators as described in the U.S. Pat. No. 5,450,766 due to Holt.

It may be economical to place one or more of the rotational motion axis inside the test head at or near the actual center of gravity of the test head and cable assembly, as shown FIG. 13. Observe that pitch and yaw motions are integrated within the test head structure. In FIG. 13 these are shown as the pitch axis 1310(Theta X of .+−.5 degrees) and the yaw axis 1320(Theta Z of .+−.5 degrees). The roll axis 1330(Theta Y of +90-95 degrees) is also shown in FIG. 13.

In contemporary systems, it may prove to be desirable to place the pitch axis with approximately .+−.5 degrees of motion, the roll axis with at least .+−.90 degrees of motion (external to the test head), and approximately .+−.5 degrees of yaw motion inside the test head. This is because the scope of the structure required to implement these axes at or near the center of gravity is significantly less than the structure required to implement these axes if they are external to the test head by, for example, using the "CPPJ" (for pitch) and the Split Ring Cable Pivot techniques described in U.S. Pat. No. 5,450,766 due to Holt and U.S. Pat. No. 5,608,333, also due to Holt, respectively.

It has been proposed to implement this concept by placing a spherical bearing near the center of gravity of a test head. An externally adjustable means of moving the position of the spherical bearing may be provided in the in-out direction so that it can be physically positioned to balance the pitch (or tumble) axis when the test head is in either the DUT(device under test) up or the DUT down orientation. A disadvantage of the spherical bearing is that it provides all three rotational degrees of motion simultaneously.

Although desirable, it is very difficult to place these internal axes at or very near to the true center of gravity of real test heads. The practice of varying the population of pin electronic boards inside of test heads and the size and weight of test head cables to satisfy specific tester end user's needs, often results in significant shifts in the location of the center of gravity and therefore significant imbalance forces. Additionally, as the test head is moved through its motion envelope, the forces exerted on the test head by the cable may vary; this causes a variable imbalance force as a system of fixed configuration is used. These imbalance forces impede the freely moveable state desired with respect to one or more of the axes of motion.

It is also frequently desirable to re-position the location of a motion axis to a location far from the center of gravity, whether the motion axis is internal in the test head or external to the test head as has traditionally been done on manipulators. An example of this is to position the tumble axis very near the DUT interface of a very thick test head rather than at the center of gravity of the test head which is usually near the physical center of the test head. If the test head is one meter thick, the implication of placing the tumble pivot axis at the center of gravity, therefore near the physical center, is that the manipulator would require a vertical motion range (stroke) of at least one meter(100 cm). If it is possible to place the tumble pivot axis within 13 cm of the DUT interface, the vertical stroke of the manipulator could be reduced by 74 cm (100 cm-26 cm"), thereby reducing the overall height of the manipulator or enabling longer main arms for greater load capacity from a given bearing structure. However, as indicated above, imbalance forces are created by moving the center of gravity of the test head away from a known physical point. Further, these imbalance forces cause the test head to be in an imbalanced state, such that it is not freely moveable in all six axes.

Accordingly, as test heads have become larger and more complex, there has been a corresponding increase in imbalance forces in each of the critical motion axes. It is desirable to have a means to allow these imbalances to be neutralized so that test heads may be manipulated and positioned effectively, while providing for the safety of both the operators and the equipment.

SUMMARY OF THE INVENTION

The present invention relates to an apparatus and a method for balancing a test head relative to an axis such that the test head is substantially weightless relative to that axis. The invention further can be applied to numerous axes of the test head manipulator. Further, the invention relates to an apparatus and method for providing a compliant range of motion for the test head relative to at least one of the axes of the test head.

DETAILED DESCRIPTION OF THE INVENTION

Figure 1A:
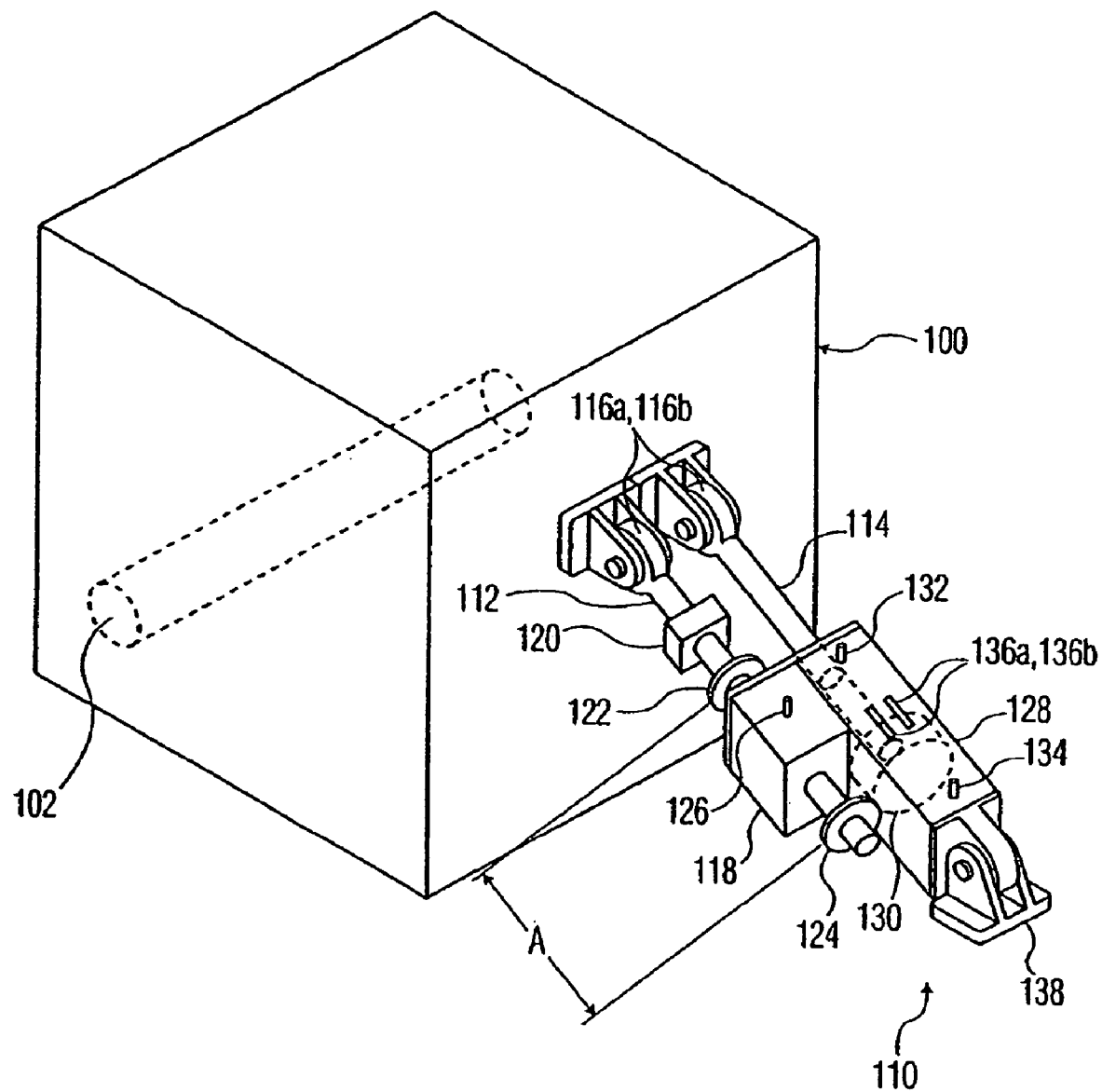
FIG. 1(a) is a perspective view of a balancing unit coupled to a test head in accordance with an exemplary embodiment of the present invention.
Figure 1B:
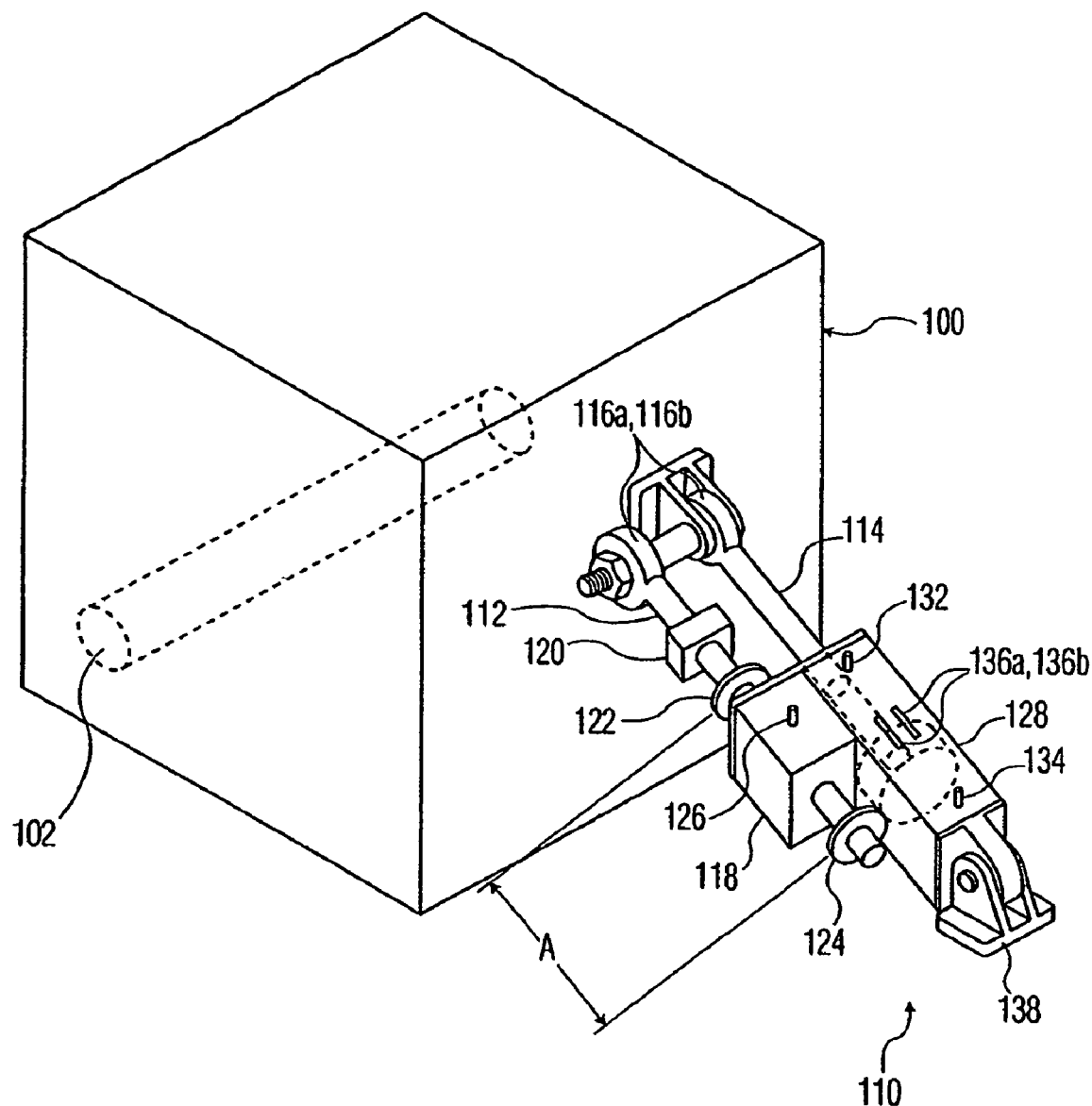
FIG. 1(b) is a perspective view of a balancing unit coupled to a test head in accordance with another exemplary embodiment of the present invention.
Figure 1C:
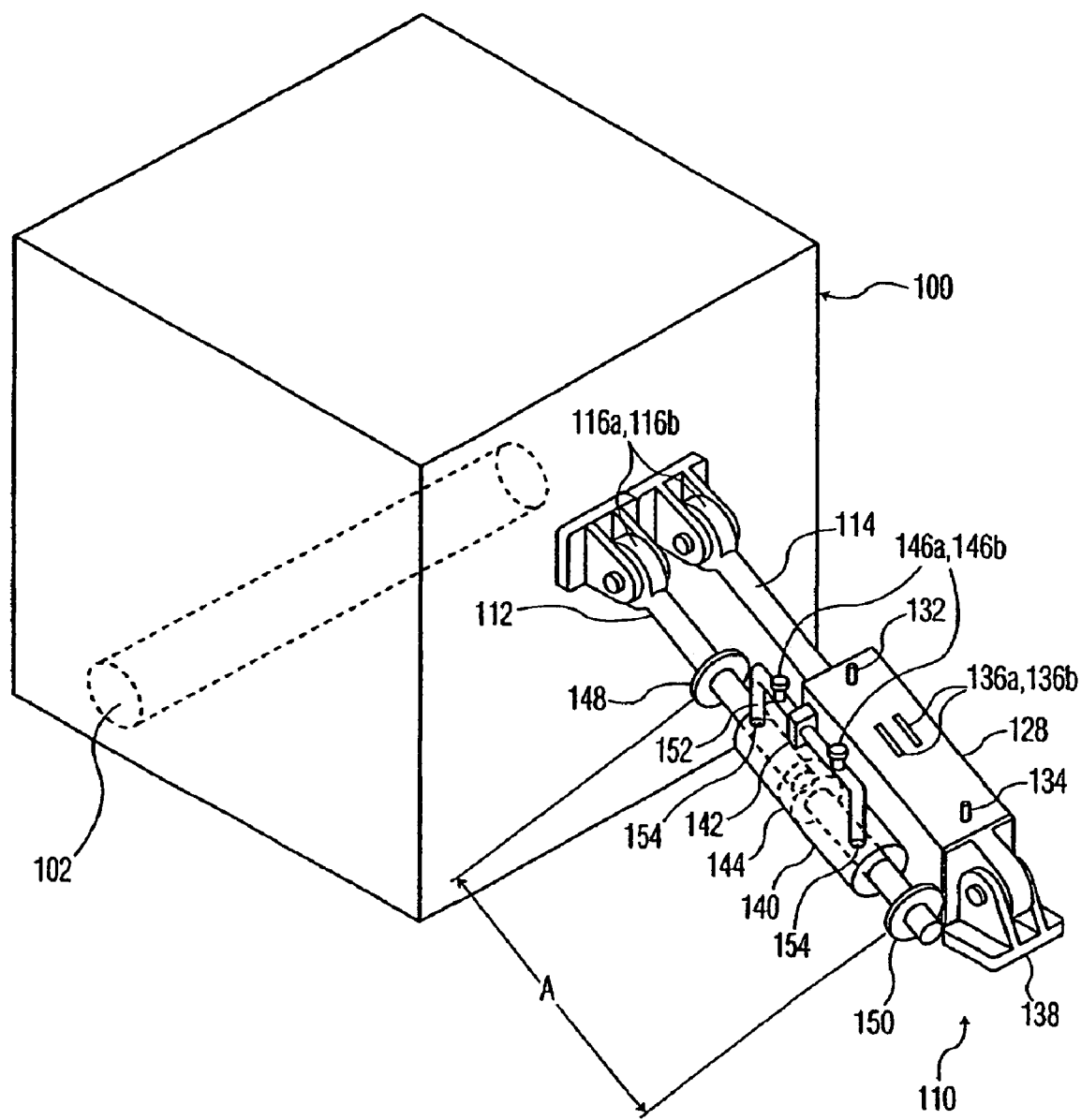
FIG. 1(c) is a perspective view of a balancing unit coupled to a test head in accordance with yet another exemplary embodiment of the present invention.
Figure 1D:
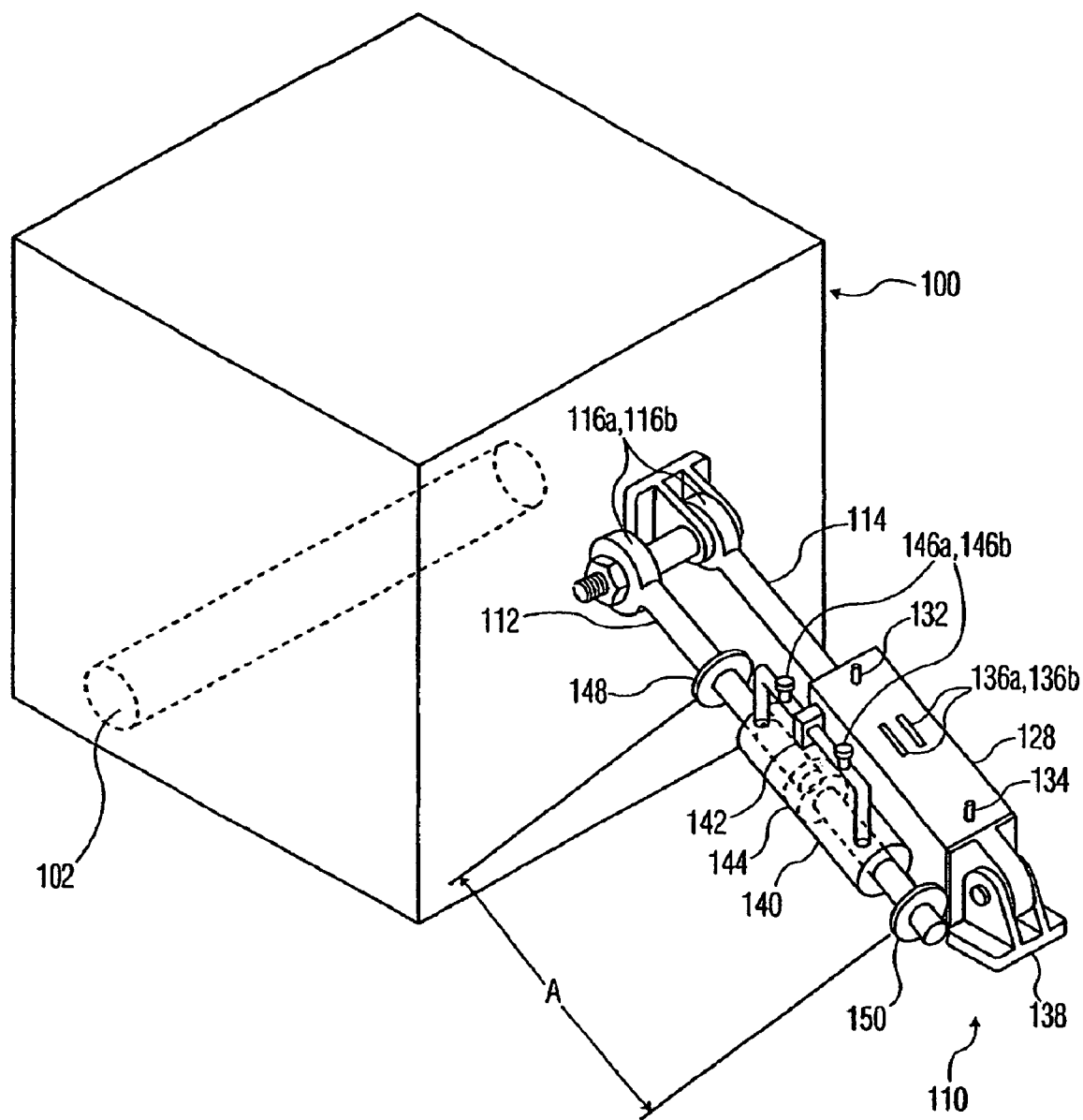
FIG. 1(d) is a perspective view of a balancing unit coupled to a test head in accordance with yet another exemplary embodiment of the present invention.

In the following detailed descriptions of several embodiments of the invention, reference is made to the previously listed figures. It will be appreciated that the figures are intentionally not to scale. Rather they have been drawn so as to highlight the significant features of the invention.

During the testing of devices, the test head, obviously, remains fully docked. The handler/prober is equipped with mechanisms that automatically position each device to be tested in turn with respect to the test interface. This creates low frequency mechanical vibrations in the handler/prober that couple through the dock to the test head and manipulator. The energy associated with these vibrations must be safely dissipated. For this reason, many users prefer to use a latched dock and to leave the manipulator axes unlocked during testing. In this case the vibrations are conveniently absorbed by motion of the manipulator axes with the energy being dissipated in their associated friction. If, on the other hand, the manipulator axes were securely locked during testing, then the least resilient portions of the system would principally absorb the vibrations. The electrical contacts in the interface between the test head and the device under test, including for example pogo pins and probes, are delicate mechanical structures that could become damaged or have their useful lives reduced through the absorption of such vibrational energy. In a non-latched docking system it is desirable to lock certain manipulator axes to keep the test head fully docked while testing. In order to leave one or more axes unlocked so as to absorb vibrations, it is necessary for them to be balanced and compliant. It would therefore be beneficial to maintain an axis in a balanced compliant condition while the test head is docked.

An additional consideration is that an unbalanced test head when docked with a device handler or prober will exert all or part its imbalance force on the apparatus that it is docked with. Normally such apparatus are designed only to support a vertical load. The imbalance force is not necessarily vertical and in general is of unpredictable magnitude and direction. The unknown imbalance force can potentially cause harm to the equipment and compromise the automation incorporated within it to handle the wafers and devices. Therefore it is preferable if the imbalance force can be neutralized for the entire period that the test head is docked with the device handler/prober.

Also in the case of vertical loading on the device handler/prober, many traditional manipulators are of the counterbalanced type which maintains the test head in a substantially weightless condition. This minimizes the vertical loading of the test head on the device handler/prober, which simplifies its structural requirements. Also with manipulators having a hard driven vertical axis, the vertical load may be partially transferred to the device handler/prober during docking, which increases the structural requirements placed on them. It would therefore be desirable in a hard driven vertical axis manipulator having vertical compliance to be able to maintain a counterbalanced condition for the entire time that the test head remains docked to the device handler/prober. In the case of a pneumatic-based counter balance mechanism, the eventual leakage of air means the loss of the counter balance force.

Yet another consideration is that in test head manipulator systems having pneumatic compliance mechanisms, it is usually necessary to balance the system immediately prior to docking when the test head is in close proximity to the docking mechanism. In some systems that are presently known, the test head must be free to move throughout its compliant range in order to do so. It has been experienced that in such a balancing procedure, the test head might suddenly and unexpectedly move a significant distance and with great force. Such motion could potentially cause a collision with the docking apparatus and causing damage to the delicate electrical contacts. Also human operators are potentially at risk.

Since test heads have become larger and more complex, there has been a corresponding increase in imbalances in critical motion axes. It is essential to have a means to allow these imbalances to be neutralized so that test heads may be manipulated and positioned effectively and with safety to both operators and equipment.

One technique that has been proposed is to use one or more cylinders, such as dual-action pneumatic cylinders, to offset the imbalances. Such cylinders have two air inlets and a piston that fits between them. The first air inlet is known as the extend inlet, and the second air inlet is known as the retract inlet. The piston moves in accordance to the difference in air pressure on its two sides. A connecting rod attached to the piston is coaxial to the cylinder and passes through one end to exert linear force and motion on a load. If the pressure is greater at the extend input than at the retract input, then the connecting rod extends from the cylinder. Conversely, if the pressure is greater at the retract input than at the extend input, the connecting rod retracts towards the cylinder. Position sensors may be incorporated to indicate the position of the piston. Thus it would appear that such a cylinder and an appropriate control system could be used in connection with a particular axis, for example the pitch axis. The control system would cause air to be pumped into either the extend or retract inlets as needed to nullify any force imbalances and to provide compliant motion as the test head is manipulated and docked. It is envisioned that the dual-action pneumatic cylinder would provide a spring-like effect; that is, when the pressure differential has been adjusted to offset the imbalance in the axis, the test head can be moved as if it were indeed balanced with very little force.

This approach is very difficult to implement for several reasons. First, the only feedback mechanism is the position of the piston. Second, seals are used in the pneumatic cylinder to minimize leakage of air from one side of the piston to the other and from the point where the connecting rod passes through the end of the cylinder. These seals in the path of the motion provide both static and dynamic friction. Typically, pneumatic cylinders exhibit a property known as "break away force". The break away force of a pneumatic cylinder is the force required to overcome the static friction and get the piston moving within the cylinder. The static friction (stiction) can be considerable and vary with time, use, and temperature. The stiction is often much greater than the dynamic or moving friction. Accordingly, to effect a change the control system desirably adjusts the air pressure difference until it at least senses a change in position (i.e. motion), and then analyze the motion to adjust to the desired result. Due to stiction (static friction), the air pressure differential to start motion may be and frequently is significantly greater than load imbalance combined with the dynamic friction of the pneumatic cylinder. This can lead to a very nonlinear and unstable control problem. Robust solutions are difficult to achieve and maintain especially in view of the dynamic nature of the stiction component.

The dual-action pneumatic cylinder offers the potential to provide a useful means to compensate for imbalance in a test head axis; however, new approaches are required to enable a useful solution. A second objective of the present invention is to provide a means to overcome the disadvantages of a dual-action pneumatic cylinder so that its advantages can be robustly employed.

In an exemplary embodiment, the subject invention compensates for imbalance in at least one test head axis so that the test head can be effectively and safely manipulated, docked and undocked. The invention incorporates a source of force such as at least one dual-action pneumatic cylinder (for example) as described above in combination with other elements and a novel basic control scheme. The resulting assembly of cylinder and components is referred to as a "balance unit." In summary, for a single axis, the test head is first placed and locked in a desirable position relative to its support structure. The test head is thus locked with respect to the axis in question. A force sensor (i.e. a bidirectional load cell) included in the balance unit measures imbalance force relative to the locked axis to determine whether there is a significant amount of imbalance and the direction of the imbalance. Air pressure in the two sides of the double-action pneumatic cylinder is then adjusted so that the force detected by the force sensor is reduced to below some predetermined minimum value, typically five to 25 pounds is considered reasonable, depending on the weight of the test head and cylinder characteristics. The lock is then released, and the pressure differential within the pneumatic cylinder transmits a force via the connecting rod to the test head to counteract the force imbalance. The procedure can be repeated as often as necessary to maintain the selected test head axis in a balanced, freely movable state.

FIG. 1(a) is a perspective drawing of the test head balancing system for a test head manipulator in accordance with an exemplary embodiment of the present invention. A balance unit 110 with two ends is provided. As stated above; a balance unit is a source of force (i.e. a dual action pneumatic cylinder) in combination with other elements and a novel control scheme for balancing a test head relative to an axis, The first end of the balance unit 110 is connected to the test head 100. The second end of the balance unit 110 is connected to a support structure (not shown) for the pivot axis 102. The purpose of the balance unit 110 is to facilitate the movement of the test head 100 about the pivot axis 102, when the test head's 100 center of gravity does not coincide with the pivot axis 102. In the exemplary embodiment shown in FIG. 1(a), the balance unit 110 includes a dual-action pneumatic cylinder 128, and its associated components, as discussed below.

The balance unit 110 includes a force sensor 120, and a force rod 112. The force sensor 120 is coupled to the force rod 112 so that it measures the force along the force rod. The force rod 112 is connected to the test head 100 through a bearing 116a. If a test head's 100 center of gravity does not coincide with the pivot axis 102, a force is exerted by the test head 100 about the pivot axis 102. At least one component of this force is measured by the force sensor 120, through its connection to the force rod 112.

The force sensor 120 may be a typical bi-directional load cell that can measure and indicate(to a controller, for example) the magnitude and direction of the force imbalance of the test head 100 with respect to the pivot axis 102. The force sensor 120 may incorporate a strain gauge that can be placed in a bridge circuit in a well-known way to provide an electrical voltage output that varies monotonically with the measured force. By using analog to digital conversion and a processor, it can be determined whether the force along the force rod 112 is greater than a maximum amount tolerable for free motion; and, if so, the direction of the force. Alternatively, analog comparator circuits could be used in known ways to produce go/nogo signals indicating the presence and direction of significant force imbalance.

The force rod 112 is slidingly attached to the pneumatic cylinder 128 through a lock 118 that includes a lock inlet 126 for actuating the lock 118, the lock 118 permitting the force rod 112 to move parallel with respect to the cylinder 128 when the lock 118 is not actuated. Accordingly, when the lock 118 is not actuated the test head 100 can be rotated about the axis 102. When the lock 118 is actuated, the force rod 112 can no longer slide with respect to the cylinder 128; and the test head 100 is locked in position with respect to the axis 102. The lock 118 is of one of several types that are well known in the art. Depending on the type of lock 118 selected it could be controlled by an electrical signal, a pneumatic input, or other means appropriate to a particular application.

The pneumatic cylinder 128 is simply a source of force used to push towards or away from the test head 100. When an imbalance force is detected by the force sensor 120, the pneumatic cylinder 128 is used to exert a counter force against the test head 100 through a connecting rod 114. In this exemplary embodiment, a pneumatic cylinder 128 is utilized, which requires an air system. It is anticipated that a counter force could be accomplished through various other means, such as a hydraulic cylinder or electromagnetic device.

The pneumatic cylinder 128 is connected to the connecting rod 114 through a piston 130. The connecting rod 114 is connected to the test head 100 through a bearing 116b. The connecting rod 114 is arranged parallel to the force rod 112. The axes of the cylinder 128 and connecting rod 114 are orthogonal to the test head's 100 axis of rotation 102. The axes are arranged so that a force acting along either axis will create a moment or torque about the test head axis of rotation 102. Extending and retracting the connecting rod 114 with sufficient force would cause the test head 100 to rotate about the axis 102.

The pneumatic cylinder 128 is connected to the support structure (not shown) through a bearing 138. Inside the pneumatic cylinder 128, the piston 130 moves in accordance with the difference in air pressure on the piston's 130 two sides. One side of the piston 130 within the pneumatic cylinder 128 contains an extend inlet 134. The other side of the piston 130 within the pneumatic cylinder 128 contains a retract inlet 132. The pneumatic air cylinder air inlets 132 and 134 are respectively connected to a supply of relatively high-pressure air(not shown) via electrically operated control valves(not shown). Optionally, accumulators(not shown) may be attached to each inlet 132 and 134 to provide a larger volume of air to work against the piston 130.

When in operation the force sensor 120 is used to detect an imbalance force from the test head 100; air is then provided to the retract inlet 132 and the extend inlet 134 to counter the force detected by the force sensor 120. A pressure differential is thus created across the piston 130. The goal is for this pressure differential to be of sufficient magnitude and direction to reduce the force in the force rod 112 to a magnitude that is less than a predetermined maximum allowable imbalance force.

Still referring to FIG. 1(a), the pneumatic cylinder 128 also contains two piston position sensors, 136a and 136b, that indicate the position of the piston 130 within the pneumatic cylinder 128 to a controller, for example. Limit switches, for example, could be used in known ways to indicate whether the piston 130 is in a central location or at which end of the cylinder 128 it is located. More sophisticated position sensing means could be provided if necessary. For example, potentiometers, absolute encoders, incremental encoders with appropriate electronics and the like could be used to provide precise position information concerning the position of the piston 130 and connecting rod 114 with respect to the cylinder 128. It is desirable that the position sensing mechanism be calibratable and adjustable to facilitate system construction, set up, and maintenance.

A controller(not shown) may be provided to operate the inlet valves 132 and 134 and the lock 118 and to receive position sensor 136a and 136b and force sensor 120 feedback signals. For example, at start up, with the test head 100 not docked to a handler, the pneumatic cylinder 128 would normally be unpressurized. Prior to any control actions, care should be taken to ensure that the test head 100 and apparatus are not resting against any foreign objects or structures that would interfere with the forthcoming balancing operations. The test head 100 is now already in either a relatively balanced state or, as is more likely, in an unbalanced state. The lock 118 is then actuated, if not already actuated, to lock the test head 100 into position. In some instances it may be necessary to first move the test head 100 into some desirable position. This motion might be achieved by manual means; or, alternatively, the controller might be equipped with appropriate algorithms to allow it to utilize the pneumatic cylinder 128 combined with the position feedback. Notice that in view of the previously mentioned stiction such a control algorithm could be difficult. This is true if one attempts to cause the test head 100 to come to a stop in the desired position before applying the lock 118. However, a suitable lock 118 may also be used as a brake, and motion can be stopped by applying the lock 118 as the test head 100 moves into the desired position.

Now with the test head 100 locked in position, the controller responds to the signals derived from the force sensor 120. The force sensor 120 detects if there is a significant imbalance force from the test head 100 about the pivot axis 102. The force sensor 120 is able to detect both the magnitude and the direction of the force. If a significant imbalance is detected, air pressure is then adjusted within the retract inlet 132 and the extend inlet 134, with the objective of developing a pressure differential across the piston 130. This pressure differential across the piston 130 is to be of sufficient magnitude to reduce the force measured by the force sensor 120 to less than a predetermined maximum allowable imbalance force. When this is achieved, the lock 118 is unlocked, and the test head 100 is essentially weightless about the pivot axis 102. The test head 100 may now be moved about the pivot axis 102. This process can be repeated as is necessary to maintain the test head 100 in a balanced state about pivot axis 102.

As the test head 100 moves, the piston 130 will also move. The pressure differential increases monotonically with piston displacement similar to a mechanical spring. The pneumatic force exerted on a given side of the piston 130 varies inversely with the volume. However, for displacements where the change in air volume is relatively small, the equivalent spring force approximately varies linearly with displacement with an equivalent "spring constant," K. That is, $F = K x$, where F is the change in force and x is the change in piston displacement. It is desirable to attempt to make K be small, so that the force does not appreciably change over the range of motion. K will be determined in part by the total volume of air with respect to the change in pressure per increment of piston displacement; that is by V and dP/dx, where V is volume, and P is pressure. As the piston 130 nears one end of its travel, V becomes small, dP/dx becomes large exponentially, and K therefore increases as does F. Accumulators(not shown in FIG. 1(a)) may be added as described above. The accumulators serve to significantly increase the volume of air V available, while limiting dV/dx and dP/dx to acceptable values. This provides what is known as a "soft spring" effect, which is clearly desirable.

Ideally, the above cycle would only have to be performed once and not repeated until some change has been made to the system. However, the pneumatic cylinder 128 system is subject to leaking air, and the cycle may be repeated periodically as need be. Experience has shown that a typical system will retain sufficient air for upwards of approximately ten minutes before the cycle needs repeating. In typical operation the cycle could be automatically repeated every few (say 5 to 8) minutes. Also, in typical operation it is not necessary to repeat the step of moving the test head 100 to the desirable position. Unless the test head 100 has encountered an accidental hard obstruction or some other accident, it should remain in its allowable range of motion. Indeed it could very well be undesirable to move the test head 100 back to a predetermined desirable position if the test head 100 is now in a position necessary to perform desired function.

Figure 15A:
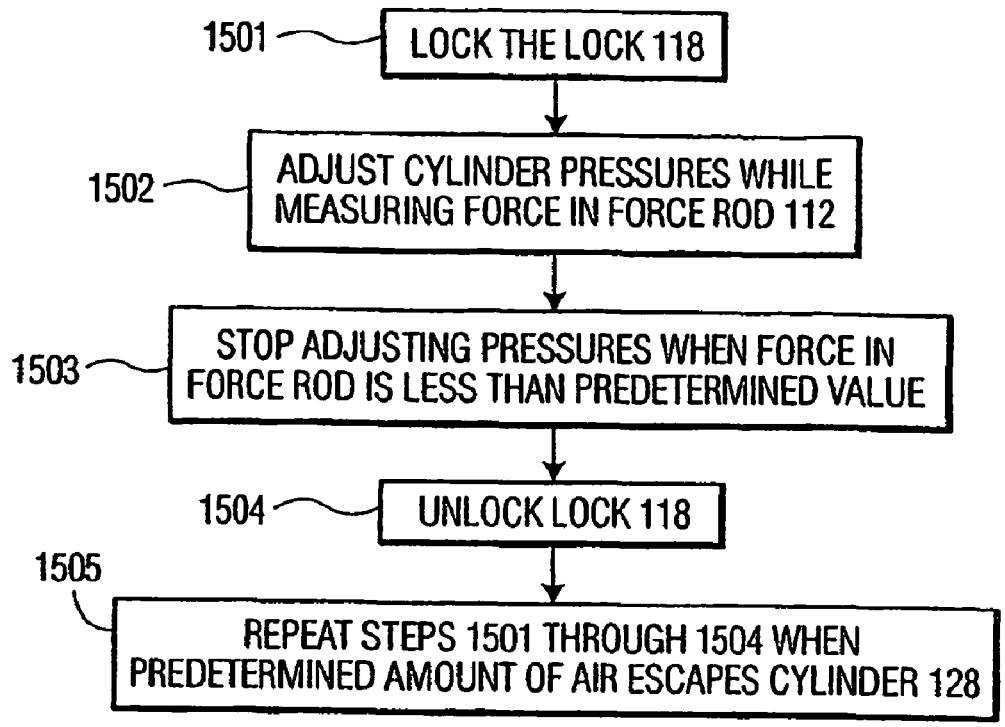
FIGS. 15(a)-15(n) are flowcharts in accordance with various exemplary embodiments of the present invention.
Figure 15B:
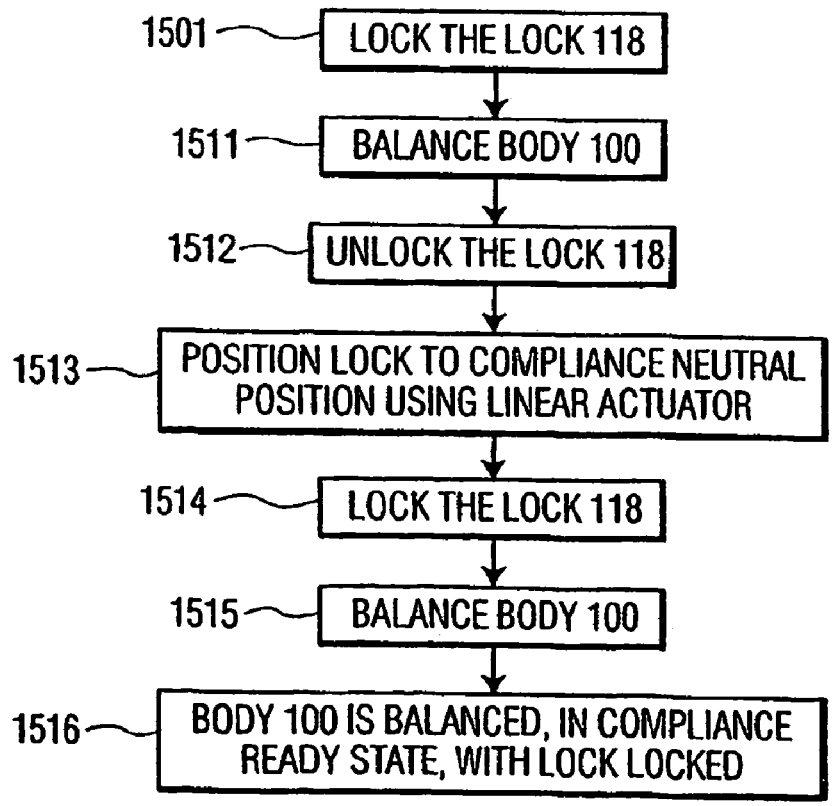
Figure 15C:
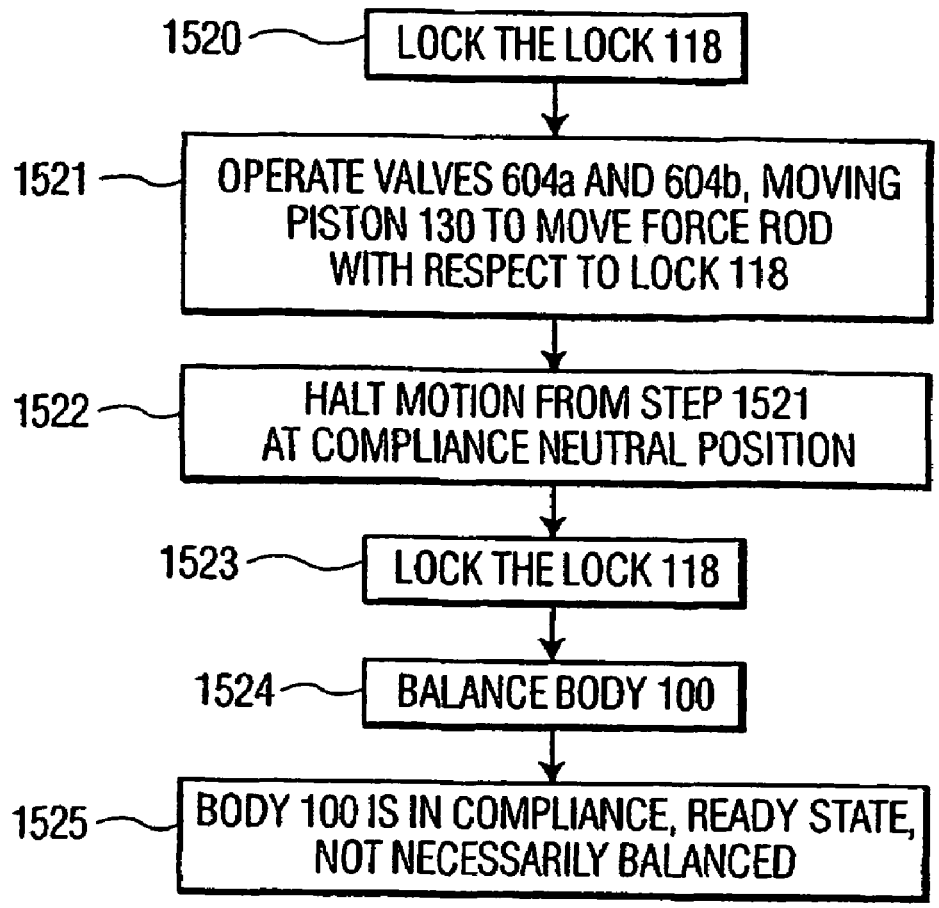

Accordingly, as shown in FIG. 15(a), on a continuing basis the sequence of operations in an exemplary embodiment would be as follows:

1. Lock the lock 118, as shown in step 1501.
2. Adjust the cylinder inlet pressures until the force in the force rod 112 is less than a predetermined value, as shown in steps 1502 and 1503.
3. Unlock the lock 118, as shown in step 1504.
4. After a time less than that for a significant amount of air to be lost from the cylinder 128, go to step 1501, as shown in step 1505.

This sequence allows the test head 100 to behave as if the axis 102 passes directly through its center of gravity; we shall refer to this as the "normal sequence."

In an exemplary system, the time required for steps 1501, 1502, 1503 and 1504 was less than 4 seconds. This sequence of steps shall be referred to as the "force canceling sequence."

Still referring to FIG. 1(a), two stop collars 122 and 124 or "motion limits" are attached to the force rod 112 such that the lock 118 is located between them. The stop collars 122 and 124 are located such that when the piston 130 in the pneumatic cylinder 128 is centered, the stop collars 122 and 124 will be equidistant from the center of the lock 118. The distance "A" between the two stop collars 122 and 124 is some reasonable amount less than the total stroke of the piston 130 within the pneumatic cylinder 128. Thus, the stop collars 122 and 124 prevent the piston 130 from travelling to the ends of the cylinder 128 and taking the load off of the force rod 112 and force sensor 120 thereby distorting the process. They simultaneously serve as positive motion stops for the test head 100. Observe that if the system is in imbalance and the lock 118 is disengaged, one or the other of the two stop collars 122 or 124 would be resting against the lock 118 with the force rod 112 and force sensor 120 supporting and measuring the imbalance force.

Additional control features, not shown in FIG. 1(*a*), may be added to the above system. For example, push buttons may be provided to allow an operator to initiate the control sequence beginning at either step 1501 or step 1502 listed above. An indicator light could be added to warn an operator when the force rod 112 is locked; this will help the operator to avoid attempting to move the manipulator in the axis 102 and/or attempt docking while step 1502 is being performed. Such an attempt would produce additional imbalance forces on the test head 100 and the system would erroneously attempt to compensate for them. The system may also be integrated with sensors in the docking mechanism so, for example, that the system becomes locked and/or disabled while docked. Also it would be desirable to sense that the test head 100 is in a ready to be docked position and to have the sequence performed just before docking. This would ensure that the sequence is not performed while docking is actually taking place and also that the imbalances are optimally compensated for before docking commences.

An alternative control cycle, which will be referred to as the "locked sequence," is possible and useful in selected applications. In the locked sequence, when the test head 100 is away from the apparatus(not shown in FIG. 1(*a*)) that it will be docked with, the test head 100 is kept locked in a generally central position with respect to the axis 102. This is the "desired locked position." When the test head 100 is manipulated into a position where it is ready to be docked, the force canceling sequence is invoked; that is, the air pressure in the pneumatic cylinder 128 is adjusted until the force in the force rod 112 is effectively canceled. Then the lock 118 is released, and docking can take place. The test head 100 can be placed in the desired locked position either manually or by automatic control using the pneumatic cylinder 128 and position sensors 136*a* and 136*b*. That is, at start up, with the test head 100 not docked, the controller would first deactivate the lock 118. The test head 100 would then be moved to the desired locked position with respect to the axis 102 being controlled; for example, to an approximate central position as indicated by the position sensors 136*a* and 136*b*. In the automatic control case it is preferable to use the lock 118 as a brake to force the test head 100 to stop in the desired locked position rather then attempt to bring it to a stop by pneumatic action alone.

When preparing to dock using the normal sequence, the test head 100 is manipulated to a ready-to-dock position with the lock 118 disengaged and the test head 100 balanced by the pneumatic cylinder 128. Depending upon the system, either the operator or a sensor will provide a ready-to-dock signal when the ready-to-dock position is achieved. Upon this signal the force canceling sequence is invoked to ensure that the test head 100 is balanced as well as possible. When the locked sequence approach is used, the test head 100 is manipulated to the ready-to-dock position with the lock 118 engaged; and when the ready-to-dock signal is received, just steps 1502 and 1503 of the force canceling sequence listed above are executed in turn. Now, in either case, with the test head 100 ready to be docked, freshly balanced, and free to move in all axes, the docking mechanism is engaged and actuated to draw the test head 100 into the fully docked position. In some applications, when a signal is provided (either by the operator or by a sensor) that full docking has been achieved, the lock 118 is again applied. While testing integrated circuits using the test head, the lock 118 remains applied. In both cases the lock 118 remains applied during undocking until a "clear-of-dock" signal is provided either by the operator or by a sensor. In both cases the force canceling sequence may now be executed. In the locked sequence case the procedure to place the test head 100 in the desired central location is finally executed and the lock 118 engaged. In the normal sequence case, the lock 118 is left disengaged.

As explained later, in some applications it is preferred to leave the lock 118 unlocked while docked. Further information on docking is also provided later.

FIG. 1(*b*) illustrates a system which is identical to the system described with reference to FIG. 1(*a*), with the exception that in FIG. 1(*b*), bearings 116*a* and 166*b* are coupled together and connected to the test head 100 at a single point. In contrast, in FIG. 1(*a*), bearings 116*a* and 116*b* are individually connected to the test head 100.

The balance mechanism thus described is adapted for use in FIGS. 6(*a*), 6(*b*), 8(*a*), etc. The discussion relating to these figures provides more information and details about controlling the air and others issues.

Figure 4A:
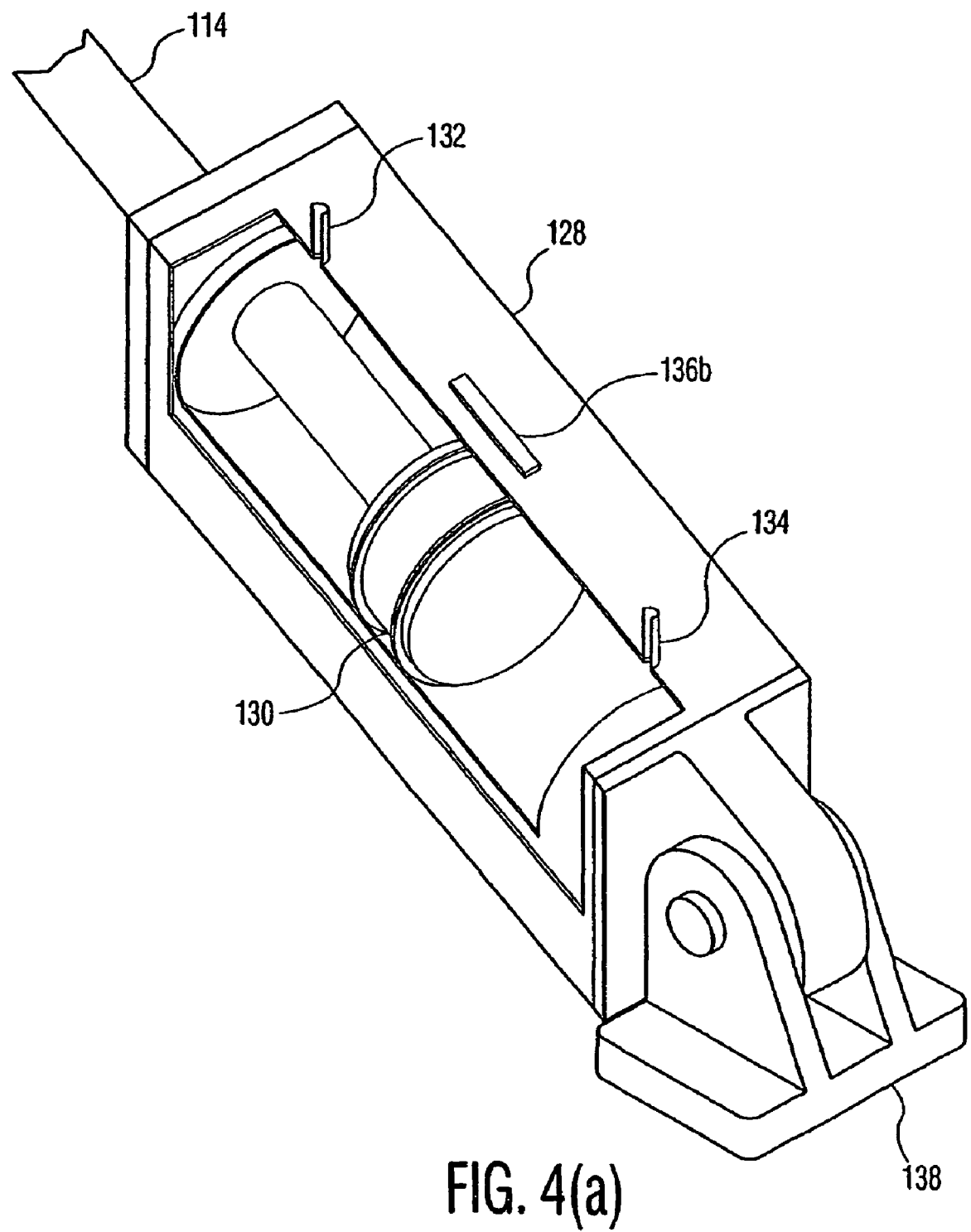
FIG. 4(a) is a detailed cut-away of a pneumatic cylinder in accordance with an exemplary embodiment of the present invention.
Figure 4B:
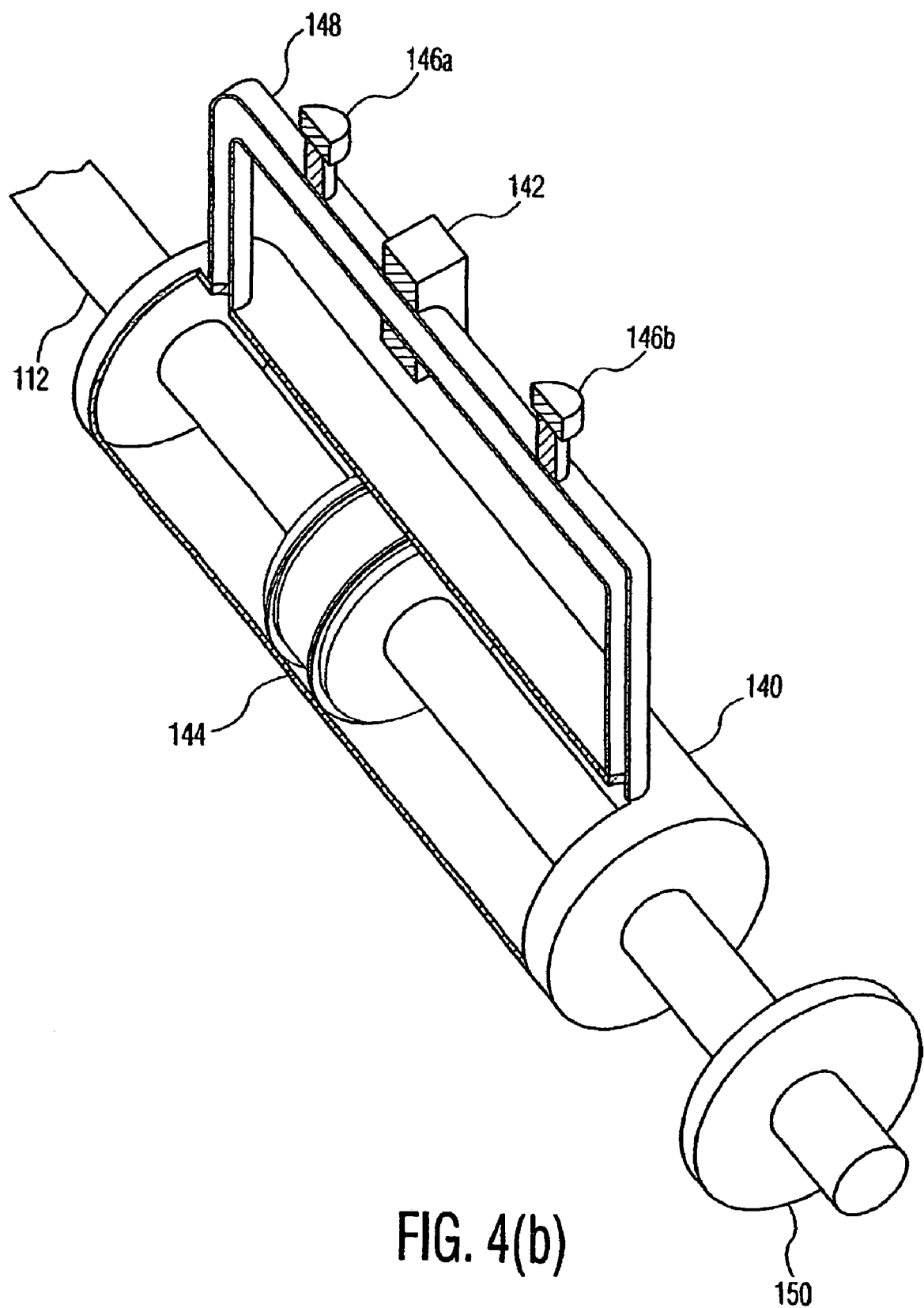
FIG. 4(b) is a detailed cut-away of a hydraulic cylinder in accordance with an exemplary embodiment of the present invention.

FIG. 1(*c*) illustrates a system which is identical to the system shown in FIG. 1(*a*), with the exception that in FIG. 1(*c*) a hydraulic lock 140 which includes pressure sensors 146*a* and 146*b* are used, as opposed to the lock 118 and the force sensor 120 shown in FIG. 1(*a*). As with the system illustrated in FIG. 1(*a*), the system in FIG. 1(*c*) can realize either the normal sequence described above or the locked sequence described above. FIG. 4(*b*) provides a more detailed, cut-away view of the hydraulic locking unit 140. Here, the force rod 112 is attached to the piston 144 of a dual-action hydraulic cylinder 140.

As illustrated in FIG. 1(*c*), hydraulic cylinder 140 is rigidly attached to the pneumatic cylinder 128. The hydraulic cylinder 140 is filled with an appropriate incompressible fluid(not shown). Inside the hydraulic cylinder 140, the piston 144 moves in accordance with the difference in pressure on the piston's 144 two sides. Each side of the piston 144 contains a fluid inlet 154 which are connected to one another by tubing 152 through a control valve 142. On each side of the control valve 142 is a pressure sensor 146*a* and 146*b*, each being connected to one of the two fluid inlets 154.

Because the hydraulic fluid is substantially incompressible, the force rod 112 is locked when the control valve 142 is closed. The force rod 112 is free to move when the control valve 142 is open. Motion is only impeded by the flow of fluid through the system. This flow may be controlled by the sizes of the hoses, tubing, orifices, and valve operation. Suitable control of the flow can provide possible beneficial system damping. Although the pressure on both sides of the piston 144 is the same the instant the control valve 142 closes, imbalances of test head 100 imposed onto the force rod 112 causes the pressure on one side of the piston 144 to increase and the pressure on the other side of the piston 144 to decrease. It follows that the pressure difference determined by the two pressure sensors 146*a* and 146*b* indicates the magnitude and direction of the force applied to the force rod 112.

Operation of the system shown in FIG. 1(*c*) is as described for the system of FIG. 1(*a*) with the exceptions that the hydraulic valve 142 is actuated instead of a mechanical lock 118 and that pressure sensor outputs are read and processed by the controller to indicate the force in the force rod 112.

When in operation the pressure sensors 146*a* and 146*b* are used to detect an imbalance force from the test head 100; air is provided to the retract inlet 132 and the extend inlet 134 of the pneumatic cylinder 128, to counter the force detected by the pressure sensors 146a and 146b. FIG. 4(*a*) provides a more detailed, cut-away view of the pneumatic cylinder 128. Through the air pressure entered into the retract inlet 132 and the extend inlet 134, a pressure differential is created across the piston 130. The goal is for this pressure differential to be of sufficient magnitude and direction to reduce the force in the force rod 112 to a magnitude that is less than a predetermined maximum allowable imbalance force.

In FIG. 1(*c*) the process of balancing the test head 100 about the pivot axis 102, is as follows. With control valve 142 open, test head 100 is placed in a desirable location relative to its support structure(not shown), and control valve 142 is closed. At this time the test head 100 is locked with respect to the pivot axis 102, since the control valve 142 is closed. The pressure sensors 146a and 146b detect if there is a significant imbalance force from the test head 100 about the pivot axis 102. The pressure sensors 146a and 146b are able to detect both the magnitude and the direction of the force. If a significant imbalance is detected, air pressure is then adjusted within the retract inlet 132 and the extend inlet 134, with the objective of developing a pressure differential across the piston 130. The goal is for this pressure differential across the piston 130 to be of sufficient magnitude to reduce the force measured by the pressure sensors 146a and 146b to less than a predetermined maximum allowable imbalance force. At this time, the control valve 142 is opened, and the test head 100 is essentially weightless in the direction of the pivot axis 102. The test head 100 may now be moved in the direction of the pivot axis 102. This process can be repeated as is necessary to maintain the test head 100 in a balanced state about the pivot axis 102.

FIG. 1(*d*) illustrates a system which is identical to the system shown in FIG. 1(*c*), with the exception that in FIG. 1(*d*), bearings 116a and 166b are coupled together and connected to the test head 100 at a single point. In contrast, in FIG. 1(*c*), bearings 116a and 116b are individually connected to the test head 100.

Figure 2A:
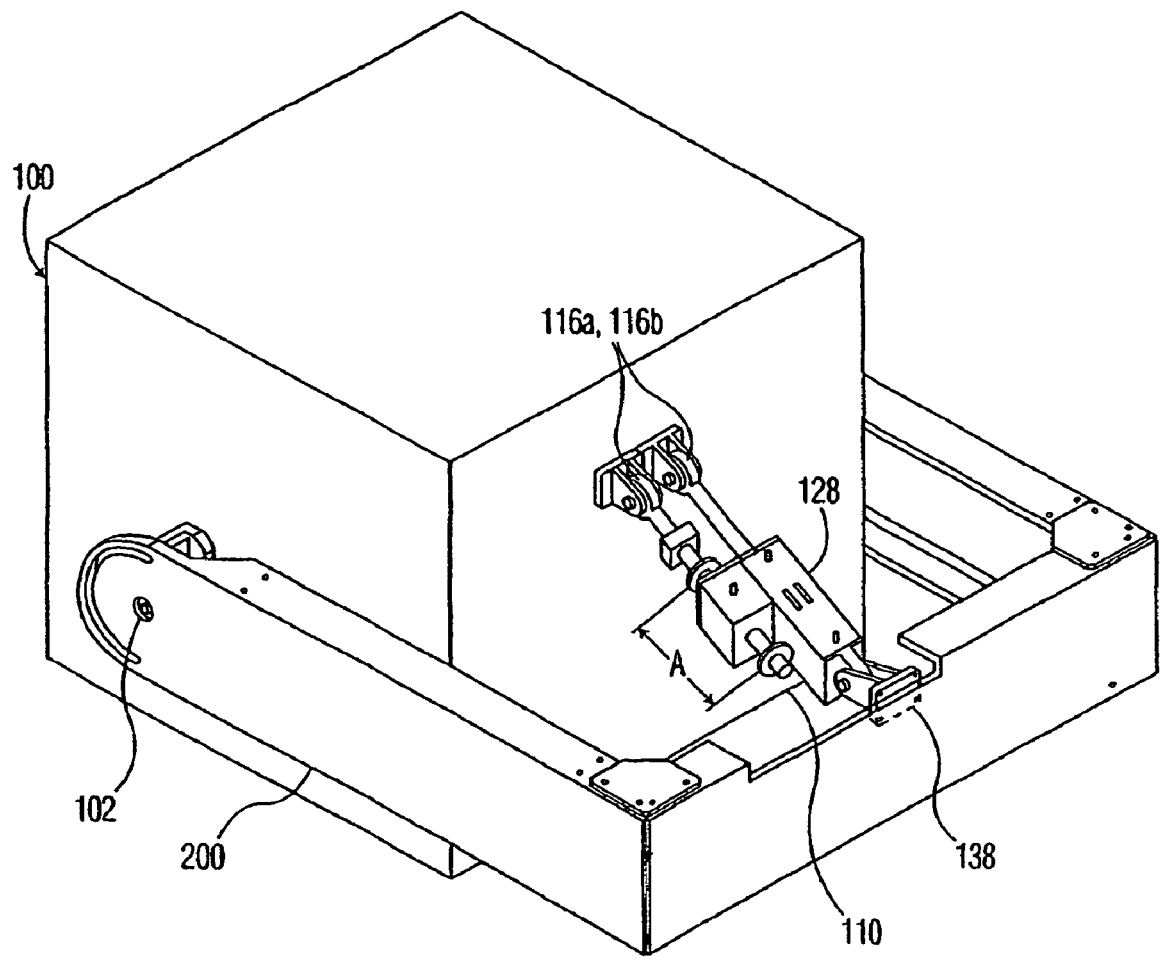
FIG. 2(a) is a perspective view of a balancing unit coupled to a test head which is mounted in a cradle in accordance with an exemplary embodiment of the present invention.
Figure 2B:
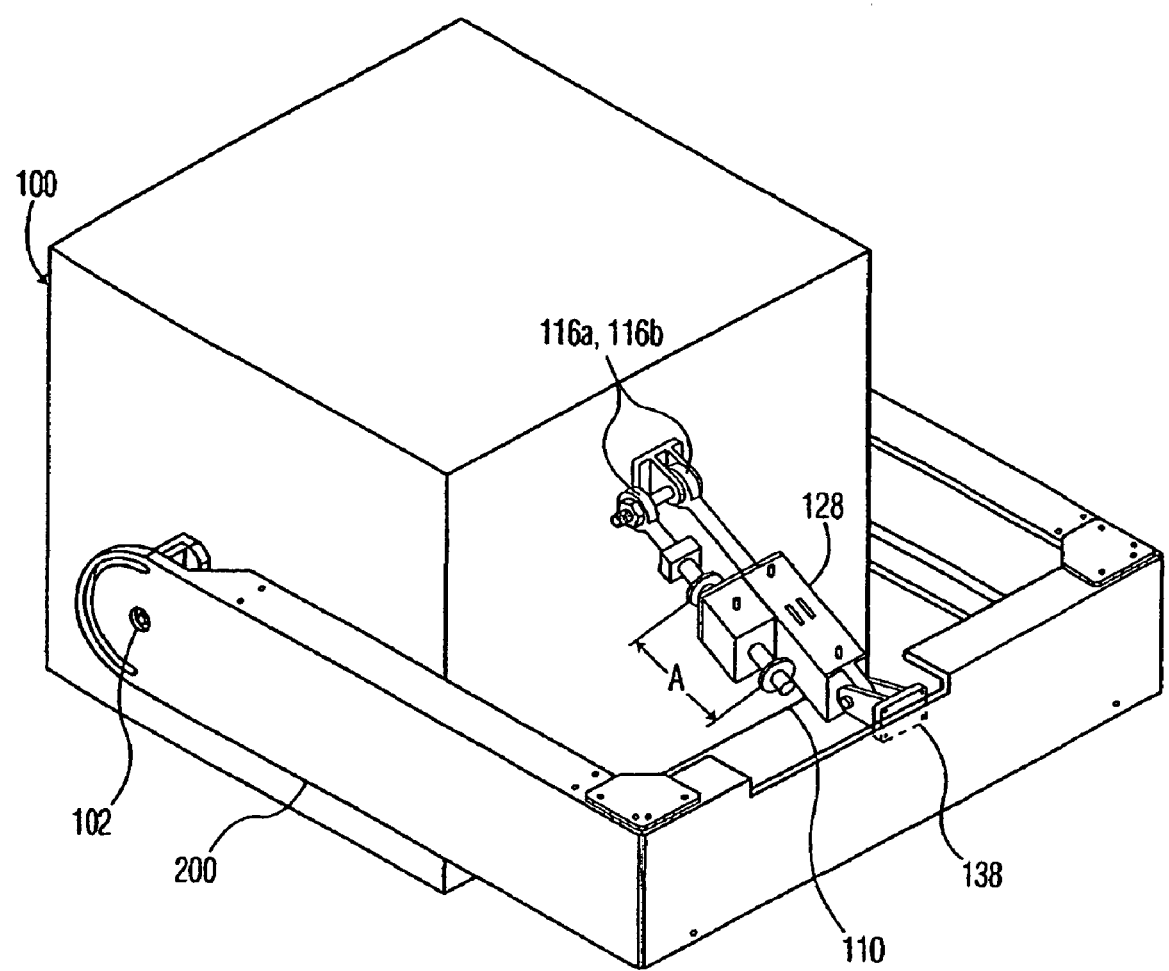
FIG. 2(b) is a perspective view of a balancing unit coupled to a test head which is mounted in a cradle in accordance with another exemplary embodiment of the present invention.

FIG. 2(*a*) shows a further exemplary embodiment of the present invention. FIG. 2(*a*) is a perspective drawing showing the application of the balancing unit 110 to the tumble axis(pivot axis) 102 of a test head 100 mounted in a traditional cradle 200. The test head 100 connects to the cradle 200 at the two end points of the tumble axis 102. A balance unit 110 with two ends is provided. The first end of the balance unit 110 is connected to the test head 100. The second end of the balance unit 110 is connected to the cradle 200. The cradle 200 is the support structure for the test head about the tumble axis 102.

If the center of gravity of the test head 100 does not coincide with the tumble axis 102, the test head 100 will rotate about the tumble axis 102, away from the position shown in FIG. 2(*a*). The balance unit 110 will provide a counter force to balance the test head's 100 center of gravity about the tumble axis 102, maintaining the position of the test head 100 in FIG. 2(*a*). Thus, manual movement of the test head 100 about the axis 102 has been facilitated, as the test head 100 is now essentially weightless about the tumble axis 102.

FIG. 2(*b*) illustrates a system which is identical to the system shown in FIG. 2(*a*), with the exception that in FIG. 2(*b*), bearings 116a and 116b are coupled together and connected to the test head 100 at a single point. In contrast, in FIG. 2(*a*), bearings 116a and 116b are individually connected to the test head 100.

Figure 3A:
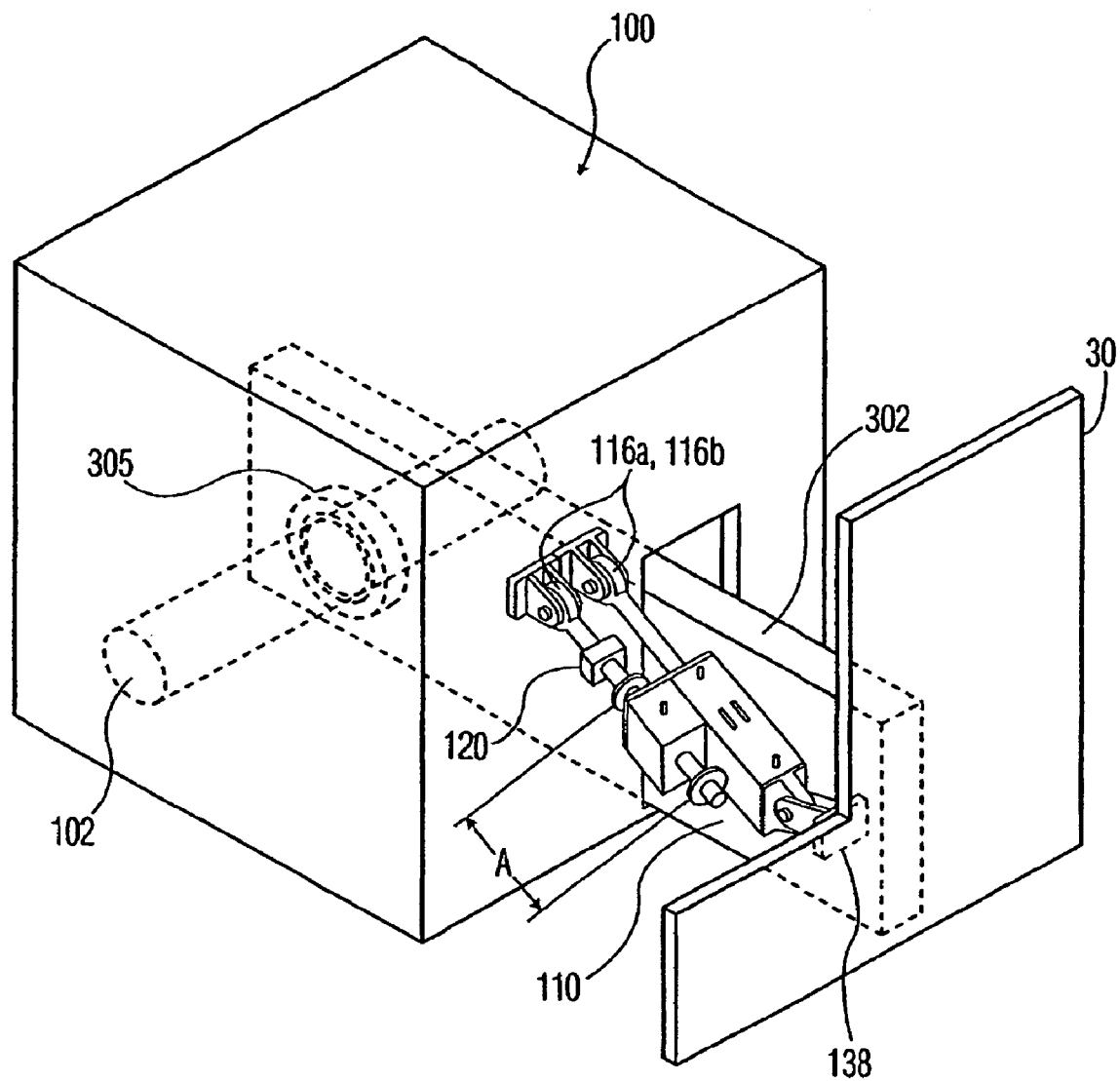
FIG. 3(a) is a perspective view of a balancing unit coupled to a test head which is supported with an internal bearing in accordance with an exemplary embodiment of the present invention.
Figure 3B:
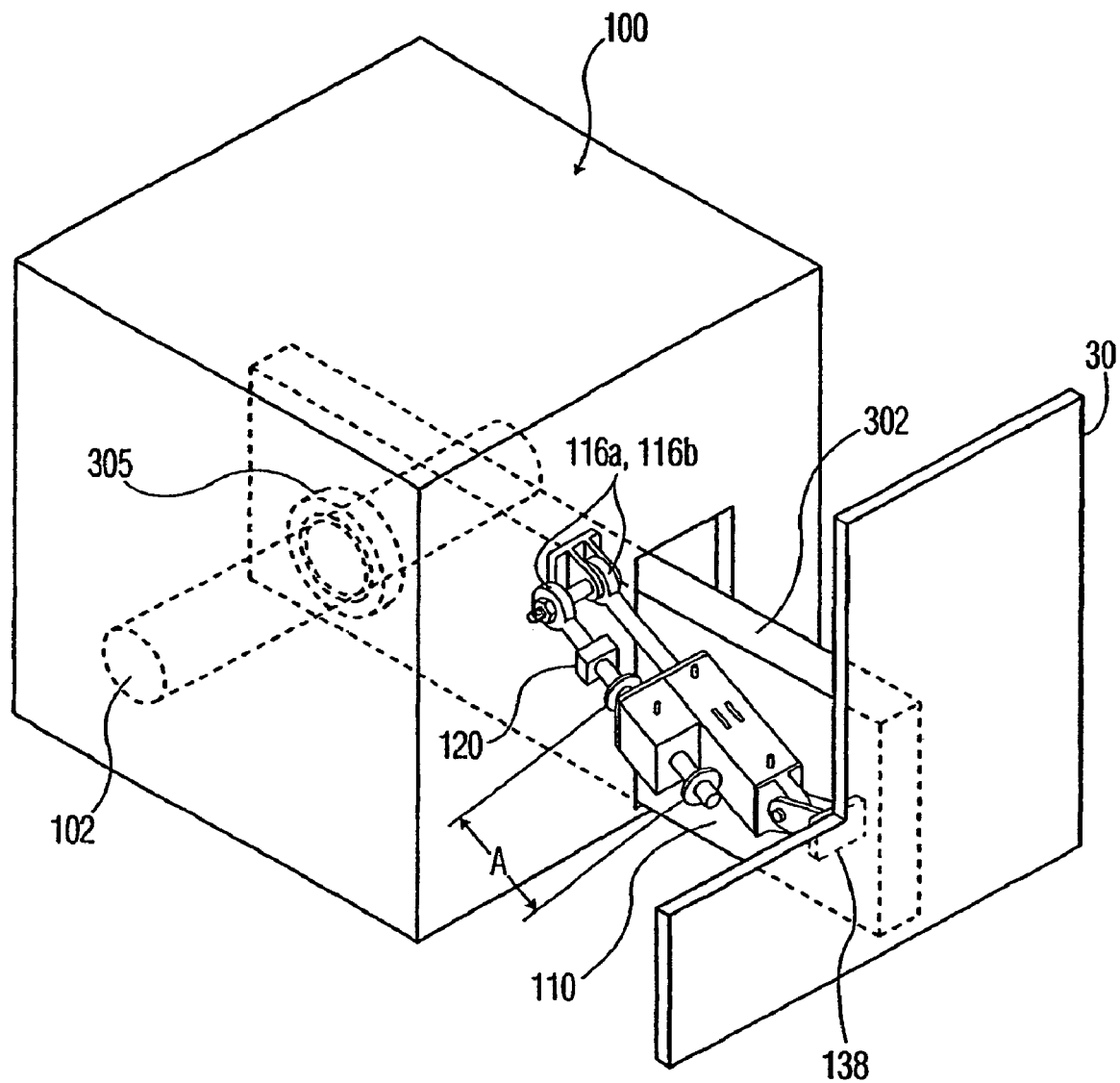
FIG. 3(b) is a perspective view of a balancing unit coupled to a test head which is supported with an internal bearing in accordance with another exemplary embodiment of the present invention.

FIG. 3(*a*) shows another exemplary embodiment of the present invention. FIG. 3(*a*) is a perspective drawing showing the application of the balancing unit 110 to the pivot axis 102 of a test head 100. The test head 100 is supported by a support arm 302 and a holding flange 300. A bearing 305 is housed inside the test head 100. The support arm 302 is connected to the holding flange 300 on the outside of the test head 100. A balance unit 110 with two ends is provided. The first end of the balance unit 110 is connected to the test head 100. The second end of the balance unit 310 is connected to the holding flange 300. The holding flange 300 is the support structure for the pivot axis 102.

If the center of gravity of the test head 100 does not coincide with the pivot axis 102, the test head 100 will rotate about the pivot axis 102 through the bearing 305, away from the position shown in FIG. 3(*a*). The balance unit 110 will provide a counter force to balance the test head's 100 center of gravity about the pivot axis 102, maintaining the position of the test head 100 in FIG. 3(*a*). Thus, manual movement of the test head 100 has been facilitated, as the test head 100 is now essentially weightless about the pivot axis 102.

FIG. 3(*b*) illustrates a system which is identical to the system shown in FIG. 3(*a*), with the exception that in FIG. 3(*b*), bearings 116a and 116b are coupled together and connected to the test head 100 at a single point. In contrast, in FIG. 3(*a*), bearings 116a and 116b are individually connected to the test head 100.

Although the invention has been described in terms of a single balance unit 110 coupled to a single axis 102, two or more units could be employed on either a single axis or on multiple axes. When more than one unit is used, they can interact with one another. The overall control scheme desirably takes such potential interactions into account. For example, if two units are used to control two independent rotational axes, they should be operated one at a time. It is contemplated that three or more units could be successfully used to control a test head that is mounted with a spherical bearing as described in the background of the invention.

Figure 5A:
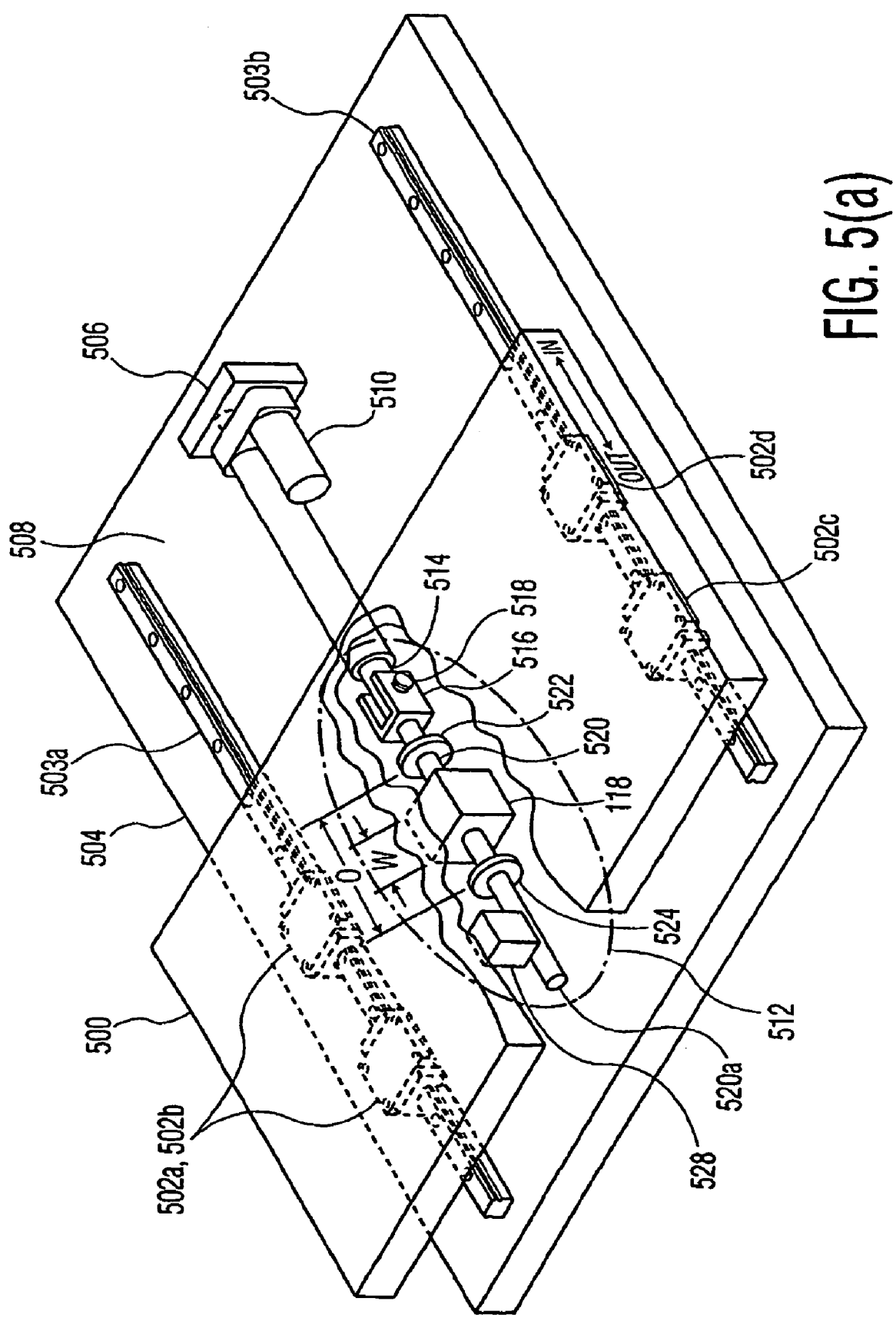
FIG. 5(a) is a perspective view of a compliant driving mechanism including a position sensor and a mechanical lock in accordance with an exemplary embodiment of the present invention.

FIG. 5(*a*) illustrates a basic compliant drive 512 mechanism according to an exemplary embodiment of the present invention that is appropriate for use in a horizontal axis where there are little or no imbalance forces and the compliance force is predominately due to friction. In FIG. 5(*a*), plate 504 and plate 500 are representative of plates used in the construction of a manipulator base having one or more horizontal motion axes built into it as, for example, described in PCT International Application No. US00/00704 "TEST HEAD MANIPULATOR" due to Holt et al. As shown, two linear guide rails 503a and 503b are arranged parallel with one another and are both rigidly attached to the upper surface of plate 504. Two pairs of ball slides, the first pair including ball slides 502a and 502b, and the second pair including ball slides 502c and 502d, are attached to the bottom of plate 500. The first pair of ball slides, 502a and 502b, are arranged so that they slidingly couple with linear guide rail 503a. The second pair of ball slides, 502c and 502d, are similarly arranged to slidingly couple with linear guide rail 503b. Accordingly, plate 500 is parallel with and shown above the plate 504, and plate 500 can move linearly with respect to plate 504 along the axis defined by the linear guide rails 503a and 503b. Such an arrangement could implement either in-out or side-to-side motion in a test head manipulator base. It is also to be noted that such an arrangement could also be adapted to swing motion provided by a horizontal plate rotating about a vertical axis with respect to the horizontal plane as described for example in the PCT International Application No. US000/00704 "TEST HEAD MANIPULATOR" due to Holt et al. As shown in FIG. 5(a), resistance to motion is generated by the friction forces associated with the ball slides 502a, 502b, 502c, and 502d, and linear guide rails 503a and 503b. For convenience we will consider motion of plate 500 along linear guide rails 503a and 503b in the direction towards the linear actuator 508 to be in the "in" direction, while motion in the opposite direction is considered to be in the "out" direction as is indicated in FIG. 5(a).

The stationary element 506 of a linear actuator 508, including an actuator motor 510, is attached to plate 504. Typically, the linear actuator 508 comprises a ball screw mechanism driven by an electrical motor, with the driven element 514 being the ball screw. However, other mechanisms and/or screw types could also be used as might be appropriate to a given application. In FIG. 5(a), the driven element of the linear actuator 508 is the actuator shaft 514, which extends from and/or retracts into the stationary element 506 when the actuator motor 510 is energized; the direction of motion of the actuator shaft 514 is determined by the direction of rotation of the actuator motor 510. As shown, the linear actuator 508 is arranged so that the actuator shaft 514 moves in a plane that is parallel to linear guide rails 503a and 503b.

The distal end of the actuator shaft 514 has a hole through it that is at a nominal right angle to the axis of the actuator shaft 514. A clevis 516 and clevis pin 518, which passes through the hole in the actuator shaft 514, couple the actuator shaft 514 to a compliance shaft 520. The axis of the compliance shaft 520 is preferably approximately coaxial with the axis of the actuator shaft 514; however, it is understood to one of ordinary skill in the art that other arrangements are possible.

The compliance shaft 520 passes through a lock 118; the lock 118 is rigidly attached to plate 500. The lock 118 may be one of a number of different types including electrically operated types and pneumatically operated types. When the lock 118 is engaged, plate 500 is restrained from moving relative to the compliance shaft 520 and, consequently, relative to plate 504. Thus, with the lock 118 engaged, the linear actuator 508 can be used to position plate 500 along the linear guide rails 503a and 503b relative to plate 504. When the lock 118 is not engaged, plate 500 is free to move relative to the compliance shaft 520 and plate 504; and, consequently, compliant motion of plate 500 relative to plate 504 is realized. The associated compliance force due to this mechanism is comprised of the force necessary to overcome the friction of the linear guide rails 503a and 503b and ball slides 502a, 502b, 502c and 502d, plus the friction of the compliance shaft 520 moving through the lock 118. It is noted that there may be some additional forces in specific manipulators and applications, but these are not associated with the mechanism as described.

An extended compliance stop 522 and a retracted compliance stop 524 are both rigidly attached to the compliance shaft 520, one on either side of the lock 118. As shown in FIG. 5(a), the extended compliance stop 522 is located between the lock 118 and the clevis 516; and the retracted compliance stop 524 is located between the distal end of the compliance shaft 520a and the lock 118. These compliance stops 522 and 524 serve to limit the travel of the compliance shaft 520 relative to plate 500 or, equivalently, limit the travel of plate 500 relative to the compliance shaft 520. If the lock 118 is not engaged, plate 500 may be moved by external forces over a travel range defined by the distance "D" between the two compliance stops 522 and 524 minus the width "W" of the lock 118, and this defines a compliant range of motion. That is, with the lock 118 disengaged (and the linear actuator 508 preferably turned off), plate 500 may be moved by external forces, sufficient to overcome the aforementioned compliance forces, along the linear guide rails 503a and 503b over a distance defined by D-W.

Normally, the friction associated with the ball slides 502a, 502b, 502c and 502d, and the linear guide rails 503a and 503b, is greater than the friction between the compliance shaft 520 and the lock 118. Accordingly, if the lock 118 is not engaged, and the linear actuator motor 520 is energized, the compliance shaft 520 moves relative to the lock 118 and plate 500. If the actuator motor 510 is energized such that the actuator shaft 514 extends from the stationary element 506, the extended compliance stop 522 moves in the direction of the lock 118. If the actuator motor 510 is not turned off, the extended compliance stop 522 comes to bear against the lock 118 as the end of the compliance range is reached; and further extension of the actuator shaft 514 then causes plate 500 to move in the "out" direction relative to plate 504. Alternatively, if the actuator motor 510 is energized such that the actuator shaft 514 retracts into the stationary element 506, the retracted compliance stop 524 moves in the direction of the lock 118. If the actuator motor 510 is not turned off, the retracted compliance stop 524 comes to bear against the lock 118 as the end of the compliance range is reached; and further retraction of the actuator shaft 514 then causes plate 500 to move in the "in" direction relative to plate 504.

In operation, it is desirable that the compliance shaft 520 be positioned to and locked at a position within a small neighborhood of some preselected point within its range of motion with respect to plate 500. Typically, this point will be midway between the two compliance stops 522 and 524; however, there may be applications where it would be desirable to locate this point closer to one or the other of the two compliance stops 522 or 524. We will refer to this neighborhood as the "compliance-neutral region." The compliance-neutral region is normally a small portion of the total compliant range: for example, .+-.3 or 4 mm within a 40 to 50 mm total compliant range.

When the lock 118 is located between the compliance neutral region and the extended compliance stop 522, it is said to be in the "compliance-extended region." Similarly, when the lock 118 is located between the compliance neutral region on the retracted compliance stop 524, it is said to be in the "compliance-retracted region."

As shown in FIG. 5(a), a position sensor 528 is incorporated to sense the relative position of plate 500 relative to the compliance shaft 520. The position sensor 528 may be any one of a number of known types ranging from precision encoders, potentiometers, etc. to combinations of limit switches, proximity sensors, range finders, etc. As a minimum capability, the position sensor 528 should indicate which of the three regions that the mechanism is presently in: compliance-extended, compliance-neutral, or compliance-retracted.

The operation of the compliance mechanism 512 is now described. First, the lock 118 is disengaged. The linear actuator 508 is then used in conjunction with the position sensor 528 to position the compliance shaft 520 to the predefined compliance-neutral position. The lock 118 is now locked, and the linear actuator 508 is used to position plate 500 to the desired location relative to plate 504. For example, the desired location could be a location where the test head or load(not shown) will be docked. The linear actuator motor 510 is now turned off and the lock 118 is disengaged. Plate 500 may now be moved in compliant fashion by external forces; for example, forces generated by a docking mechanism as the test head or load is urged into its final docked position. According to the specific application and/or user preference, the lock 118 may or may not be re-locked once a final docked position is achieved. Also according to the specific application and/or user preference, the lock 118 may or may not be locked while the test head or load is being undocked. Once undocked, however, the compliance shaft 520 should be placed and locked in the compliance-neutral position according to the foregoing procedure before motion of plate 500 is initiated by way of the linear actuator 508.

Figure 5B:
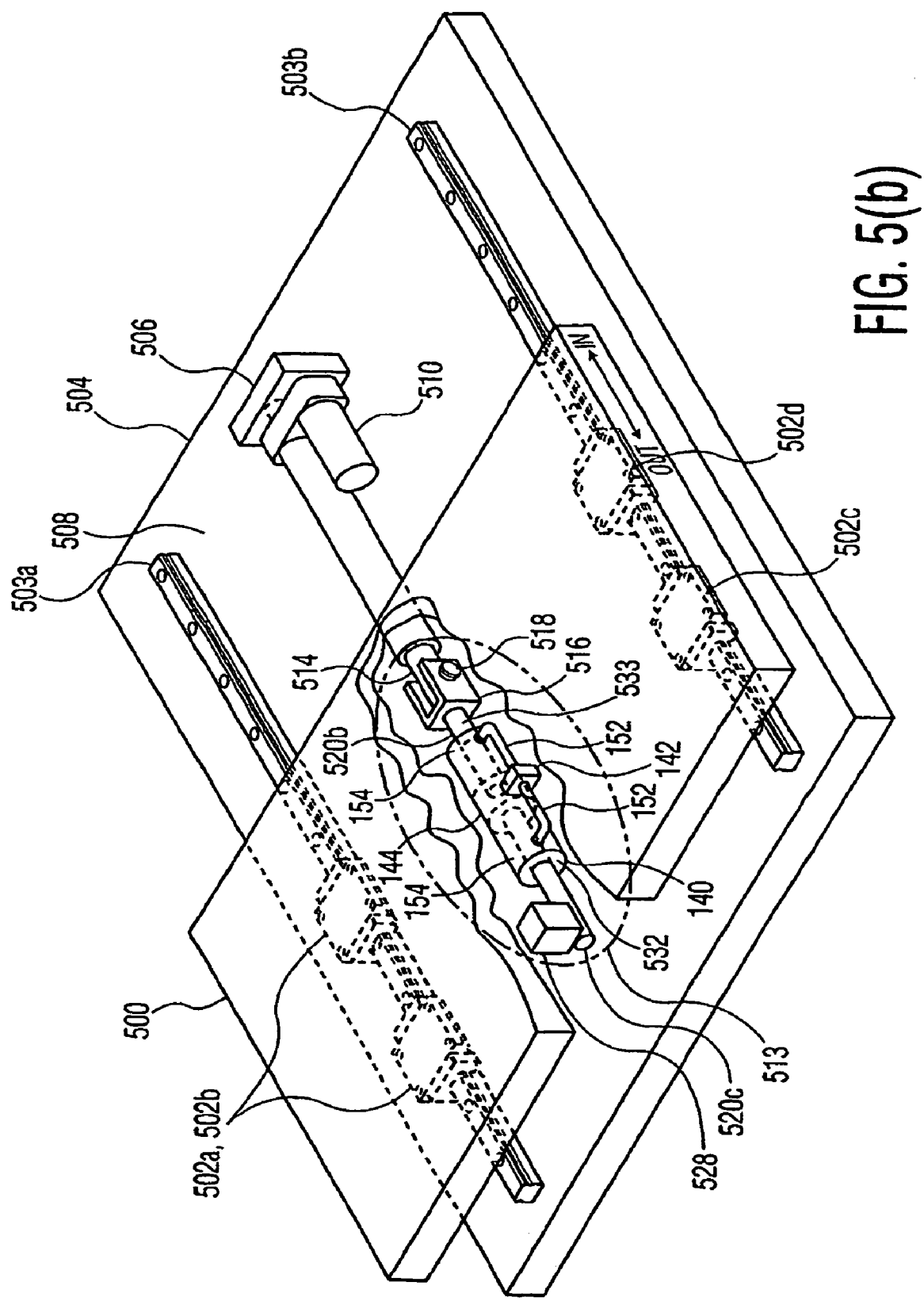
FIG. 5(b) is a perspective view of a compliant driving mechanism including a position sensor and a hydraulic lock in accordance with an exemplary embodiment of the present invention.

FIG. 5(b) shows an alternative embodiment of FIG. 5(a). In FIG. 5(b) a hydraulic mechanism 513 replaces the lock 118 and compliance stops 522 and 524 of FIG. 5(a). In particular the body of a double acting hydraulic cylinder 140 is attached to plate 500 with the axis of its bore in a plane with the axis of the actuator shaft 514 of the linear actuator 508. Again, motion of plate 500 along the linear guide rails 503a and 503b in the direction towards the linear actuator 508 is in the "in" direction, while motion in the opposite direction is in the "out" direction as is indicated in FIG. 5(b). The end of the cylinder 140 that is furthest from the linear actuator 508 is the "extended end" 532 and the end of the cylinder 140 that is closest to the linear actuator is the "retracted end" 533. A piston 144 is located inside the hydraulic cylinder 140; and the piston 144 is connected to shaft 520b which is coaxial with the bore of the hydraulic cylinder 140 and which extends through the retracted end 533 of the hydraulic cylinder 140. The shaft 520b serves as part of the compliance shaft 520, and it is connected to the actuator shaft 514 by means of a clevis 516 and clevis pin 518 as was described with respect to FIG. 5(a). In FIG. 5(b), a second shaft 520c attached to the opposite side of the piston 144 extends through the extended end 532 of the hydraulic cylinder 140. This second shaft 520c serves as an extension of the compliance shaft 520, and the position sensor 528 in FIG. 5(b) senses the position of this shaft 520c relative to plate 500. However, it is also feasible to arrange the system so that the position sensor 528 could operate in conjunction with the first shaft 520b to save the potential extra cost of providing a second shaft 520c.

Each of the two ends of the hydraulic cylinder 140 is provided with a port 154 that enables an appropriate hydraulic fluid to flow either into or out of the cylinder 140. The two ports 154 are externally connected to one another via a valve 142 by tubing 152. The valve 142 is arranged so that when it is open, fluid can flow freely out of one port and into the other; and when it is closed, fluid can not flow between the two ports 154. The entire mechanism is filled with an appropriate substantially incompressible fluid. The choice of fluid should take into account potentially harmful effects that could occur if a leak in the system develops. Also, because the system is apt to be shipped in the cargo hold of an airplane at temperatures well below the freezing point of water, the fluid should have a low freezing point. Because the fluid is incompressible, it is apparent that when the valve 142 is closed the piston 144 is unable to move in either direction. However, with the valve 142 open, the piston 144 is able to move because the fluid is free to move from one side of the piston 144 to the other via the path afforded by the ports 154, tubing 152, and open valve 142. When the valve 142 is closed, the motion of the compliance shaft 520 is essentially locked with respect to the hydraulic cylinder 140 and plate 500 to which the cylinder 140 is attached. Thus, with the valve 142 closed, operation of the linear actuator 508 causes motion of plate 500 relative to plate 504 along an axis defined by the linear guide rails 503a and 503b. However, with the valve 142 open, plate 500 can be moved by external forces along the axis defined by the linear guide rails 503a and 503b over a travel range defined by the available stroke of the piston 144 (which is essentially the inside distance between the two end walls of the cylinder 140 minus the thickness of the piston 144); and this defines a compliant range of motion. That is, with the valve 142 open (and the linear actuator motor 510 preferably turned off), plate 500 may be moved by external forces along the linear guide rails 503a and 503b over a distance defied by the available stroke of the piston 144.

Normally, the friction and other forces associated with moving the piston 144 in the hydraulic cylinder 140 with the valve 142 open is less than the friction forces associated with the linear guide rails 503a and 503b and ball slides 502a, 502b, 502c and 502d. Accordingly, if the valve 142 is open and the linear actuator motor 510 is energized, then the compliance shaft 520 moves relative to the hydraulic cylinder 140 and plate 500. If the actuator motor 510 is energized such that the actuator shaft 514 extends from the stationary element 506, the piston 144 moves towards the extended end 532 of the cylinder. Now, if the actuator motor 510 is not turned off, the piston 144 comes to bear against the end wall at the extended end 532 of the cylinder 140 as the end of the compliance range is reached. Further extension of the actuator shaft 514 then causes plate 500 to move in the "out" direction relative to plate 504. If the actuator motor 510 is energized such that the actuator shaft 514 retracts into the stationary element 506, the piston 144 moves towards the retracted end 533 of the cylinder 140. Now, if the actuator motor 510 is not turned off, the piston 144 comes to bear against the end wall at the retracted end 533 of the cylinder 140 as the end of the compliance range is reached. Further extension of the actuator shaft 514 then causes plate 500 to move in the "in" direction relative to plate 504.

In operation it is desirable that the piston 144 (and its attached compliance shaft 520) be positioned to and locked at a position within a small neighborhood of some preselected point within its range of motion with respect to plate 500. Typically this point is midway between the two ends of the cylinder 140; however, there may be applications where it would be desirable to locate this point closer to one or the other of the two ends. This neighborhood is again referred to as the "compliance-neutral region." The compliance neutral region is normally a small portion of the total compliant range: for example, .+-.3 or 4 mm within a 40 to 50 mm total compliant range.

When the piston 144 is located between the compliance neutral region and the extended end 532 of the cylinder 140, it will be said to be in the "compliance-extended region." Similarly, when the piston 144 is located between the compliance neutral region and the retracted end 533 of the cylinder 140, it is said to be in the "compliance-retracted region."

Just as in FIG. 5(a), a position sensor 528 is incorporated to sense the relative position of plate 500 relative to the compliance shaft 520. The position sensor 528 may be any one of a number of known types ranging from precision encoders, potentiometers, etc. to combinations of limit switches, proximity sensors, range finders, etc. As a minimum capability, the position sensor 528 should indicate which of the three regions that the mechanism is presently in: compliance-extended, compliance-neutral, or compliance-retracted.

The operation of the mechanism 513 is now described. First, the valve 142 is opened. The linear actuator 508 is then used in conjunction with the position sensor 528 to position the piston 144 to the predefined compliance-neutral position. The valve 142 is now closed to lock the piston 144 and compliance shaft 520 in the compliance-neutral position, and the linear actuator 508 is used to position plate 500 to the desired location relative to plate 504. For example, the desired location could be a location where the test head or load(not shown) will be docked. The linear actuator 508 is now turned off and the valve 142 is opened. Plate 500 may now be moved in compliant fashion by external forces; for example, forces generated by a docking mechanism as the test head or load is urged into its final docked position. According to the specific application and/or user preference, the valve 142 may or may not be closed again once a final docked position is achieved. Also according to the specific application and/or user preference, the valve 142 may or may not be opened while the test head or load is being undocked. However, once undocked the piston 144 and compliance shaft 520 should be placed and locked in the compliance-neutral position according to the foregoing procedure before motion of plate 500 is initiated by way of the linear actuator 508.

Figure 5C:
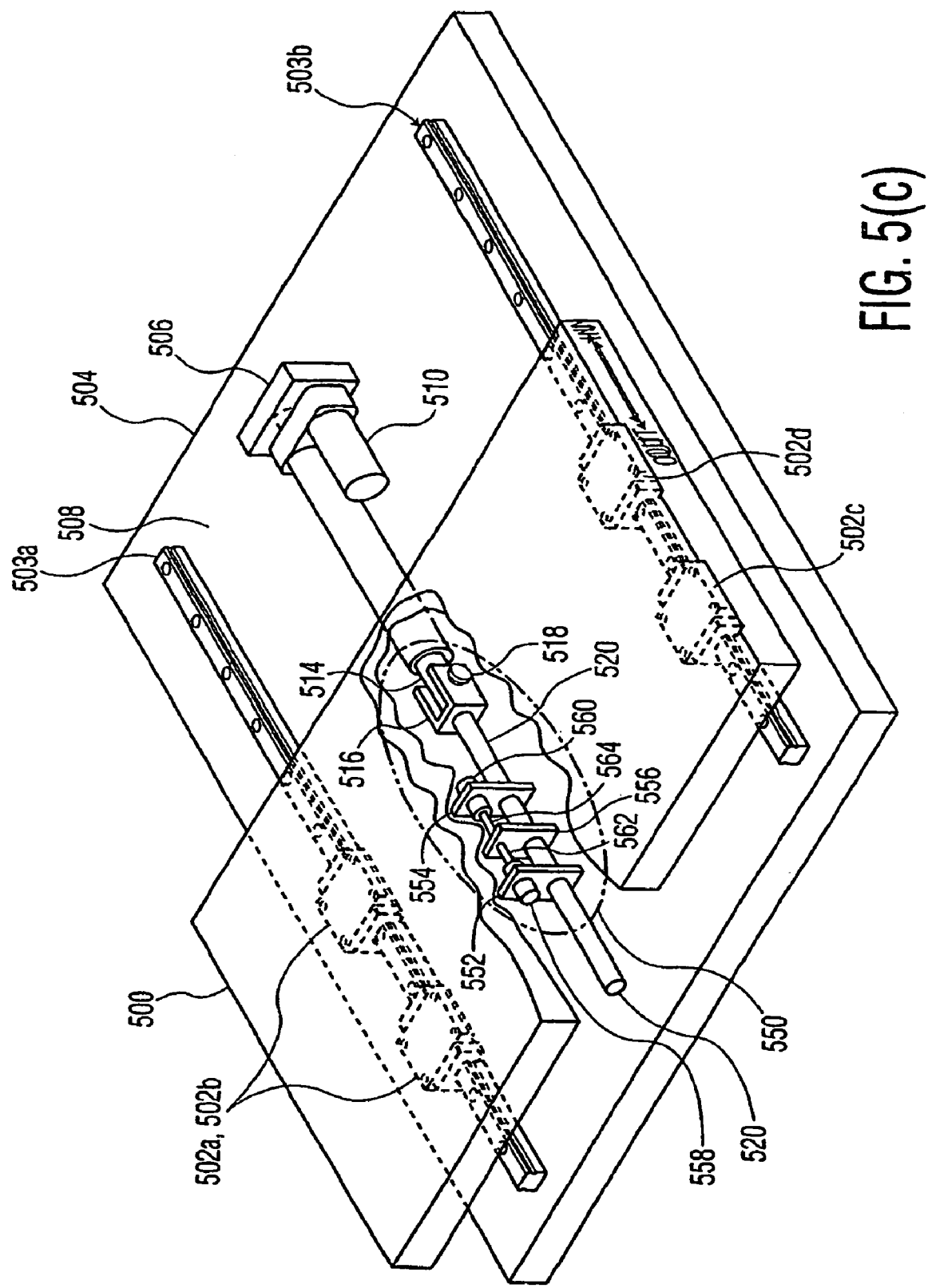
FIG. 5(c) is a perspective view of a compliant driving mechanism including a position sensor and two compliance centering actuators in accordance with an exemplary embodiment of the present invention.

FIG. 5(c) shows yet another exemplary compliant drive mechanism 550 for use in a horizontal axis where there are little or no imbalance forces and the compliance force is predominately due to friction. The arrangement and purpose of the two horizontal plates 500 and 504, linear guide rails 503a and 503b, ball slides 502a, 502b, 502c and 502d, and linear actuator 508 are essentially the same as described in reference to FIG. 5(a). In addition, a compliance shaft 520 is connected to the actuator shaft 514 by means of a clevis 516 and clevis pin 518 in a like manner to that shown in FIG. 5(a). Motion of plate 500 along the linear guide rails 503a and 503b in the direction towards the linear actuator 508 is in the "in" direction, while motion in the opposite direction is in the "out" direction as is indicated in FIG. 5(c).

The compliance shaft 520 is passed through both an inward mounting bracket 554 and an outward mounting bracket 552, both of which are rigidly attached to the underside of plate 500, with the inward mounting bracket 554 being closer to the linear actuator 508 than the outward mounting bracket 552. It is desired that the compliance shaft 520 can freely move along an axis in the in-out direction relative to the mounting brackets 552 and 554, and ball slides 502a, 502b, 502c and 502d may be used to accomplish this. A compliance stop 556 is rigidly attached to the compliance shaft 520 at a position that is located between the two mounting brackets 552 and 554.

The stationary element of an outward centering actuator 558 is attached to the outward mounting bracket 552, and the stationary element of an inward centering actuator 560 is attached to the inward mounting bracket 554. The driven element of each of these two centering actuators 558 and 560 is a plunger or ball screw mechanism that either extends outward from the stationary element or retracts into the stationary element upon appropriate application of energy to the actuator 558 or 560. (For convenience we will use the term "plunger" to mean either type of driven element where the context is clear that either would be appropriate.) The two actuators 558 and 560 are mounted in opposing directions so that the plungers or ball screws are essentially coaxial and parallel with the axis of the compliance shaft 520 and so that, when appropriately energized, the plungers or ball screws extend in a direction towards the compliance stop 556.

It is seen that a range of compliant motion is provided if either or both the inward actuator plunger 564 and the outward actuator plunger 562 are sufficiently retracted so that space exists between the compliance stop 556 and the distal ends of either or both actuator plungers 562 and 564. If this condition is met, then plate 500 can be moved along the linear guide rails 503a and 503b by an external force that is sufficient to overcome the friction of the ball slides 502a, 502b, 502c and 502d, and linear guide rails 503a and 503b in addition to the friction of the mounting brackets 552 and 554 and compliance shaft 520. The total range of compliant motion available is equal to the distance between the distal ends of the two actuator plungers 562 and 564 minus the thickness of the compliance stop 556. Accordingly, the range of compliant motion can be controlled by means of the centering actuators 558 and 560, if so desired, in the system of FIG. 5(c); whereas, the compliant region is fixed in the systems of FIGS. 5(a) and 5(b).

It is also seen that if both the inward and outward actuator plungers, 564 and 562 respectively, are extended such that both are simultaneously bearing on the compliance stop 556, then plate 500 is fixed in place with respect to the compliance shaft 520. The linear actuator 508 can then be used to move and position plate 500 relative to plate 504.

Normally, the friction associated with the ball slides 502a, 502b, 502c and 502d, and linear guide rails 503a and 503b, is greater than the friction between the compliance shaft 520 and the inward and outward mounting brackets 554 and 552, respectively. Accordingly, if either or both of the centering actuator plungers 562 or 564 are sufficiently retracted so that compliant motion is possible, and the linear actuator motor 510 is then energized, the compliance shaft 520 and compliance stop 556 moves relative to the inward and outward mounting brackets, 554 and 552 respectively. If the actuator motor 510 is energized such that the actuator shaft 514 extends from the stationary element 506, the compliance stop 556 moves in the direction of the outward actuator plunger 562. If the actuator motor 510 is not turned off, the compliance stop 556 comes to bear against the outward actuator plunger 562 as the end of the compliance range is reached. Further extension of the actuator shaft 514 then causes plate 500 to move in the out direction relative to plate 504. Conversely, if the actuator motor 510 is energized such that the actuator shaft 514 retracts into the stationary element 506, the compliance stop 556 moves in the direction of the inward actuator plunger 564. If the actuator motor 510 is not turned off, the compliance stop 556 comes to bear against the inward actuator plunger 564 as the end of the compliance range is reached. Further retraction of the actuator shaft 514 then causes plate 500 to move relative to plate 504.

In operation it is desirable the compliance shaft 520 be positioned to and held at a position within a small neighborhood of some preselected point within its range of motion relative to plate 500. Typically this point is midway between the inward and outward centering actuators, 560 and 558 respectively; however, there may be applications where it would be desirable to locate this point closer to one or the other of the two centering actuators 560 and 558. We will again refer to this neighborhood as the "compliance-neutral region." The compliance neutral region is normally a small portion of the total compliant range: for example, .+−.3 or 4 mm within a 40 to 50 mm total compliant range.

When the compliance stop 556 is located between the compliance neutral region and the distal end of the outward actuator plunger 562, it is said to be in the "compliance-outward region." Similarly, when the compliance stop 556 is located between the compliance neutral region and the distal end of the inward actuator plunger 564, it is said to be in the "compliance-inward region." As will be discussed below, if appropriate centering actuators and design procedures are followed, a useful system of the type in FIG. 5(*c*) can be realized without a sensor to sense the relative position of plate 500 relative to plate 504. However, a position sensor 528 (not shown) may optionally be incorporated for this purpose to realize a potentially more sophisticated system. The position sensor 528 may be any one of a number of known types ranging from precision encoders, potentiometers, etc. to combinations of limit switches, proximity sensors, range finders, etc. As a minimum capability, the position sensor 528 should indicate which of the three regions that the mechanism is presently in: compliance-inward, compliance-neutral, or compliance-outward.

To realize a system without a position sensor 528 it is desirable to use centering actuators 558 and 560 of a type that can be controlled to the extent of being able to cause their plunger 562 and 564 to move in a given direction until it has reached its full range of travel. Such an actuator, 558 and 560, may be as simple as a solenoid device having a plunger, 562 and 564, that extends immediately to its full range upon application of energy and fully retracts upon removal of energy under the urging of a spring. An actuator, 558 and 560, incorporating a motor and a screw mechanism is also feasible. If hard stops are incorporated in the actuator, 558 and 560, to prevent the screw from over-travelling and if the motor is suitably protected from overheating when stalled, the screw can simply be driven in a known direction for a length of time sufficient for it to reach the limit of its travel. In addition, a motor driven screw actuator might incorporate limit switches to signal that an end of travel position has been reached. A further alternative could incorporate a stepping motor, and position could be controlled by controlling the number of steps of motion, possibly in combination with one or more limit switches. A second requirement is to design the length of the stroke of each actuator plunger, 562 and 564, or screw and the placement of the inward and outward mounting brackets, 552 and 554, and centering actuators, 558 and 560, for the desired results. The particular criteria, including that when the actuators, 558 and 560, are both in the fully extended state, the compliance stop 556 is held fully in the desired compliance-neutral position; and when both actuators, 558 and 560, are in the fully retracted state, the desired compliant range of motion is realized.

The operation of the mechanism of FIG. 5(*c*) without a position sensor is now described. First, both centering 558 and 560 are energized in such a way as to fully extend their plungers 562 and 564 or screws. This moves plate 500 to a compliance-neutral position relative to the compliance shaft 520. Notice that in this step of achieving the compliance-neutral position in the system of FIG. 5(*c*), the plate 500 is moved while the compliance shaft 520 remains stationary; whereas, in the systems of FIGS. 5(*a*) and 5(*b*), plate 500 remained fixed while the compliance shaft 520 moves to achieve this goal. The actuators 558 and 560 are now placed in a condition to hold their plungers 562 and 564 or screws in the fully extended positions to hold plate 500 in the compliance-neutral position. With non-back-drivable motor driven actuators, this is achieved by simply turning the power off. With other actuators, such as solenoid actuators, it may be necessary to keep the energy excitation applied. With plate 500 thus held in the compliance-neutral position, the linear actuator 508 is then used to position plate 500 to the desired location relative to plate 504. For example, the desired location could be a location where the test head or load(not shown) will be docked. The linear actuator motor 510 is now turned off and the centering actuators 558 and 560 are controlled in a manner to retract their plungers 562 and 564 or screws to create a region for compliant motion. Plate 500 may now be moved in compliant fashion by external forces; for example, forces generated by a docking mechanism as the test head or load is urged into its final docked position. According to the specific application and/or user preference, the centering actuators 558 and 560 may or may not be used to effectively lock plate 500 relative to plate 504 when the final docked position is achieved. Also according to the specific application and/or user preference, plate 500 may or may not be held in position by the centering actuators 558 and 560 while the test head or load is being undocked. However, once undocked the compliance shaft 520 should be placed and locked in the compliance-neutral position according to the foregoing procedure before motion of plate 500 is initiated by way of the linear actuator 508.

A system according to FIG. 5(*c*) that also incorporates a position sensor 528*a* (not shown) to sense the position of plate 500 relative to the compliance shaft 520 is now described. In such a system it would be most practical to use motor operated centering actuators 558 and 560 to take advantage of the position feedback that is available. The overall stroke of the actuator plungers 562 and 564 or screws and the placement of the actuators 558 and 560 are not as critical as in a system without a position sensor 528*a* as described above. It is sufficient that the actuators 558 and 560 be placed so that when their plungers 562 and 564 are both fully retracted, an appropriate compliant range of motion is realized; and also that when fully extended, the plungers 562 and 564 at least reach the compliance-neutral position. Operation is essentially the same as with the system without a position sensor 528*a*, except that the position sensor 528*a* is used to indicate when the compliance stop 556 has achieved the compliance-neutral position. Also if encoder or potentiometer type position sensor 528*a* is used, it would be possible in the system of FIG. 5(*c*), as well as the systems of FIGS. 5(*a*) and 5(*b*), to vary the location of the compliance-neutral region without changing the mechanical structure through appropriate programming of the control system.

Figure 7:
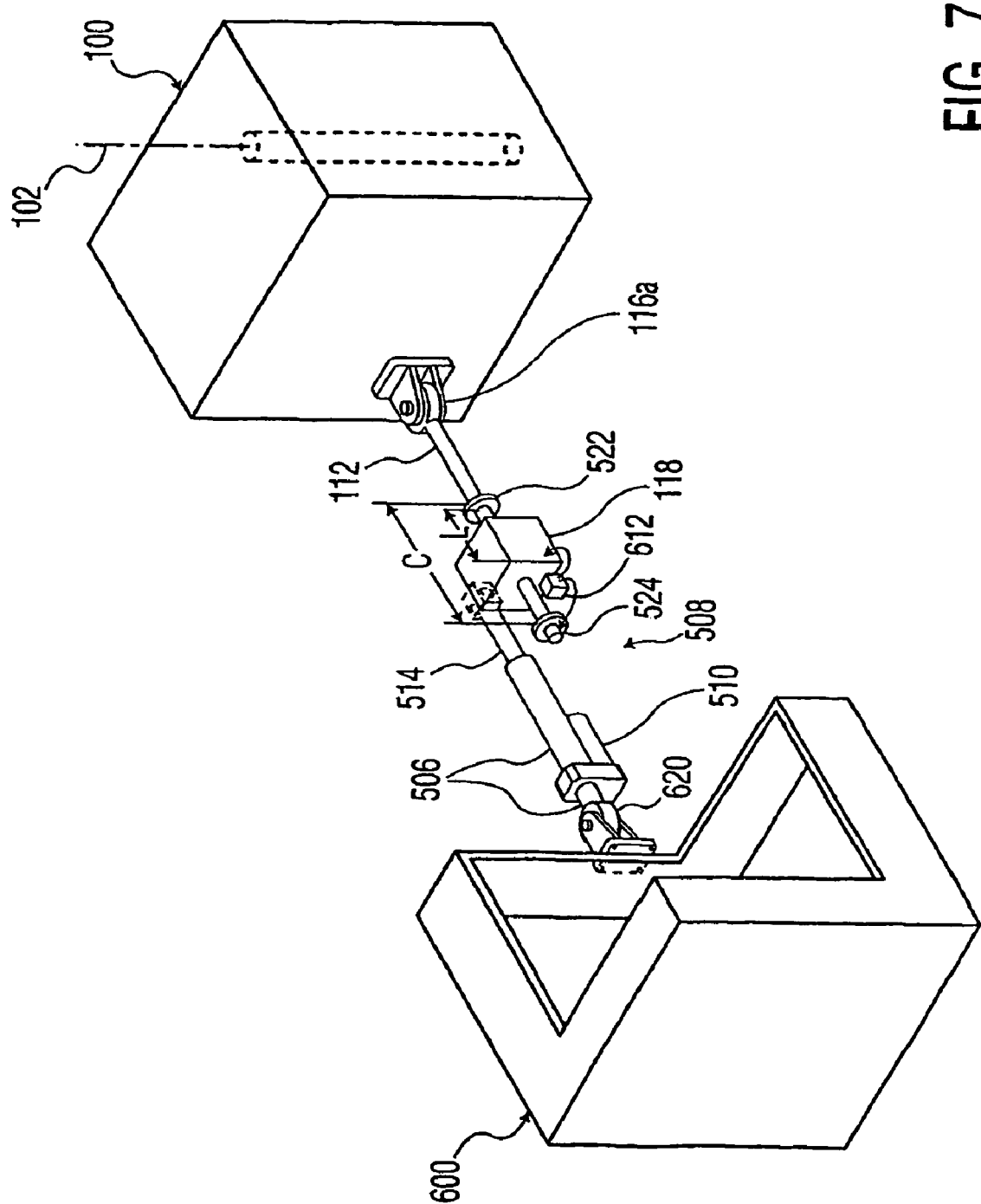
FIG. 7 is a perspective view of a compliant driving mechanism in accordance with yet another exemplary embodiment of the present invention.

The mechanism of FIG. 5(*a*) (and also of FIGS. 5(*b*) and 5(*c*)) may also be applied to rotational axes, where the motion is the rotation of a body or load about an axis rather than translation along an axis. The technique can also be applied to motion that is a combination of both rotation and translation. FIG. 7 shows a compliance mechanism applied to a body 100 which rotates about a vertical axis 102. This is the same as swing motion in a test head manipulator. The compliance mechanism in FIG. 7 also shows an alternative embodiment to the mechanism in FIG. 5(*a*). In particular, the mechanism in FIG. 5(*a*) has the actuator shaft 514 or screw attached to a rod(compliance shaft 520) and the movable body (plate 500) attached to a lock 118 which operates on the rod (compliance shaft 520). In FIG. 7 the arrangement of the lock 118 and the rod (force rod 112) are reversed; that is, the actuator shaft or screw 514 is coupled to a lock 118 that operates on a force rod 112 that is in turn coupled to the movable body 100. It can be seen that the operation of FIG. 7 is entirely analogous to that of FIG. 5(*a*). The features included in FIG. 7 will be discussed below in greater detail.

The embodiments of FIGS. 5(*a*) through 5(*c*) have addressed exemplary embodiments which illustrate compliance for motion axes in the horizontal plane or other situations where there are no imbalance forces of any significance. FIGS. 6(*a*) and 8(*a*) illustrate mechanisms for providing both a counter-balancing force, to offset an imbalance force, and compliance in a driven axis where imbalance forces can be significant, variable with position, and often unpredictable. These mechanisms are referred to as "balanced-compliant actuator assemblies" ("BCAA").

In FIGS. 6(*a*) and 8(*a*) body 100 is representative a heavy load(i.e. a test head) that is rotatable about a pivot axis 102 that is located close to one surface and a significant distance away from said body's center of gravity. Body 600 in FIGS. 6(*a*) and 8(*a*) is representative of a portion of a holding structure that supports the pivot axis 102. For example, body 100 could represent a test head having its pitch or tumble axis located close to the dut interface, and body 600 could represent a portion of a test head holding cradle, which is in turn supported by apparatus connected to the main arm of a test head manipulator(not shown). In the following discussion, it is assumed that the pivot axis 102 is in a horizontal plane unless otherwise stated. Notice that if body 100 is rotated such that its center of gravity is not directly beneath the pivot axis 102; the moment due to the weight of body 100 creates an imbalance that is a function of body 100's position. Thus, compliance forces include forces necessary to overcome this moment as well as friction and other possible effects such as cable forces.

The mechanisms shown in FIGS. 6(*a*) and 8(*a*) and which are to be described include concepts that are explained in U.S. Provisional Patent Application Ser. No. 60/234,598 entitled A Test Head Balancing System for a Test Head Manipulator, due to Ny et al. and assigned to the same assignee as the present application. Specifically, FIGS. 1(*a*), 1(*c*), 2(*a*), 3(*a*), 4(*a*) and 4(*b*) are explained in provisional application 60/234,598.

Although not shown, it is implicit in FIGS. 6(*a*) and 8(*a*), that there is a system controller. The system controller implements control sequences and provides control signals to actuators and valves, which are to be described. In addition the system controller receives operator inputs and feedback signals from sensors, which are also to be described.

In overview, FIGS. 6(*a*) and 8(*a*) both include a linear actuator 508 for driving body 100 about a pivot axis 102, a compliance mechanism including a lock 118, force rod 112, and two compliance stops 522 and 524 to allow compliant motion of body 100, a force sensor 120 to measure an imbalance force exerted in the force rod 112, and a dual-action pneumatic cylinder 128 for generating a counterbalance force to offset the imbalance force.

FIGS. 6(*a*) and 8(*a*) are quite similar. They only differ in how the body of the dual-action pneumatic cylinder 128 is supported. Accordingly, the common features of both figures are described together in the following; and the differences described individually as appropriate.

In both FIGS. 6(*a*) and 8(*a*), the stationary element 506 of a linear actuator 508, including its motor 510, is attached to body 600 by means of a bearing 620. The driven element of the linear actuator 508 is an actuator screw 514, which extends from or retracts into the stationary element 506 when the motor 510 is energized. In particular, if the motor 510 is energized so as to turn in a first rotational direction, the screw(actuator) extends from the stationary element 506; and if the motor 510 is energized to turn in the opposite direction, the actuator 514 retracts into the stationary element 506. The actuator screw 514 is typically a ball screw; however, other types of screws or other actuator means could be used where appropriate.

A force rod 112 is attached to body 100 by means of a bearing 116*a*. As is shown, the force rod 112 is engaged by a lock 118 that is rigidly attached to the distal end of the actuator screw 514 by means of a machine screw or other appropriate means. The lock 118 may be of one of several types that are well known in the art. Depending on the type of lock selected, it could be controlled by an electrical signal, a pneumatic input, or other means appropriate to a particular application. When the lock 118 is activated, it grasps the force rod 112 securely, and the force rod 112 is then effectively attached to the actuator screw 514 in a rigid manner. Thus, when the lock 118 is engaged, body 100 is restrained from moving relative to the actuator screw 514. When the lock 118 is deactivated, the force rod 112 can slide in the lock 118 and move along a line that is essentially parallel to the axis of the actuator screw 514. Thus, momentarily disregarding the pneumatic cylinder 128 and any imbalance forces, with the lock 118 activated, the linear actuator 508 can be used to rotate body 100 about the pivot axis 102 relative to body 600. In addition, when the lock 118 is not locked, body 100 is free to move in reaction to sufficient external forces relative to the actuator screw 514 and body 600; and consequently, compliant motion of body 100 relative to body 600 is achieved. That is, with the lock 118 deactivated, compliant motion, in response to external forces, of body 100 about its pivot axis 102 and relative to body 600 is enabled. In order to limit the amount of compliant motion, an extended compliance stop 522 and a retracted compliance stop 524 are rigidly attached to the force rod 112. The extended compliance stop 522 is located between the lock 118 and body 100. The retracted compliance stop 524 is located on the opposite side of the lock 118, between the lock 118 and the distal end of the force rod 112.

A bidirectional force sensor 120 is coupled to the force rod 112 in a manner to measure the force along the force rod 112. The force sensor 120 may be implemented using a bidirectional load cell, a device that is readily available. The load cell incorporates a strain gauge that can be placed in a bridge circuit in a well-known way to provide an electrical signal output that varies monotonically with the measured force. By using analog to digital conversion and a processor, it can be determined whether the force along the force rod 112 is greater than a maximum amount tolerable for free motion; and, if so, the direction of the force. Alternatively, analog comparator circuits could be used in known ways to produce go/nogo signals indicating the presence and direction of significant force imbalance.

The aforementioned compliance stops 522 and 524 serve to limit the travel of the force rod 112 relative to body 600 with the linear actuator 508 at a fixed extension. If the shaft lock 118 is not engaged, the force rod 112 may be moved by external forces acting on body 100 over a travel range defined by the distance "C" between the two compliance stops 522 and 524 minus the width "L" of the shaft lock 118, and this defines a compliant range of motion for body 100. That is, with the shaft lock 118 disengaged (and the linear actuator motor 510 preferably turned off), body 100 may be rotated by external forces, sufficient to overcome the compliance forces, about the pivot axis 102 through an angle defined by the corresponding motion of the force rod 112 through a distance C-L. In either FIG. 6(*a*) or 8(*a*), as the lock 118 moves relative to the force rod 112, the piston 130 in the pneumatic cylinder 128 will also move. It is important that the total available stroke of the piston 130 be such that the piston 130 and pneumatic cylinder 128 do not interfere with the compliance stops 522 and 524.

It is observed that should the lock 118 be unlocked and body 100 rotated to an angle such that its center of gravity is not directly below the pivot axis 102 that one or the other of the two compliance stops 522 and 524 would bear against the lock 118. This is the case if the moment about the pivot axis 102 caused by the weight of body 100 is sufficient to overcome the static friction in the system, forces acting on body 100 due to the pneumatic cylinder 128 and piston 130, and any other forces acting on the system. In such a condition, it is obvious that energizing the actuator motor 510 will cause body 100 to rotate about the pivot axis 102. This is not necessarily a preferred mode of operation; rather, it is a situation to be kept in mind when considering various operation sequences for exemplary embodiments of the invention.

In operation, it is desirable that the lock 118 be moved to and locked at a position within a small neighborhood of some preselected point within its range of motion with respect to the force rod 112. Typically, this point is midway between the two compliance stops 522 and 524; however, there may be applications where it would be desirable to locate this point closer to one or the other of the two compliance stops 522 or 524. We will refer to this neighborhood as the "compliance-neutral region." The compliance-neutral region is normally a small portion of the total compliant range: for example, .+−.3 or .+−.4 mm within a 40 to 50 mm total compliant range.

Still referring to FIGS. 6(*a*) and 8(*a*), when the lock 118 is located between the compliance neutral region and the extended compliance stop 522, it is said to be in the "compliance-extended region." Similarly, when the lock 118 is located between the compliance neutral region on the retracted compliance stop 524, it is said to be in the "compliance-retracted region."

It may be necessary for body 100 to be in a balanced state in order for the lock 118 to be unlocked and then moved to the compliance neutral position. This balance can be achieved in a number of possible ways, including, for example: allowing the center of gravity to become located beneath the pivot axis 102 and/or applying external forces. As will be explained, however, the purpose of the pneumatic cylinder 128 and piston 130 is to provide a controllable source of counterbalancing force.

A position sensor 612 is provided to sense the position of the force rod 112 relative to the lock 118. The position sensor 612 may be any one of a number of known types ranging from precision encoders, potentiometers, etc. to combinations of limit switches, proximity sensors, range finders, etc. As a minimum capability, the position sensor 612 should indicate which of the three regions that the mechanism is presently in: compliance-extended, compliance-neutral, or compliance-retracted.

A dual-action pneumatic cylinder 128 is provided to generate a force to counteract any imbalance forces. The goal is to minimize the net force and/or torque acting on body 100 to an acceptable level to allow compliant motion of body 100 relative to body 600. Body 100 may be said to be in a "balanced state" when this is achieved. Note that when in a balanced state, there may be a "residual imbalance force," which becomes a component of the total compliance force. In FIG. 6(*a*), the dual-action pneumatic cylinder 128 is attached to body 600 with appropriate mounting hardware 624 and a bearing 622. In FIG. 8(*a*) the dual-action pneumatic cylinder 128 is attached to the lock 118 using a bracket. In both FIGS. 6(*a*) and 8(*a*), the pneumatic cylinder 128 contains a piston 130 that is coupled to a connecting rod 114 that is coaxial with the axis of the cylinder 128. The connecting rod 114 passes through the end of the pneumatic cylinder 128 and extends towards body 100, and it is coupled to body 100 by means of a bearing 116*b*. Although FIGS. 6(*a*) and 8(*a*) show the connecting rod 114 and force rod 112 attached to body 100 with two separate bearings 116*a* and 116*b*, alternative structures are possible, including the use of a bracket or the like to jointly couple both rods 114 and 112 to body 100 with bearings 116*a* and 116*b*, as in FIG. 8(*b*), which is otherwise the same as FIG. 8(*a*). FIG. 8(*b*) illustrates the lock 118 and the cylinder 128 being coupled together with a bracket 800, which effectively couples rods 114 and 112.

A high-pressure air supply 602 provides a source of air for operating the pneumatic cylinder 128. Typically, an air pressure of 80 to 100 pounds per square inch is appropriate and available in a semiconductor testing facility. The pneumatic cylinder 128 has two air inlets 132 and 134, one on either side of the piston 130 and generally near each end of the cylinder 128. The first air inlet 132 is coupled to a first accumulator 608*a* with tubing, and the second air inlet 134 is coupled to a second accumulator 608*b* with tubing. The first and second accumulators 608*a* and 608*b* are coupled to first and second valves 604*a* and 604*b* respectively with appropriate tubing, and both the first and second valves 604*a* and 604*b* are coupled with appropriate tubing to the air supply 602. The first and second valves 604*a* and 604*b* are controlled by the controller, which is not shown.

In addition, the two valves 604*a* and 604*b* each have a vent port for allowing air to escape the cylinder 128 and accumulators 608*a* and 608*b*. Each of the valves 604*a* and 604*b* can be placed in one of three positions as follows:

"Inject position" allows air to flow from the air supply 602 into the accumulator 608*a* or 608*b* and cylinder 128.

"Vent position" allows air to flow out of the accumulator 608*a* or 608*b* and cylinder 128 through the vent into the atmosphere.

"Off position" blocks air from flowing into or out of the accumulator 608*a* or 608*b* and cylinder 128 through the valve 604*a* or 604*b*.

Many different configurations of valves(604*a* and 604*b*) are commercially available. For example, in addition to single independent valves (604*a* and 604*b*) as shown, there are units containing two valves configured such that if one valve is in the inject position the other is in the vent position, so that air is automatically vented from one side of the piston 130 as air is injected on the opposite side.

As indicated above, the purpose of the pneumatic cylinder 128 is to generate a force to offset an imbalance force acting on the load, which in this instance is body 100. Suppose for example that body 100 is pivoted at an angle such that its center of gravity is horizontally offset from the pivot axis 102. Then the weight of body 100 is an imbalance force that creates a torque about the pivot axis 102 that acts in a direction to move the center of gravity to a point directly beneath the pivot axis 102. The magnitude and direction of this torque are a function of the weight as well as the magnitude and direction of the pivot angle, where the pivot angle is the arcsine of the ratio of the horizontal displacement of the center of gravity from the pivot axis 102 divided by the shortest distance from the center of gravity to the pivot axis 102. The imbalance is seen to be variable and a function of the position of the load. The pneumatic cylinder 128 generates a force on its piston 130 according to the difference in air pressure on the two sides of the piston 130. This force is transmitted along the connecting rod 114 and acts on body 100 in a location and direction determined by a line that is an extension of the axis of the connecting rod 114. The apparatus is arranged so that this line of force does not intersect the pivot axis 102 throughout a range of pivot angles of interest. Therefore, the piston 130 can create a torque on body 100 about the pivot axis 102 that is equal and opposite to the imbalance torque caused by the weight of body 100, and body 100 will thereby achieve a balanced state. The force generated by the pneumatic apparatus is herein referred to as a "counterbalance force."

In operation, the valves 604a and 604b are normally in the off position. To increase pressure on one side of the piston 130, the corresponding valve (604a or 604b) is switched to the inject position. The change in pressure achieved is a function of the present pressure in the cylinder 128, the pressure in the air supply, and the length of time that the valve (604a or 604b) is operated. To decrease pressure on a given side of the piston 130 the corresponding valve (604a or 604b) is switched to the vent position. Here the change in pressure achieved is a function only of the present pressure in the cylinder 128 and the length of time that the valve (604a or 604b) is operated. Thus, the minimum length of time that a valve (604a or 604b) can be operated determines the minimum increment of pressure in the cylinder 128 that can be achieved at a given initial cylinder pressure. Typically, this minimum time is 8 to 10 milliseconds. The minimum increment of counterbalance force that can be effected on the connecting rod 114 is determined by the product of the minimum increment in pressure and the area of the piston 130. With an appropriate selection of components and parameters, increments of counterbalance force of less than two pounds can be achieved, and this determines how closely imbalances can be neutralized.

If a counterbalance force is established by the pneumatic cylinder 128 and piston 130 with body 100 at a specific position relative to body 600, and if body 100 is now moved slightly relative to body 600, the piston 130 then moves within the cylinder 128 and the established counterbalance force will change as the volume of air on either side of the piston 130 changes. In particular, the pressure differential increases monotonically with piston 130 displacement similar to a mechanical spring. The pneumatic force exerted on a given side of the piston 130 varies inversely with the volume. However, for displacements where the change in air volume is relatively small, the equivalent spring force approximately varies linearly with displacement with an equivalent "spring constant," K. That is, F=K x, where F is the change in force and x is the change in piston 130 displacement. It is desirable to attempt to make K be small, so that the force does not appreciable change over the range of motion. K is determined in part by the total volume of air with respect to the change in pressure per increment of piston 130 displacement; that is by V and dP/dx, where V is volume, and P is pressure. As the piston 130 nears one end of its travel, V becomes small, dP/dx becomes large exponentially, and K therefore increases as does F. The addition of the accumulators 608a and 608b described above serves to significantly increase V and limit dV/dx and dP/dx to acceptable values. This provides a relatively low and constant value of K over the compliance range or what is known as a "soft spring" effect, which is clearly desirable.

Figure 6A:
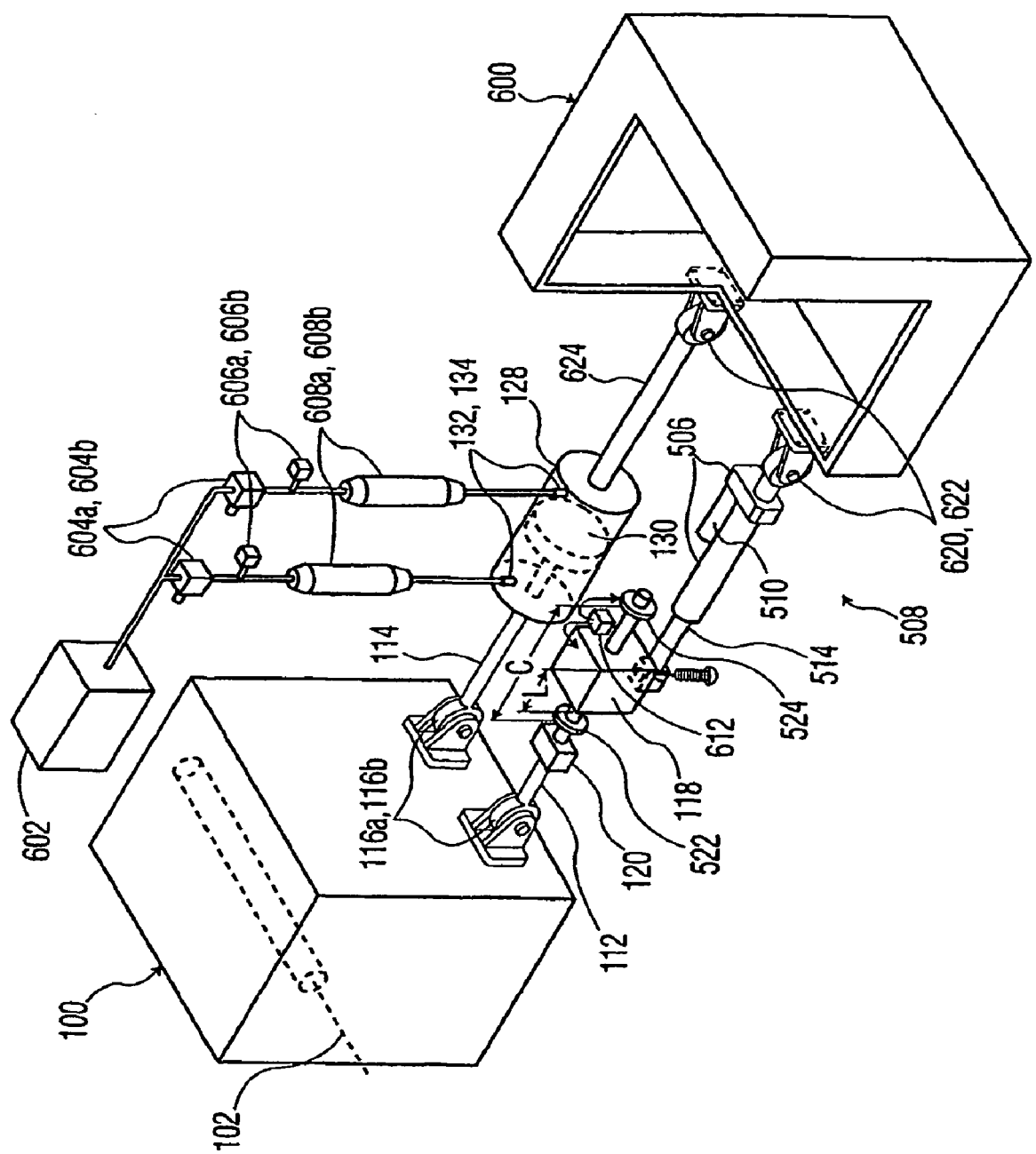
FIG. 6(a) is a perspective view of a compliant driving mechanism and a pneumatic balancing unit in accordance with an exemplary embodiment of the present invention.
Figure 8A:
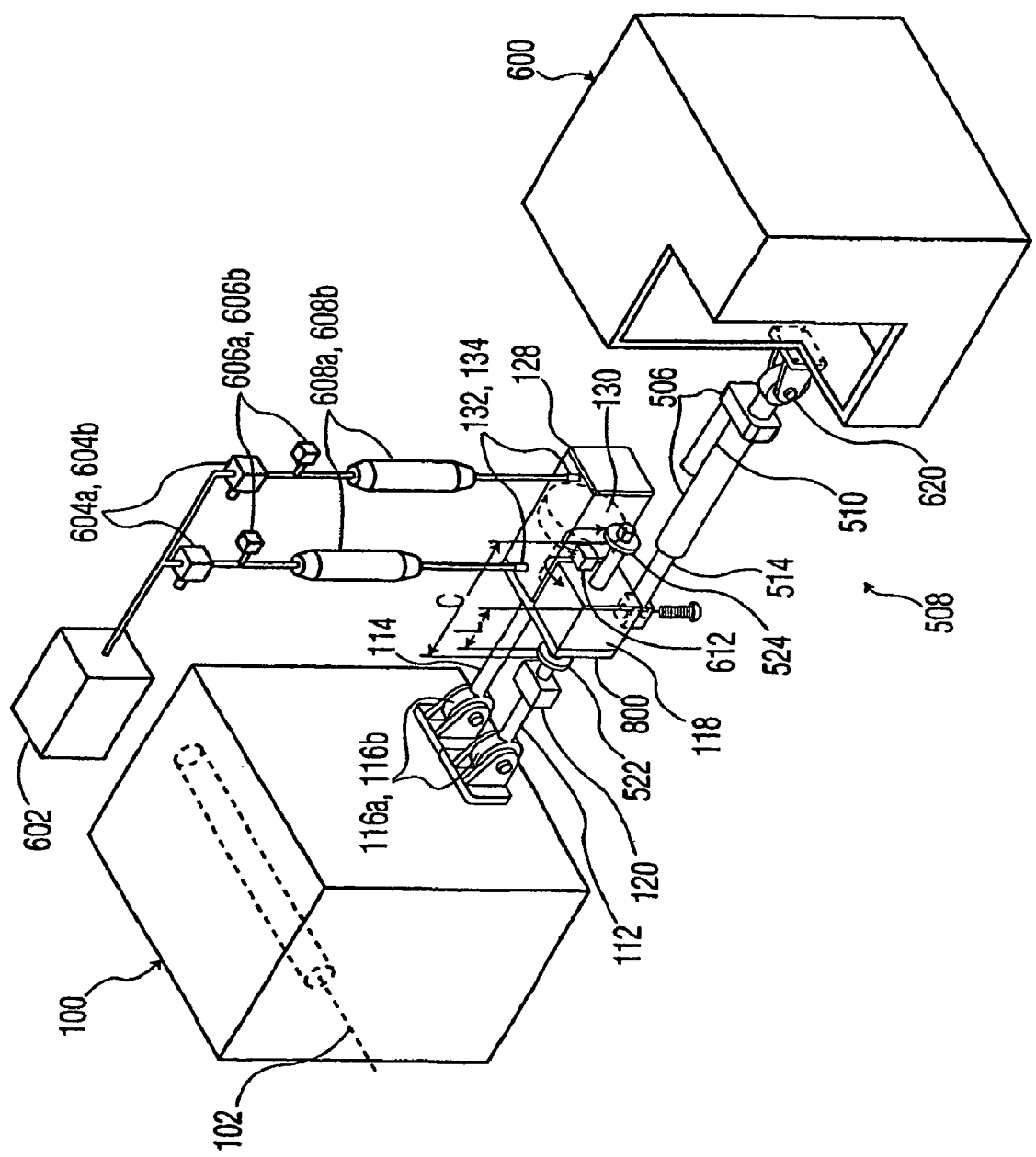
FIG. 8(a) is a perspective view of a compliant driving mechanism and a pneumatic balancing unit coupled together in accordance with an exemplary embodiment of the present invention.
Figure 8B:
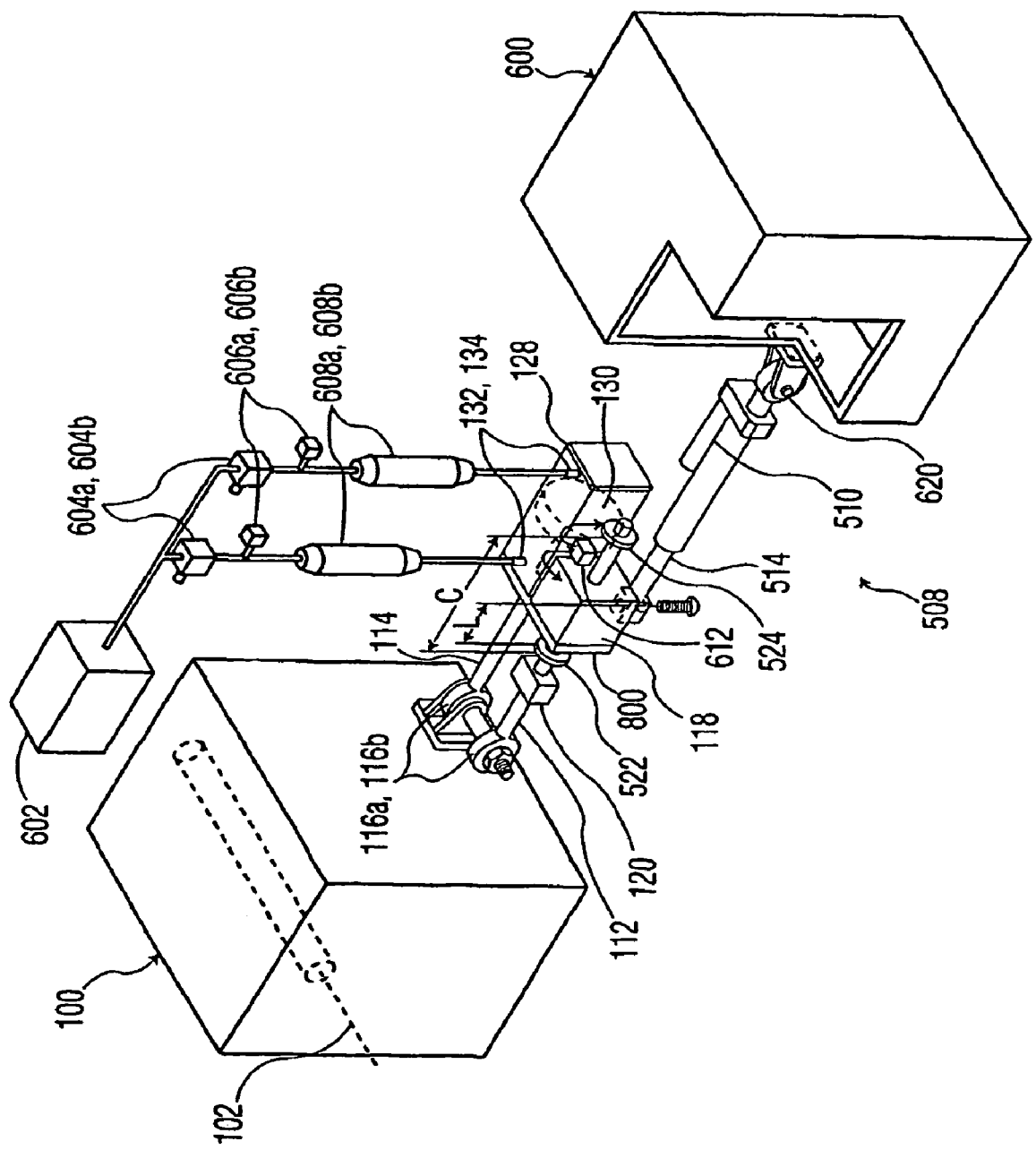
FIG. 8(b) is a perspective view of a compliant driving mechanism and a pneumatic balancing unit coupled together in accordance with another exemplary embodiment of the present invention.

Having briefly described the elements of the apparatus illustrated in FIGS. 6(a) and 8(a), further details and the operation of the system can now be addressed.

In order to achieve a balanced state, the lock 118 is first locked to prevent motion of body 100. The controller then responds to the signals derived from the force sensor 120 to operate the valves 604a and 604b in an appropriate manner to cause a counterbalance force to be applied to body 100. The controller adjusts the counterbalance force until it is of sufficient magnitude and direction to reduce the magnitude of the force in the force rod 112 to a magnitude that is less than a predetermined threshold, representing a maximum allowable imbalance force. Depending upon circumstances, this threshold value is typically less than five to ten pounds; and, if care is taken in the design of the system, it may be as low as one to two pounds. When this condition has been met, body 100 is considered to be in a "balanced state," and the difference between the original imbalance force and the counterbalance force generated by the piston 130 will be referred to as the "residual imbalance force."

Now suppose that body 100 is in such a balanced state and that the lock 118 is locked and positioned away from either of the two compliance stops 522 and 524. If the lock 118 is now unlocked, body 100 and the lock 118 do not move provided that any residual imbalance force is less than the static friction in the system, including the effects of the break-away force associated with the pneumatic cylinder 128 and piston 130. If this condition is reached, then body 100 is said to be "totally balanced." However, if the remaining imbalance force is sufficient to overcome all of the static friction, then body 100 is said to be "nearly balanced." If body 100 is nearly balanced and the lock 118 is released, the lock 118 will move towards one of the two compliance stops 522 or 524. Whether the lock 118 comes to rest against the compliance stop (522 or 524) would depend upon how both the imbalance force and the counterbalance force change as a function of change in position. It will be appreciated that achieving a totally balanced condition requires greater precision and, accordingly, a greater system cost, then achieving a nearly balanced condition The term "compliance ready" is now introduced to indicate the situation when body 100 is in a balanced state and the force rod 112 is in the compliance-neutral region. It is generally preferred that the balanced state be a totally balanced state, so that if the lock 118 is unlocked, then body 100 does not move.

In a general situation, it may be assumed that initially body 100 is not in a balanced state and in an arbitrary position relative to body 600. It is also assumed that it is desired to achieve a compliance-ready state. In this situation, the imbalance force is supported and measured by the force rod 112 and force sensor 120. If the lock 118 is in an unlocked state and if the imbalance force is appreciable, the force rod 112 will most likely be at one end or the other of its compliant range; and the imbalance force will be carried from the force rod 112 to the actuator screw 514 by way of the lock 118 bearing against the compliance stop (122 or 124). If the lock 118 is in a locked state, however, the imbalance force will be carried directly from the force rod 112 to the lock 118 and thence to the actuator screw 514.

There are several possible ways to achieve the desired compliance ready state. However, prior to any control actions, care should be taken to ensure that body 100 and other manipulator apparatus are not resting against any foreign objects or structures that would interfere with the forthcoming balancing and compliant range positioning operations. In some instances, it may be necessary to first move body 100 into some desirable position. In such a case, the lock 118 is first activated, if not already activated, and the linear actuator 508 is then utilized to produce the desired motion. Motion of other manipulator axes, if any, might also be necessary. Said motion might be achieved by manual means, which may include the use of push button commands to the controller to operate the linear actuator 508. Alternatively, the controller might be equipped with appropriate algorithms to allow it to utilize the linear actuator 508 combined with position feedback in an automatic positioning sequence. With body 100 in a desirable position, there are several possibilities to achieving a compliance ready condition. The design and choice of a particular method depends upon the particulars of the application at hand. Described below are two selected approaches with comments indicating the potential application of each. In both cases it is assumed that the lock 118 is not in a compliance neutral position.

Approach 1: This approach requires that the system be designed so that balancing always results in a totally balanced condition, as illustrated by the flowchart in FIG. 15(*b*). It comprises the following sequence of steps:

1. The lock 118 is locked, if it is not already locked, as illustrated in step 1510.
2. Body 100 is balanced according to the foregoing procedure, as illustrated in step 1511.
3. The lock 118 is unlocked, as illustrated in step 1512.
4. The linear actuator 508 is used to position the lock 118 to the compliance neutral position, as illustrated in step 1513.
5. The lock 118 is again locked, as illustrated in step 1514.
6. Body 100 is balanced again to accommodate any changes in imbalance that resulted from step 1513, as illustrated in step 1515.
7. Body 100 is now totally balanced and in a compliance ready state with the lock 118 locked, as illustrated in step 1516.

Observe that step 1513 requires two conditions be fulfilled to be successful. First, it is necessary that the balance achieved in step 1513 is a totally balanced condition so that body 100 remains stationary when the lock 118 is released. Second, it is necessary that the friction between the lock 118 and the force rod 112 is less than the static friction of the remainder of the system, including break-away force of the piston 130 in the pneumatic cylinder 128.

Approach 2: This approach does not require that the system be designed so that balancing always results in a totally balanced condition, as illustrated by the flowchart in FIG. 15(*c*). It works where the balancing is either totally balanced or nearly balanced. It comprises the following sequence of steps:

The lock 118 is unlocked, as illustrated in step 1520.

Based on feedback derived from the position sensor 612, the controller operates the valves 604*a* and 604*b* to manipulate the air pressure in the dual-action pneumatic cylinder 128 to cause motion of the piston 130 in the direction that it is desired to move the force rod 112 with respect to the lock 118, as illustrated in step 1521. This results in motion of the force rod 112 with respect to the lock 118 in the desired direction.

The motion in step 1521 is halted when a compliance neutral position is reached, as illustrated in step 1522. The lock 118 may be used as a brake to halt the motion.

The lock 118 is locked, as illustrated in step 1523.

Body 100 is balanced according to the foregoing procedure, as illustrated in step 1524.

Body 100 is now in a compliance ready state, but is not necessarily totally balanced, as illustrated in step 1525.

Notice in steps 1521 and 1522 that the piston 130 is the prime mover. In view of system static friction including in particular the break-away force of the piston 130 a control algorithm to position the force rod 112 with respect to the lock 118 could be difficult to realize. (Note that in approach 1, the linear actuator 508 is the controlled prime mover, and it would typically provide ample force to overcome the system stiction.) This is particularly true if one attempts to cause body 100 to come to a stop in the desired position before applying the lock 118. However, a suitable lock 118 may also be used as a brake, and motion can be forced to stop by applying the lock 118 as body 100 moves into the desired compliance-neutral position.

In a test-head manipulator system one of two possible actions is likely after achieving a compliant ready position. The first possibility is that the test head 100 is ready to be docked. In this case, it may be moved slightly so that the docking actuators and the docking guide mechanisms(not shown in FIGS. 6(*a*) and 8(*a*)) become initially engaged. Docking apparatus is typically designed so that in such a position, the delicate electrical contacts are not yet engaged and are not at risk of being damaged. This small amount of movement is typically insufficient to disturb the compliant ready position. If the lock 118 is locked, it can now be released. If there is a slight residual imbalance force sufficient to cause motion, the motion only results in contact being made between mating guide components of the docking apparatus. Body 100 is now able to move compliantly, and the docking actuators may now be engaged to draw the test head 100 into a fully docked position.

The second possibility is that the test head 100 is moved with the manipulator apparatus (not shown in FIGS. 6(*a*) and 8(*a*)) from the present location to a new location. In this case, the lock 118 would preferably be locked to maintain the compliance-neutral position, and the linear actuator 508 can be used as desired to move body 100 to the desired second position. It is noted that as body 100 is so moved, the imbalance forces acting on it will probably change. Accordingly, when body 100 arrives at said second position, it should again be balanced. Once balanced, body 100 is in a compliance-ready state, because it has remained locked in the compliance-neutral position. If desired, the lock 118 may then be released, and body 100 may be moved compliantly about the pivot axis 102.

Ideally, the process of achieving a compliance-ready state would only have to be performed once and not repeated until some change has been made to the system, including for example the position of body 100 relative to body 600. However, the pneumatic cylinder system is subject to leaking air and a corresponding loss of pressure, and the procedures needed to achieve a balanced or compliance ready condition should be repeated periodically as need be. In an exemplary embodiment, the system retains sufficient air for upwards of approximately ten minutes before the needed procedure needs repeating. In a typical operation the cycle could be automatically repeated every few (say 5 to 8) minutes. Another consideration arising from the leakage of air and loss of air pressure differential is that the counterbalancing force will be lost when the test head is docked for a long time. This would happen, for example, when conducting tests for many consecutive minutes or hours. While docked, the test head is held securely by the docking mechanism, and the counterbalance force cannot be reestablished by the foregoing methods. Accordingly, for undocking, the lock 118 must first be locked so that body 100 is held rigidly with respect to the actuator screw 514. Then, undocking motion, which is driven by the dock actuating mechanisms, should be such that relative movement between bodies 600 and 100 is not required. As an alternative, the system could be equipped with optional pressure sensors (606*a*, 606*b*), and the cylinder 128 pressures could be recorded just as docking commences. Then just prior to undocking, the cylinder 128 pressures could be restored, which would restore the appropriate counterbalance force. This would allow the lock 118 to be unlocked and body 100 to move compliantly while undocking.

Figure 6B:
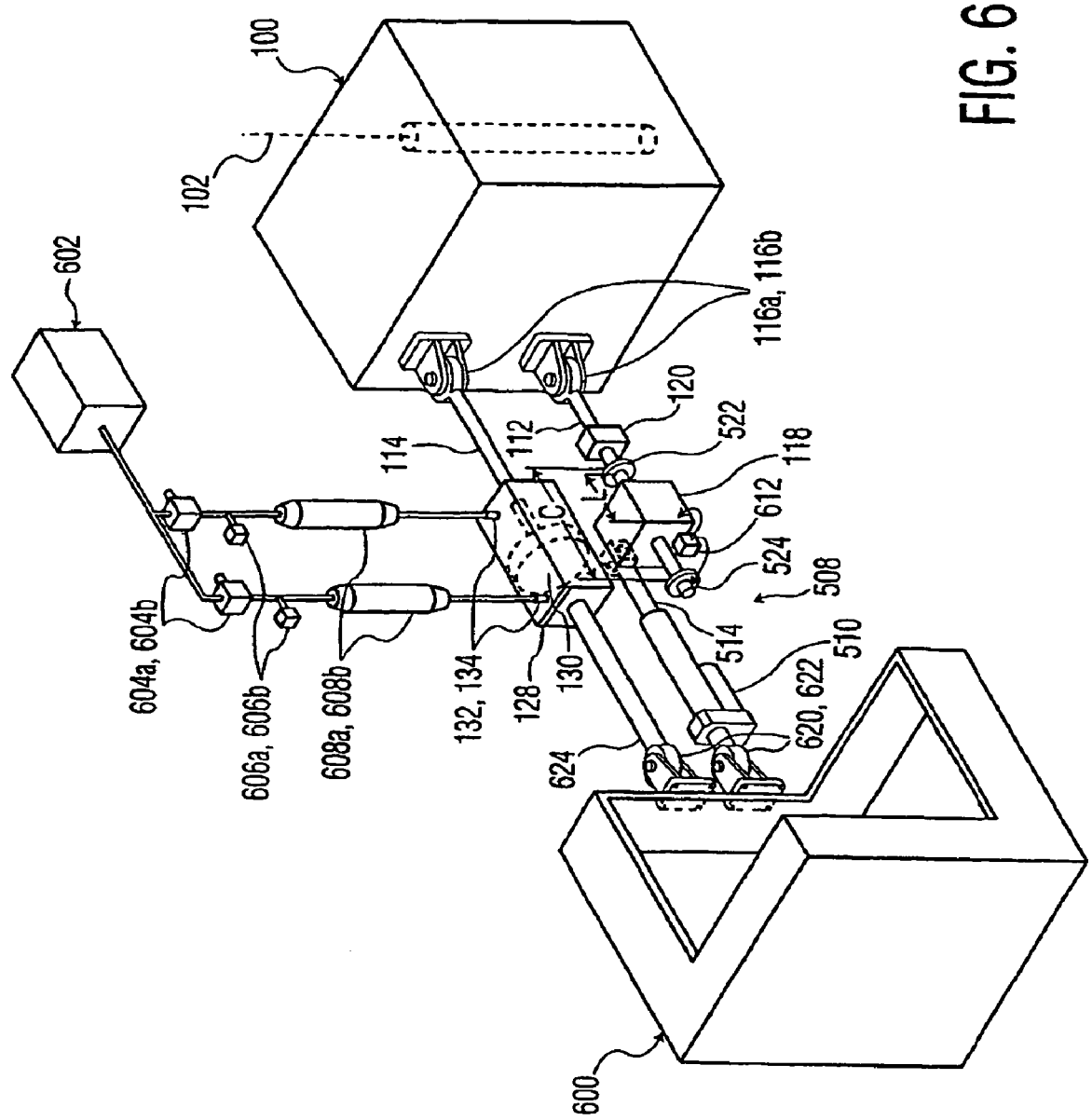
FIG. 6(b) is a perspective view of a compliant driving mechanism and a pneumatic balancing unit in accordance with another exemplary embodiment of the present invention.

Up to this point, the discussion has assumed that the pivot axis 102 has been located in a horizontal plane, and this has been sufficient to illustrate the principles of the invention. However, it is possible that other orientations of the pivot axis 102 are possible. A particular configuration of interest would be the case of a vertical pivot axis in which body 100 would be representative of a support structure for a manipulator column which in turn supports the test head. In this case the pivot axis 102 corresponds to the swing axis of the manipulator. An imbalance force may be present in such an axis due to forces generated by the bending of the test head cable. In comparison to the previously described imbalance force due to gravity, which is not present in this case, the imbalance due to the cable will vary in a generally unpredictable manner. Nonetheless, it is clear that the mechanism of either FIG. 6(a) or 8(a) could be used to effectively provide a driven swing axis having compliance and counterbalancing of the cable force. For example, FIG. 6(b) shows a 13CM of the type shown in FIG. 6(a) applied to an axis 102 where the axis of rotation is vertical, i.e., swing axis. It is also observed that if the cable force is small and negligible, then a simplified form of the mechanism without the dual-action pneumatic cylinder 128 as shown in FIG. 6(a) and associated apparatus could be effectively used. Thus, FIG. 7 shows an application to a swing axis 102 that does not require any counter force. FIG. 7 differs from FIG. 6(a) in that the force sensor 120 and pneumatic cylinder 128 counterforce apparatus are removed. FIG. 7 is similar to the compliance mechanism of FIG. 5(a), with the exception that in FIG. 7 the actuator shaft 514 is directly coupled to the lock 118 rather than to a rod such as rod 520.

As described, the BCAAs of FIGS. 6(a) and 8(a) are quite similar. The choice between which of the two configurations to use is typically based upon the details of the physical arrangement of the application. For example, FIG. 8(a) would be appropriate where the required range of motion in the axis 102 and, accordingly, the linear actuator 508 is much greater than the required range of compliant motion. This is because in FIG. 8(a), the stroke of the piston 130 within the cylinder 128 needs only to be enough to accommodate the compliant motion; whereas, the stroke of the piston 130 in FIG. 6(a) must accommodate the entire range of motion in the axis 102. Consequently, a smaller and less expensive pneumatic cylinder 128 and piston 130 assembly could be utilized in FIG. 8(a). An example where FIG. 6(a) would be preferable would be a situation having space limitations that would preclude placing all of the components of the BCM close together. In particular, in FIG. 6(a), the pneumatic cylinder 128 and piston 130 subassembly may be located apart from the subassembly comprising the actuator 508, lock 118, force rod 112, and associated components and sensors.

Figure 9A:
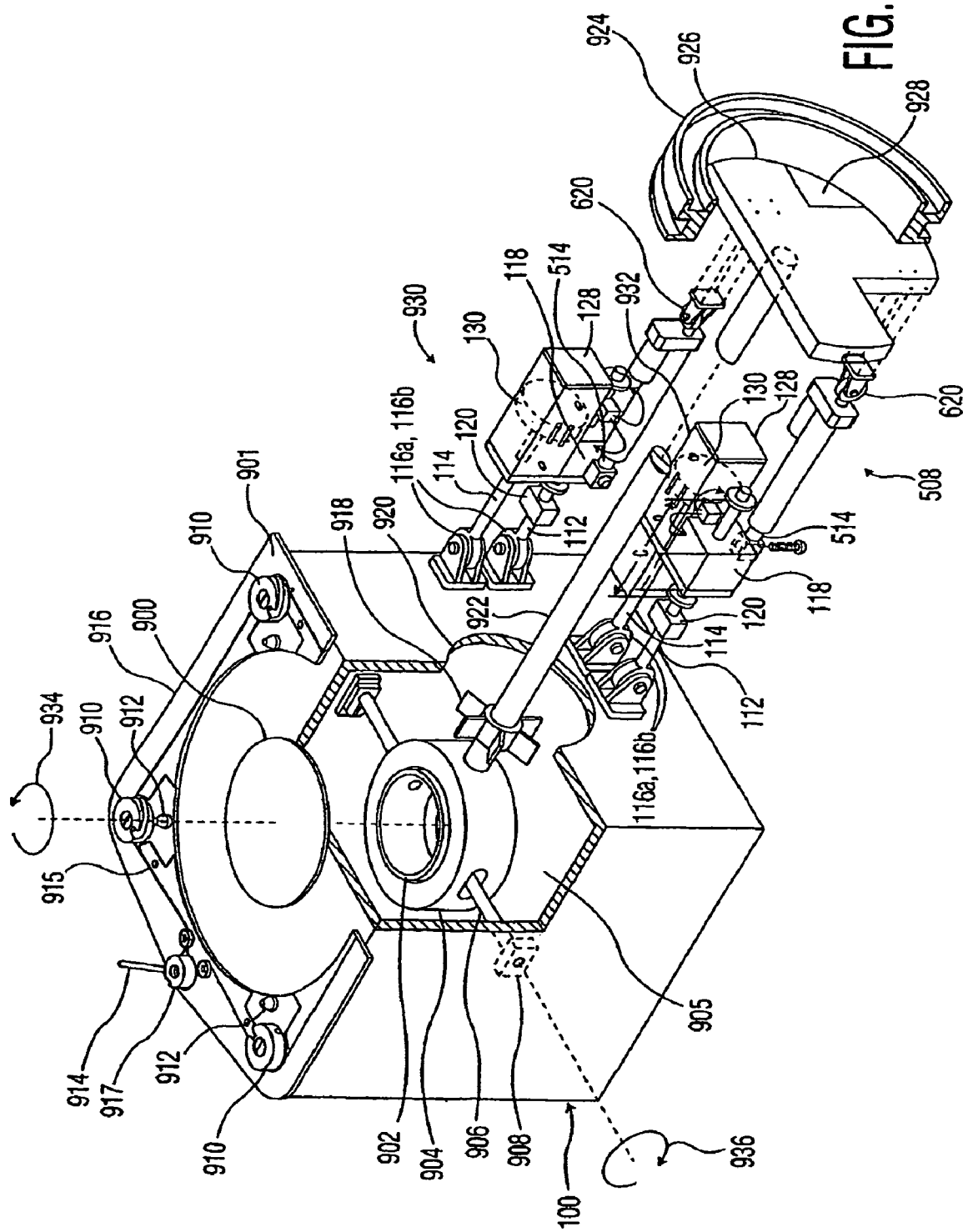
FIG. 9(a) is a perspective view of a first compliant driving mechanism coupled to a pneumatic balancing unit applied to a first rotational axis, and a second compliant driving mechanism coupled to a pneumatic balancing unit applied to a second rotational axis, in accordance with an exemplary embodiment of the present invention.

FIG. 9(a) shows an example of a typical application of two of the balanced-compliant actuator assembly (BCAA) mechanisms of FIG. 8(a) used in a typical manipulator system application. In FIG. 9(a), one mechanism effects the yaw axis 934 of a test head 100 and the second mechanism effects the pitch axis 936 of the same test head 100. A single control system, which is not shown for simplicity reasons, is provided to effect the required control over the two BCMs as well as the entire manipulator system.

The test head 100 is shown in FIG. 9(a) with the test interface on the top surface 901. The DUT board 900 provides interface circuits and connection apparatus necessary to properly interface the device under test to the test head pin electronics (not shown), located inside the test head 100.

Also shown in cut away is a portion of docking assembly 916 including three of four docking cams 910, three of four guide pins 912, cable 915, cable driver 917, and docking handle 914. In overview, to dock test head 100 with a test apparatus, such as a device handler (not shown), wafer prober, or the like, the test head 100 is first manipulated so that the guide pins 912 are partially inserted in mating guide holes (not shown) on a mating docking assemble (not shown) that is attached to the test apparatus. At this point, the docking cams 910 engage mating cam followers (not shown) on the mating docking assembly (not shown). External force may now be applied to rotate the docking handle 914 to rotate cable driver 917. As cable driver 917 rotates, its motion is transferred to rotate in synchronism the docking cams 910 by way of the cable 915, and this draws the test head 100 into its final docked position. While the docking handle 914, cable driver 917 and docking cams 910 are drawing test head 100 into position, the test head 100 is desirably able to move compliantly in preferably all six degrees of freedom. This dock is shown in more detail in FIGS. 12(a) through 12(d), which are discussed later. Also, this dock is an expanded realization of the dock described in U.S. Pat. No. 4,489,815 due to Smith, which is herein incorporated by reference, and which uses two guide pins 912 and cams 910. Still other docks of this type use three guide pins 912 and cams 910. Further information may be found in the inTEST Handbook.

The test head 100 is mounted to a typical cable pivot ring 924 of a test head manipulator (not shown) as described, for example in U.S. Pat. Nos. 5,030,869 and 5,450,766, due to Holt and in the inTEST Handbook. FIG. 9(a) shows a test head mount 926 attached to the cable pivot ring 924, and a first end of a test head support beam 922 is attached to said test head mount 926. The axis of the test head support beam 922 is orthogonal to the plane of the cable pivot ring 924, and an extension of the axis passes through the center of the cable pivot ring 924. The test head support beam 922 extends through a hole 920 in the rear of the test head 100 and is rigidly attached to the outer ring 904 of a circular bearing assembly 905. An inner ring 902 is arranged inside and is supported by the outer ring 904 of the circular bearing assembly 905. The inner and outer rings, 902 and 904 respectively, are circular, coplanar, and concentric. The yaw axis 934 is perpendicular to the plane of the two rings 902 and 904 and passes through their common center. The inner ring 902 rotates inside the outer ring 904 about the yaw axis 934. Two attachment shafts 906 pass through slots in the outer ring 904 and couple the inner ring 902 to bearing blocks 908 that are fixed to the two sides of the test head 100 that are shown in vertical planes that are parallel to test head support beam 922. The bearing blocks 908 enable the test head 100 to pivot about the pitch axis 936, which is defined by the attachment shafts 906.

Six cam followers (not shown) are utilized as support devices to bear the load imposed by the inner ring 902 on the outer ring 904 while enabling low friction yaw motion. Three of the cam followers (not shown) are disposed at 120-degree intervals about the inner circumference of the outer ring 904 to bear the radial load that is in a direction perpendicular to the yaw axis 934. The other three cam followers (not shown) are also arranged on the interior of the outer ring 904, equally-spaced between the first three, in a manner to support an axial load that is parallel to the yaw axis 934.

In summary, the cable pivot ring 924 supports the test head mount 926. The test head mount 926 supports the test head support beam 922, which defines the roll axis. The test head support beam 922 supports the outer ring 904, which in turn supports an inner ring 902. The inner ring 902 provides a yaw axis 934 and supports attachment shafts 906. The attachment shafts 906 support the test head 100 and provide a pitch axis 936. This arrangement allows the test head 100 to rotate .+−.5 degrees about a pitch axis 936 (shown as horizontal) and .+−.5 degrees about a yaw axis 934 (shown as vertical), where the yaw and pitch axes are orthogonal to one another and mutually orthogonal to the test head support beam 922. The range of pitch and yaw motion is restricted to .+−.5 degrees respectively by physical constraints and mechanical stops built into the system, which, for simplicity reasons, are not shown in FIG. 9(a). In addition, position sensors(not shown) may be included in known ways to indicate the relative position of the test head 100 with respect to the pitch 936 and yaw 934 axes and to provide this information to the control system.

The cable pivot ring 924 provides typically .+−.95 degrees of roll rotation of the test head 100 about the axis defined by the support beam 922. In FIG. 9(a), where the test interface surface is facing upwards, the test head 100 is shown at an approximate .+−.90 degree position. The elements of the test head cable pass through the cable pivot ring 924 and openings 928 in the test head mount 926, are arranged along the test head support beam 922, and enter the test head 100 through the support shaft opening 920. A web 918 attached to the support beam 922 provides support and strain relief for the cable elements before they fan out to the various electronic elements(not shown) inside the test head 100.

It is advantageous if balanced-compliant motion can be provided without the necessity of having all rotation axes pass through the center of gravity. In FIG. 9(a), the two balanced-compliant actuator assemblies 930 and 932, which are of the same type as shown in FIG. 8(a) and previously described, are used to eliminate the requirement that the pitch 936 and yaw 934 axes pass through the center of gravity for balanced-compliant motion.

The two BCAAs 930 and 932 are arranged so that their force rods 112 and connecting rods 114 are generally parallel with the roll axis as defined by the test-head support beam 922. The yaw BCAA 930 is oriented such that a force acting along either the force rod 112 or the connecting rod 114 would create a non-zero moment about the yaw axis 934. Similarly, the pitch BCAA 932 is oriented such that a force acting along either the force rod 112 or the connecting rod 114 would create a non-zero moment about the pitch axis 936. The stationary elements 506 of the linear actuators 508 of the two BCAAs 930 and 932 are appropriately attached to the test-head mount 926 with bearings 620.

Figure 9B:
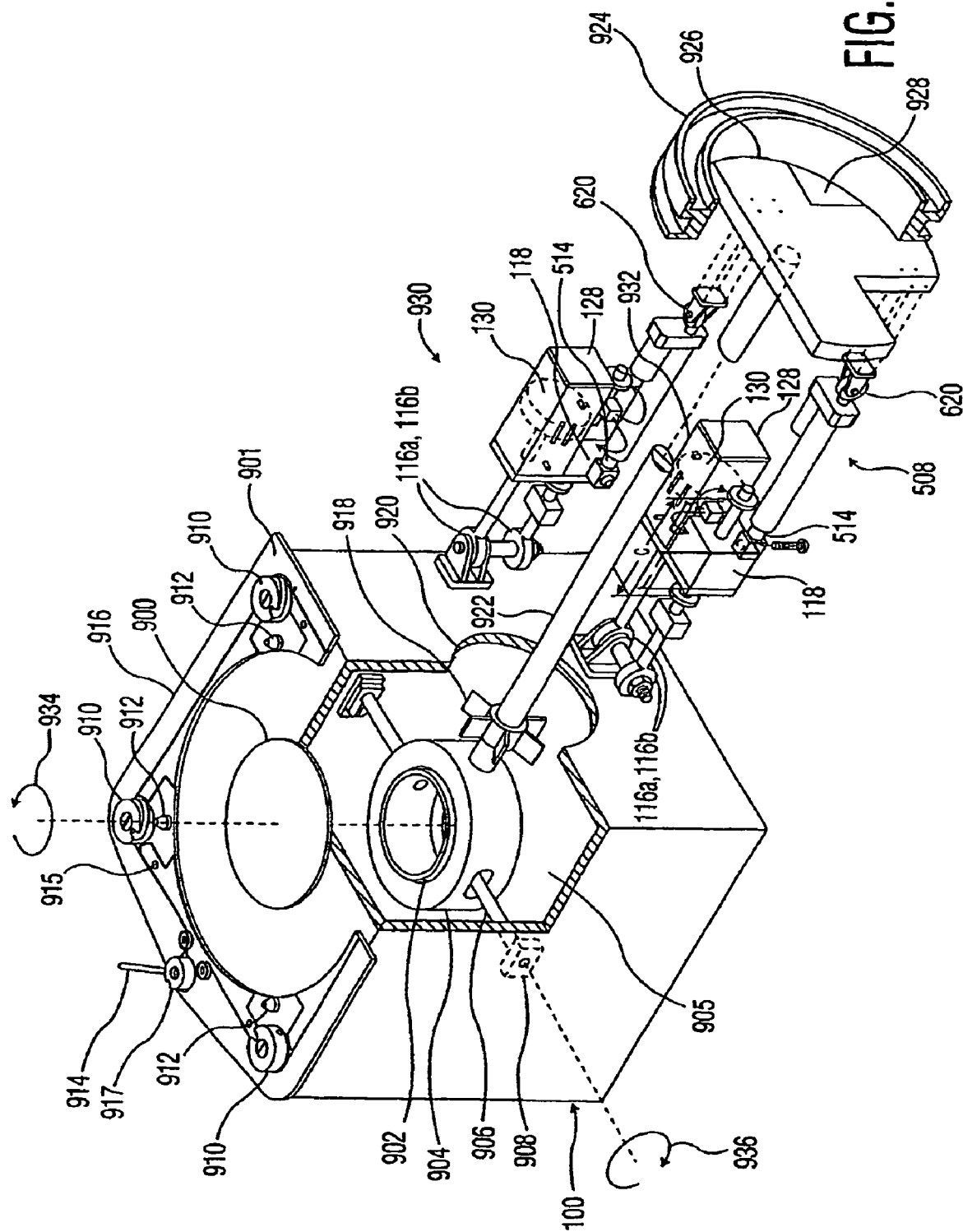
FIG. 9(b) is a perspective view of a first compliant driving mechanism coupled to a pneumatic balancing unit applied to a first rotational axis, and a second compliant driving mechanism coupled to a pneumatic balancing unit applied to a second rotational axis, in accordance with another exemplary embodiment of the present invention.

It is important that the two BCAAs 930 and 932 be able to operate with a minimum of interaction with one another. Thus, it is preferred to locate the yaw BCAA 930 such that its force rod 112 and connecting rod 114 act along lines that approximately intersect the pitch axis 936. Similarly, it is also preferred to locate the pitch BCAA 932 such that its force rod 112 and connecting rod 114 act along lines that approximately intersect the yaw axis 934. However, as shown in FIG. 9(a), both force rods 112 and both connecting rods 114 are individually attached to the test head 100, each with a bearing 116a and 116b, respectively. Thus, it is not possible to have both the extended axis of the force rod 112 and the extended axis of the connecting rod 114 of the yaw BCAA 930 intersect the pitch axis 936. In practice, the two rods 112 and 114 are typically located close together and such that a line that is parallel with and approximately halfway between the two rods 112 and 114 intersect the pitch axis 936. Similarly, it is not possible to have both the extended axis of the force rod 112 and the extended axis of the connecting rod 114 of the pitch BCAA 932 intersect the yaw axis 934. In practice, the two rods 112 and 114 are typically located close together and such that a line that is parallel with and approximately halfway between the two rods 112 and 114 intersect the pitch axis 936. In an alternate construction of a BCAA, explained previously by reference to FIGS. 8(a) and 8(b), the test head 100 ends of the force rod 112 and the connecting rod 114 can be joined together with an appropriate bracket 800. Further, the brackets 116a and 116b that are coupled to the test head 100 can be joined, as previously explained by reference to FIG. 8(b), such that only bearing 116b need be connected to test head 100. In this case, the bearing 116b can be located on a line that intersects the axis in question and that is parallel to both the force rod 112 and the connecting rod 114. FIG. 9(b) shows a system configured with such a single bearing 116b. FIG. 9(b) is otherwise identical to FIG. 9(a).

The operation of the system shown in FIGS. 9(a) and 9(b) can now be described. In a general situation, it may be assumed that initially the test head 100 is in an unbalanced state and in an arbitrary position with the locks 118 of the two BCAAs 930 and 932 unlocked. In a worst case scenario, the test head 100 is resting against physical constraints and mechanical stops built into the system. That is to say, that there is a significant imbalance force maintaining the test head 100 in a position that is at its motion limits in the pitch 936 and yaw 934 axes and that the imbalance force is not fully supported by any of the components of the two BCAAs 930 and 932. A first goal is to place the test head 100 in a compliant ready state (i.e., in a balanced condition and in the compliance neutral position) with respect to both the yaw 934 and pitch 936 axes. The lock 118 of each of the two BCMs 930 and 932 is locked. The actuators 508 are then used to position the test head 100 to a desirable first location that is away from the physical constraints and mechanical stops built into the system and where the imbalance force is fully supported by the locks 118 and linear actuators 508 of either or both of the two BCMs 930 and 932. Also, this desirable position should be such that the test head 100 can be moved sufficiently through its compliant range to allow a compliant ready state to be achieved without interference from any of the physical constraints and mechanical stops that may be built into the system.

Moving the test head 100 to a desirable position might be achieved by manual means, which may include the use of push button commands to the controller to operate the linear actuators 508. Alternatively, the controller might be equipped with appropriate algorithms to allow it to utilize the linear actuators 508 combined with position feedback in an automatic positioning sequence.

With the test head 100 now in a desirable position, a compliant ready condition can now be achieved. In the desirable position, the imbalance force is shared between the two BCAAs 930 and 932. That is, the imbalance force is resolved into two components, one component acting along the yaw BCAA force rod 112 and the second component acting along the pitch BCAA force rod 112. The axes may be operated on sequentially, first one axis and then the other. Because making one axis compliant ready may upset the conditions previously achieved in another axis, each axis may be operated on again in turn repetitively until both are satisfactorily simultaneously balanced and positioned.

Using known methods a control algorithm can be implemented to automate a sequence of repetitively operating on each axis sequentially until an overall compliance ready condition is achieved. However, in practice, two attempts per axis are usually sufficient.

The selection of which axis to operate on first may be based on various criteria. In certain applications, it may be preferred to always address a certain axis first. In other applications it may be preferred to select it at random. In still other applications it may be preferred to select the first axis to be operated on based on a comparison of the forces acting on the respective BCMs. For example, it may be desired to first operate on the BCM having the largest component of imbalance force acting on it. Accordingly, the outputs of the two force sensors 120 can then be compared, and the axis having the greatest component of the imbalance force is selected to be first. Similarly, one could select the axis having the smallest component of imbalance force. In either case, if the two components of the imbalance force are approximately equal, then one or the other of the axes could be selected at random.

The axis that was selected to be operated on first will now be referred to as the first axis, and the other axis will be referred to as the second axis. The first axis is now brought to a compliant ready condition by following an appropriate procedure, such as either the previously described Approach 1 (FIG. 15(*b*)) or Approach 2 (FIG. 15(*c*)). While doing so, the lock 118 of the BCM(930 or 932) of the second axis remains locked. When the first axis has achieved a compliant ready state, the lock 118 of its BCAA(930 or 932) is locked; and the second axis can then also be brought to a compliant ready condition. In bringing the second axis to a compliant ready condition, the balance established in the first axis may have been slightly disturbed. Accordingly, the process of bringing the first axis to compliance readiness can be repeated. Similarly, the process of bringing the second axis to compliance readiness can also be repeated. It is typical that two iterations are usually sufficient to achieve a reasonable degree of compliance readiness in both axes simultaneously.

We can now consider the overall operation of a test head manipulator that incorporates two BCAAs 930 and 932 as shown in FIG. 9(*a*). Starting with the test head 100 in an arbitrary position and not docked with any test apparatus, the axes having BCAAs 934 and 936 would first be brought to a condition of simultaneous compliance readiness with the locks 118 locked. The test head 100 could then be manipulated, using the BCAA linear actuators 508 as appropriate, to a docking ready position. That is, to a position that is proximate to the test apparatus that the test head 100 is to be docked with and such that the mating components of the docking apparatus are close to the point of engagement. In the docking mechanism in FIG. 9(*a*) this would be a point where the guide pins 912 are in close proximity, but not inserted into the mating guide holes(not shown). Because the test head 100 is assumed to be in a new orientation, it is to be further assumed that it is no longer balanced and compliance ready. Accordingly, the axes having BCAAs (934 and 936) are again brought to a condition of simultaneous compliance readiness. Now the BCM locks 118 are unlocked, the test head 100 is maneuvered so that the dock actuation mechanism becomes engaged. In the test head 100 of FIG. 9(*a*) this occurs when the guide pins 912 have been inserted into the guide holes (not shown) and the cam follower on the mating docking assembly (not shown) has become inserted into the docking cam 910 sufficiently to allow the docking handle 914 to operate. The dock actuation mechanism is now activated and the test head 100 is drawn into a fully docked position. In FIG. 9(*a*), this is accomplished by rotating the docking handle 914. Other dock actuation mechanisms are known and could be equally well used including electrically, pneumatic, and vacuum operated types. While docking, the test head 100 is free to be moved compliantly as necessary. The test head 100 may remain docked for a long period of time and the air pressure differential in the pneumatic cylinder 128 may become lost due to leakage. Accordingly, for undocking, the locks 118 are kept locked and the test head 100 is withdrawn along a straight path that is perpendicular with the test interface surface (not shown) so that full compliant motion is not necessary. Alternatively, the system could be equipped with pressure sensors (606*a*, 606*b*) that allow the pressure on each side of the piston 130 to be recorded by the controller (not shown) when the compliant ready state just prior to docking has been achieved. The controller could then use this information to restore the compliant ready condition prior to undocking, and undocking could be done with compliant motion. Once the test head 100 has been undocked, the BCAA controlled axes 934 and 936 can again be brought to a compliant ready condition if desired.

FIGS. 10*a*, 10*b*, 10*c*, 10*d*, 10*e* and 10*f* illustrate numerous embodiments of the invention to a vertical axis.

Figure 10A:
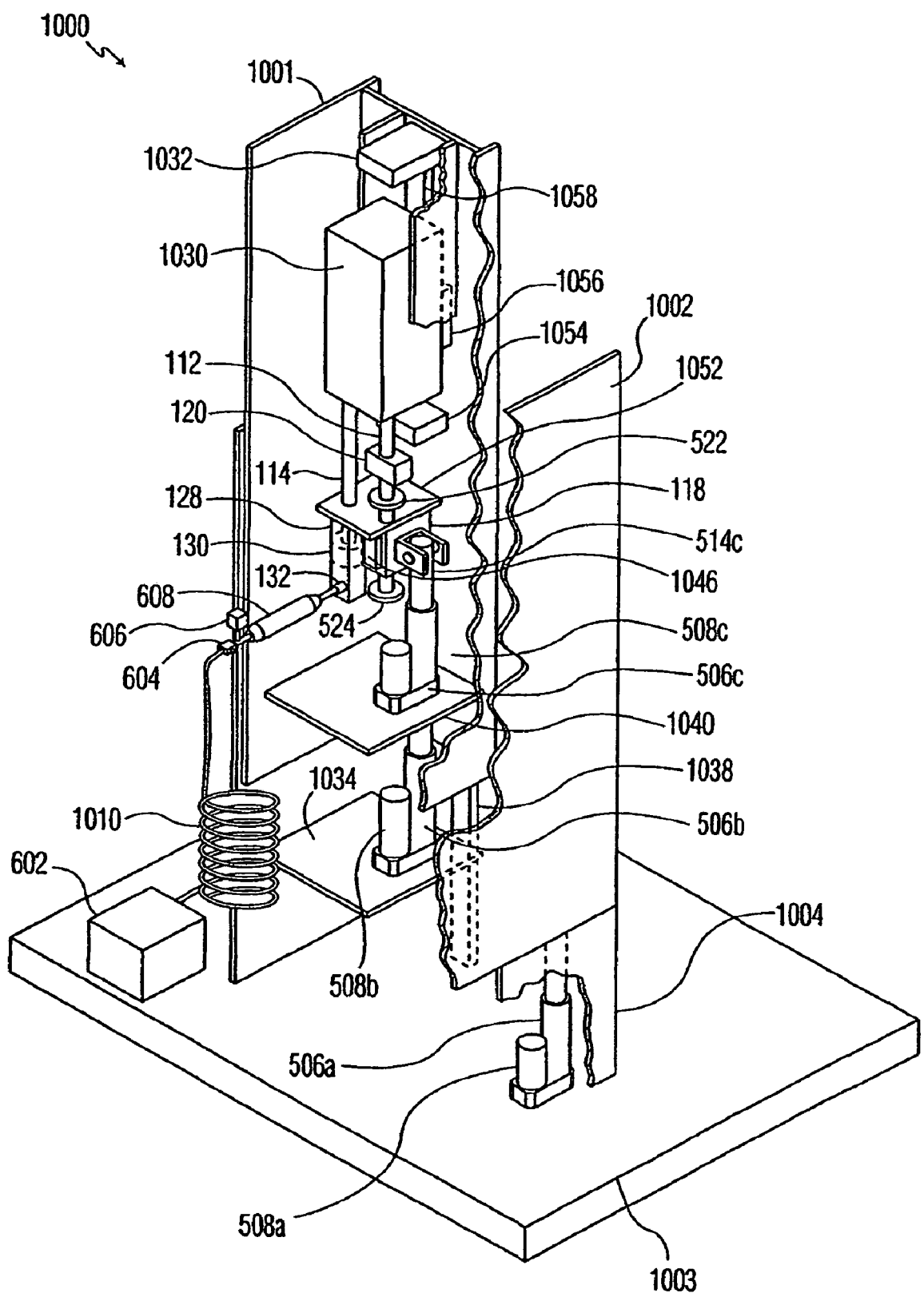
FIG. 10(a) is a perspective view of a compliant driving mechanism on a vertical axis in accordance with an exemplary embodiment of the present invention.
Figure 10B:
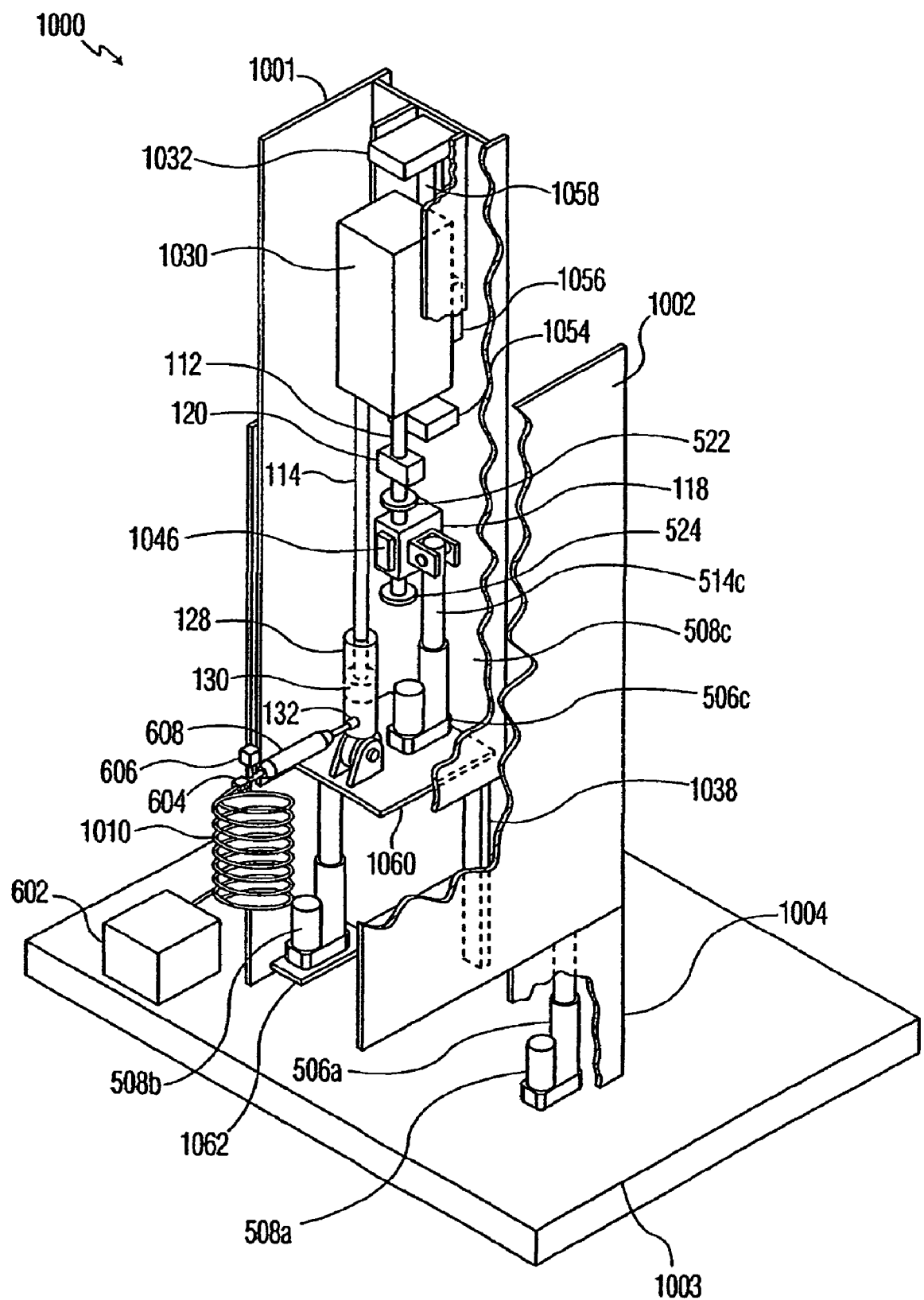
FIG. 10(b) is a perspective view of a compliant driving mechanism on a vertical axis in accordance with another exemplary embodiment of the present invention.
Figure 10C:
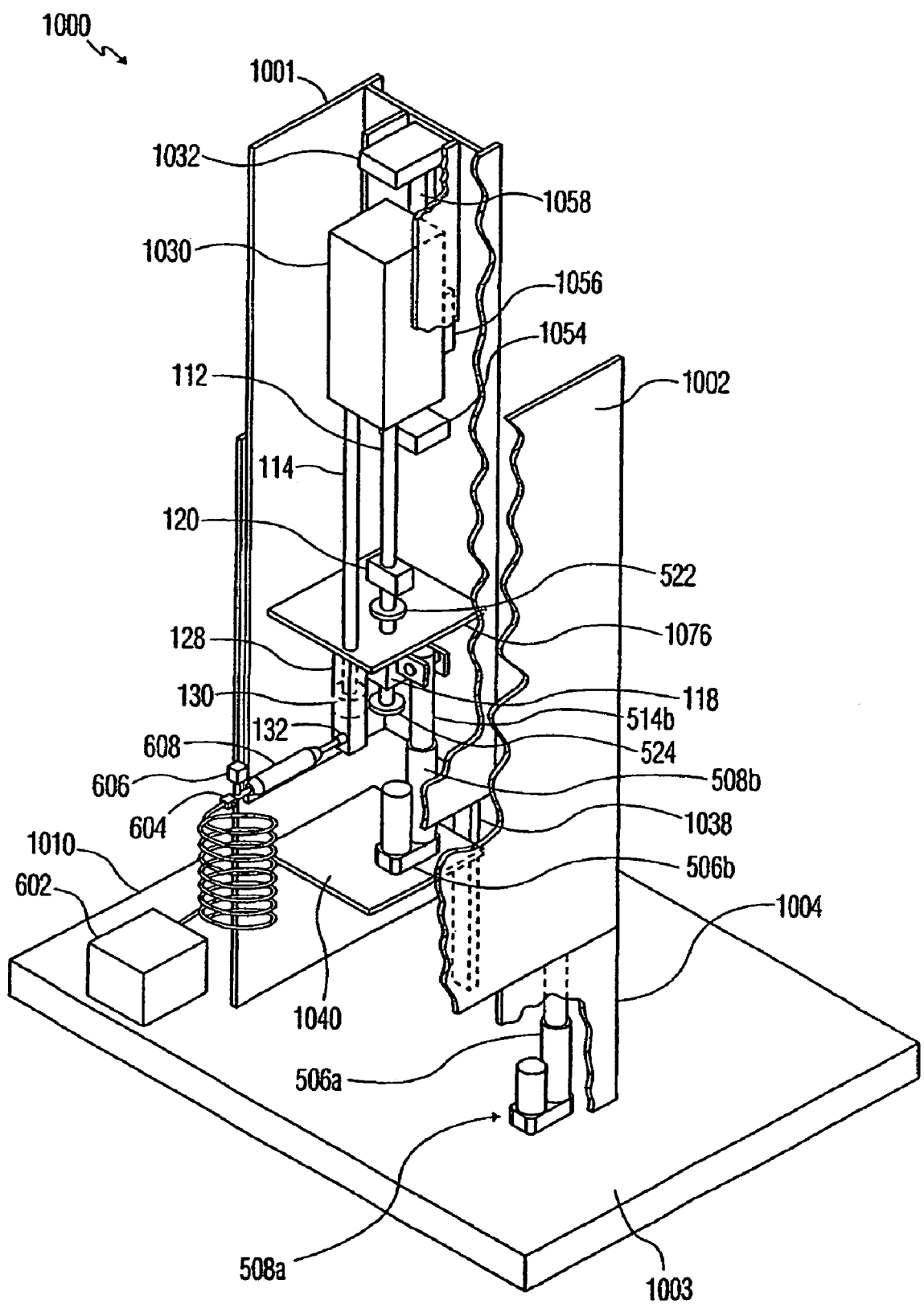
FIG. 10(c) is a perspective view of a compliant driving mechanism on a vertical axis in accordance with yet another exemplary embodiment of the present invention.
Figure 10D:
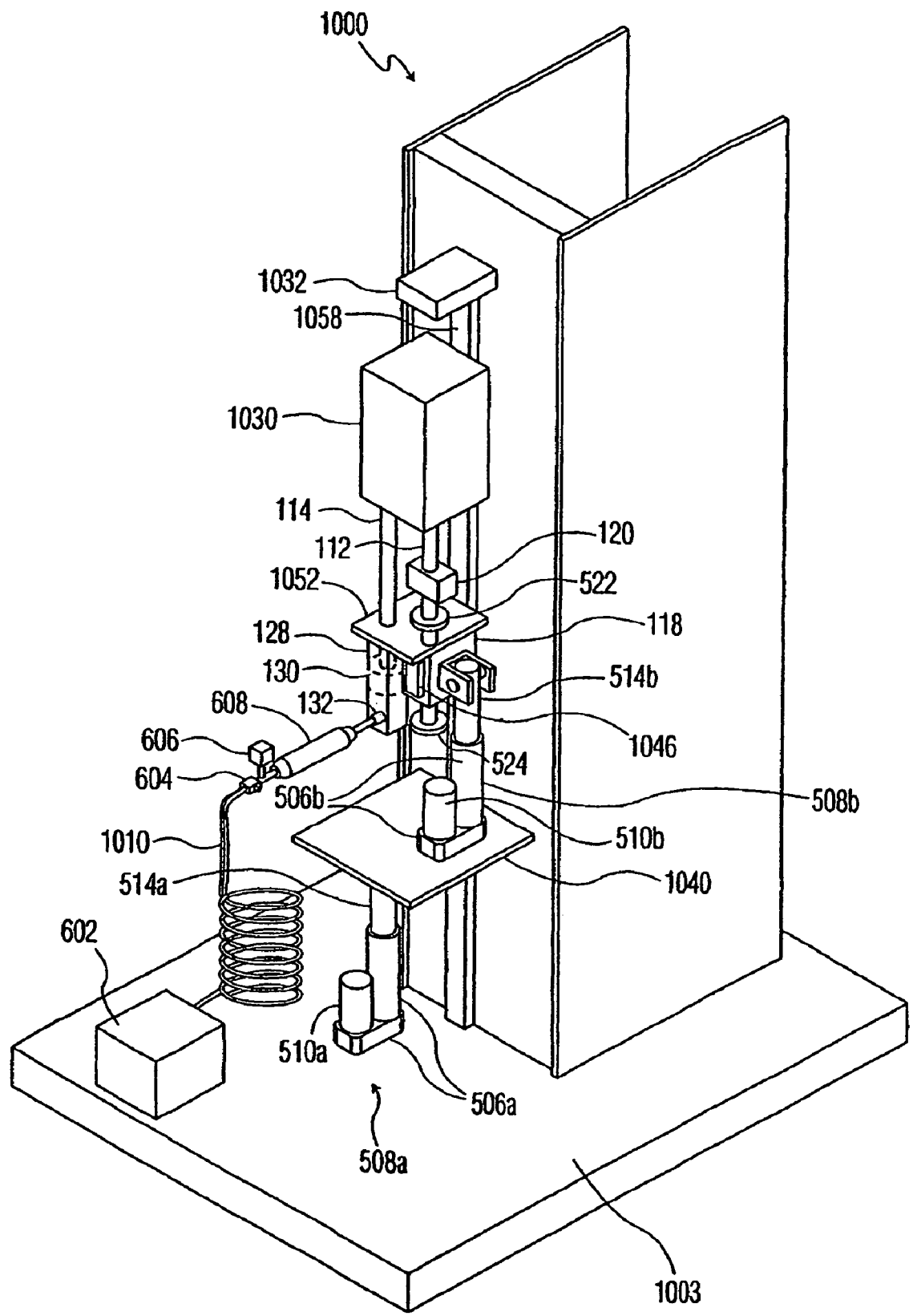
FIG. 10(d) is a perspective view of a compliant driving mechanism on a vertical axis in accordance with yet another exemplary embodiment of the present invention.
Figure 10E:
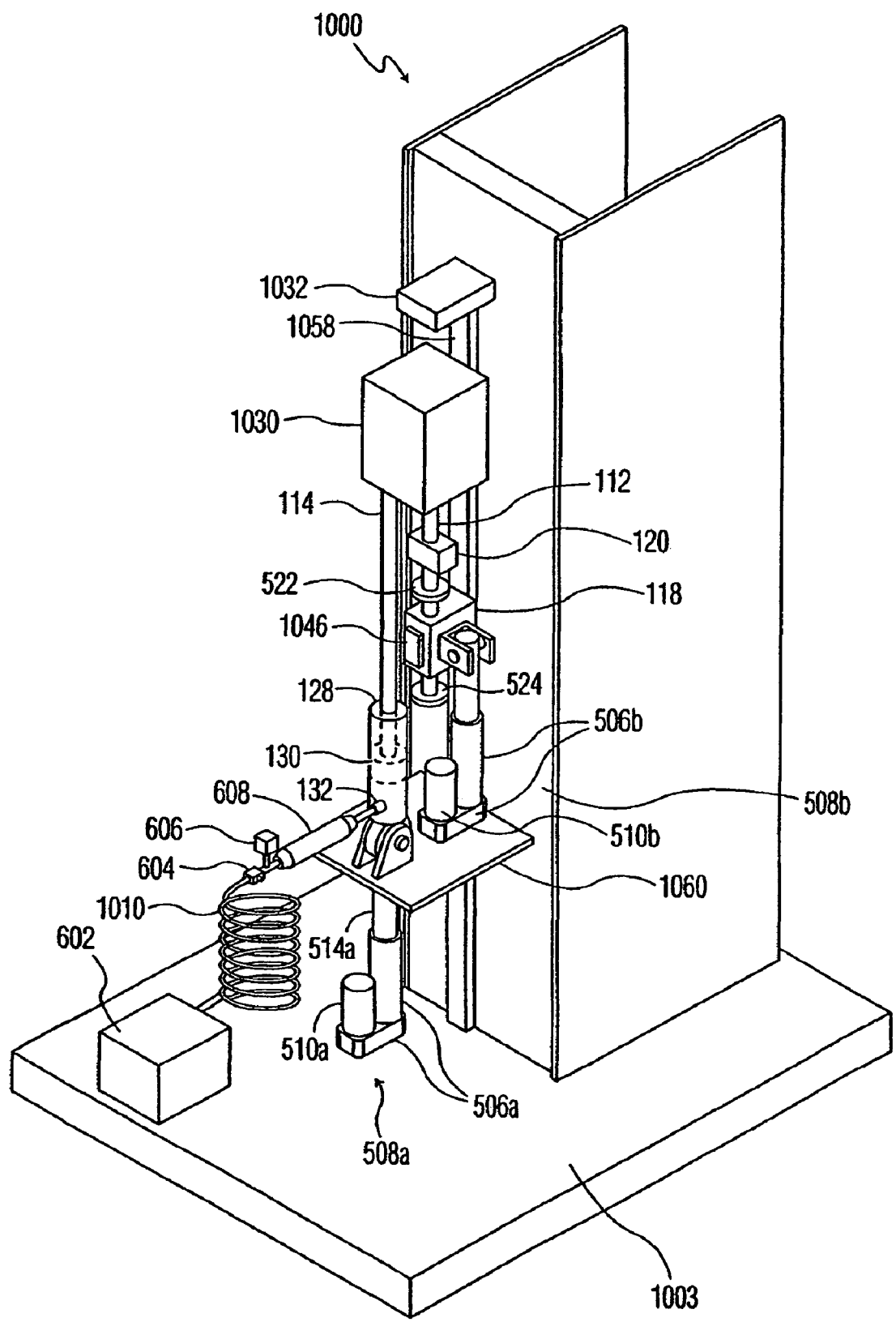
FIG. 10(e) is a perspective view of a compliant driving mechanism on a vertical axis in accordance with yet another exemplary embodiment of the present invention.

FIGS. 10*d* and 10*e* are similar. Both have a fixed vertical column 1000, and an actuator driven vertical axis is defined by the column 1000. In FIG. 10*d* a BCM of the type shown in FIG. 8*a* is used to provide balance and compliance; whereas, a BCAA of the type shown in FIG. 6*a* is used for this purpose in FIG. 10*e*. The following discussion pertains to both figures in general. Specific differences based on the type of BCAA are pointed out where necessary.

Referring to FIGS. 10*d* and 10*e* generally, the main arm 1030 is slidingly attached to the column 1000 in the usual way using either rails 1058 and linear guide bearings (not shown) or a circular shaft (not shown) and bearings (not shown). The test head (not shown) is coupled to the main arm 1030 via any number of well-known means (also not shown). Thus the main arm 1030 supports the load. The vertical motion of the main arm 1030 is limited by the upper stop 1032.

The stationary element 506*a* of a linear actuator 508*a* including the actuator niotor 510*a* is attached to the base plate 1003. This actuator 508*a* is referred to as the main linear actuator 508*a*. The driven element 514*a* of the main linear actuator 508*a* is a screw, typically a ball screw or an acme screw of appropriate thread pitch and friction so as not to be back drivable. The main linear actuator 508*a* must be able to safely support the entire load whether energized or not. The main linear actuator 508*a* drives the main arm 1030 through its entire vertical range so that the stroke of the main actuator 508*a* equals the vertical stroke of the manipulator. In practice, suitable actuators 508*a* having strokes of up to 30 inches are commercially available, and manipulators of this type can correspondingly be designed having vertical strokes of up to 30 inches. For a longer vertical stroke a telescoping column of the types shown in FIGS. 10*a*, 10*b*, and 10*c* may be used.

A support bracket 1040 is attached to the distal end of the main actuator screw 514*a*. A BCAA of the type shown in either FIG. 6*a* (as in FIG. 10*e*) or FIG. 8*a* (as in FIG. 10*d*) couples the main arm 1030 to the support bracket 1040. The BCAA includes a BCAA actuator 508*b* to precisely position the lock 118 with respect to the force rod 112. Operation of the main actuator 508*a* causes vertical motion of the support bracket 1040, which in turn causes corresponding vertical motion of the main arm 1030 and its load. The weight of the main arm 1030 and its load is transferred to the support bracket 1040 and actuator screw 514a through the BCAA mechanism.

In normal use the main arm 1030 will first be placed in a compliant ready condition with the lock 118 unlocked. That is, the lock 118 is placed in the compliant neutral position with respect to the force rod 112, and the air pressure in the pneumatic cylinder 128 will be adjusted so that the connecting rod 114 and piston 130 bear essentially the entire load. In this case the force measured by the force sensor 120 is approximately zero. Further, the piston 130 is desirably in a compliant neutral position with respect to the cylinder 128, so that the load will be able to move throughout its entire compliant range without the piston 130 coming to the end of its stroke. The main linear actuator 508a is then used to position the load vertically.

In the case of the vertical axis, the direction of the imbalance is always down. Accordingly, a dual-action pneumatic cylinder (as is shown in the general cases of FIGS. 6a and 8a) is not necessary; a single-action cylinder 128 having a single air inlet 132 is sufficient. Consequently, there is only one three position valve 604, one accumulator 608, and one optional pressure sensor 606 shown and coupled via flexible tubing 1010 to the high-pressure air supply 602. The flexible tubing 1010 allows motion of the pneumatic cylinder 128 and its associated components with respect to the air supply 602, which is typically stationary. The diameter of the cylinder 128 and piston 130 are desirably adequate to the support the main arm 1030 and the load attached to it. For example, if the combined weight of the main arm 1030 and attached load is 1000 pounds, and the maximum air pressure that can be inserted into the cylinder 128 is 100 pounds per square inch, then the area of the cylinder 128 and piston 130 is desirably at least 10 square inches and the corresponding diameter at least approximately 3.57 inches. The required cylinder 128 diameter is proportional to the square root of the load. Thus, doubling the load requires that the cylinder 128 diameter increase by the square root of two, or alternatively, the air pressure can be doubled (with, for example, an air pressure doubler). If the required cylinder 130 size for a given load is too large, then two or more smaller cylinders 128 may be arranged in parallel.

It is usually desirable to have approximately .+-.1 inch of vertical compliant motion. It is usually preferred to have the stroke of the piston 130 be somewhat greater than the compliant range as determined by the compliance stops 522 and 524 so that the piston 130 won't be "bottomed out" in the event that the lock 118 is bearing against a compliance stop. The system is designed so that, in operation, if the lock 118 is at its compliant neutral position with respect to the extended 522 and retracted compliance 524 stops, then the piston 130 is in a compliant neutral position relative to the cylinder 128. The load may then move through its entire compliant range as defined by the compliance stops 522 and 524 during docking.

In FIG. 10(d) the cylinder 128 and the lock 118 are rigidly attached to one another through the bracket 1052, and the system may be conveniently arranged so that whenever the lock 118 is in a compliant neutral position, the piston 130 is also in such a position. For example, the preferred compliant neutral position is often a centered position; and the system may be arranged so that when the lock 118 is centered between the compliance stops 522 and 524, the piston 130 is at the center of its stroke. The single position sensor 1046 shown in FIG. 10(d) is adequate for positioning both the lock 118 and piston 130 to their respective compliant neutral positions.

In FIG. 10e the lock 118 is not attached to the cylinder 128, and the lock 118 can and does move relative to the cylinder 128. In order to achieve the desired goal of positioning both the lock 118 and the piston 130 to compliant neutral positions, information in addition to that provided by the shown position sensor 1046 is needed. Position information concerning either the piston 130 or the BCAA actuator 508b is sufficient. In a preferred embodiment, the system is designed so that if the BCAA actuator 508b is fully extended and the lock 118 is in its compliant neutral position, then the piston 130 will also be in a compliant neutral position. Sensing a fully extended condition of the BCAA actuator 508b is readily achieved in known ways including the use of limit switches (not shown in the figure) that are included in the purchased BCAA actuator 508b assembly or by operating the BCAA actuator 508b for an amount of time sufficient for it to reach its end of travel and stall. In the latter case the use of a current limited voltage supply to the BCM actuator motor 510b is recommended to minimize the chances of overheating. An alternative approach would be to sense the position of the piston 130 with respect to its cylinder 128. Often pneumatic cylinder-piston assemblies are equipped with limit switches (not shown in the figure) by their manufacturers that will permit this sensing.

In certain applications it may be desirable for the BCAA actuator 508b to be able to position the lock 118 through the entire compliant range defined by the compliance stops 522 and 524 when the piston 130 is at any point in its range of travel. In this situation, the range of the BCM actuator 508b in FIG. 10e is at least sum of the compliant range plus the stroke of the piston 130. Also in FIG. 10e it will be necessary to directly sense the position of the piston 130 in achieving a compliant ready condition. In comparison, the needed range of the BCAA actuator 508b in FIG. 10d is at least the greater of the compliant range or the stroke of the piston 130, and only the single position sensor 1046 that is shown is sufficient.

A sequence of operations for achieving a compliant ready condition is as follows:

First we define a "Balance Sequence"

Figure 15D:
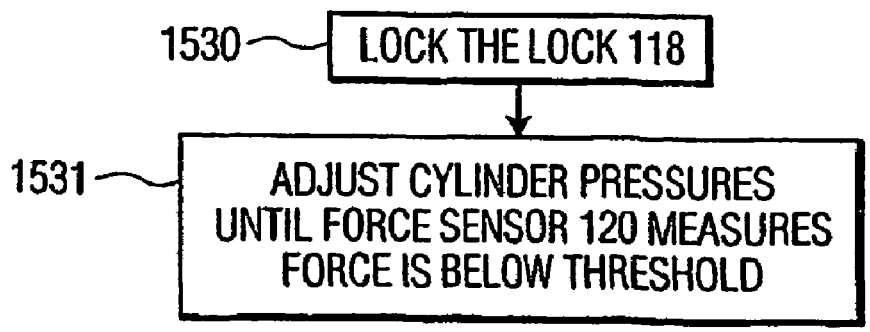

Balance Sequence (as Illustrated in FIG. 15(d))

1. The lock 118 is locked, as illustrated in step 1530.
2. The air pressure in the cylinder 128 is adjusted until the force sensor 120 indicates that the force exerted on the lock 118 by the force rod 112 is less than a threshold amount, as illustrated in FIG. 1531.

Now to achieve a compliant ready state ("Compliant Ready Sequence 1")

Figure 15E:
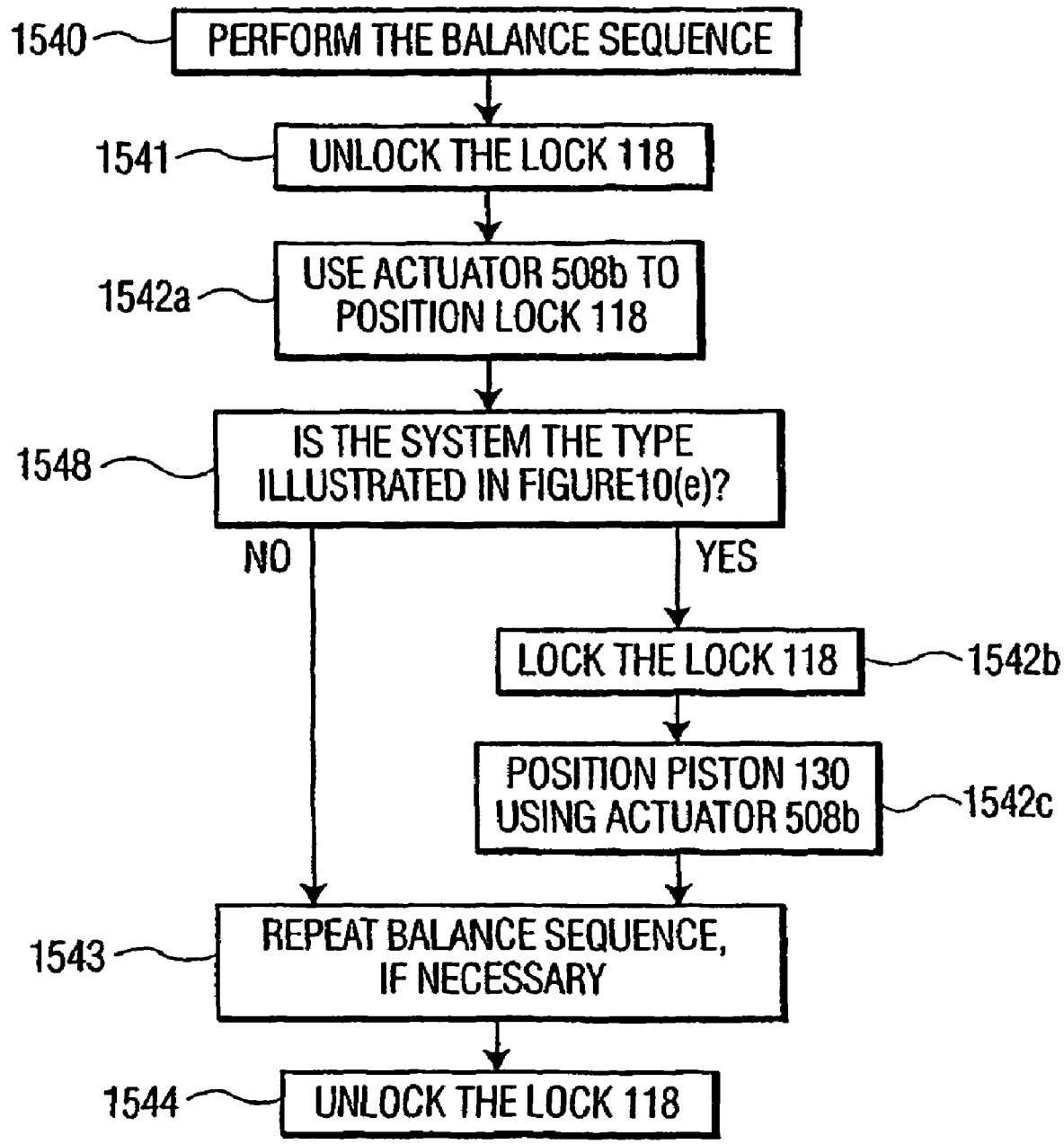
Figure 15F:
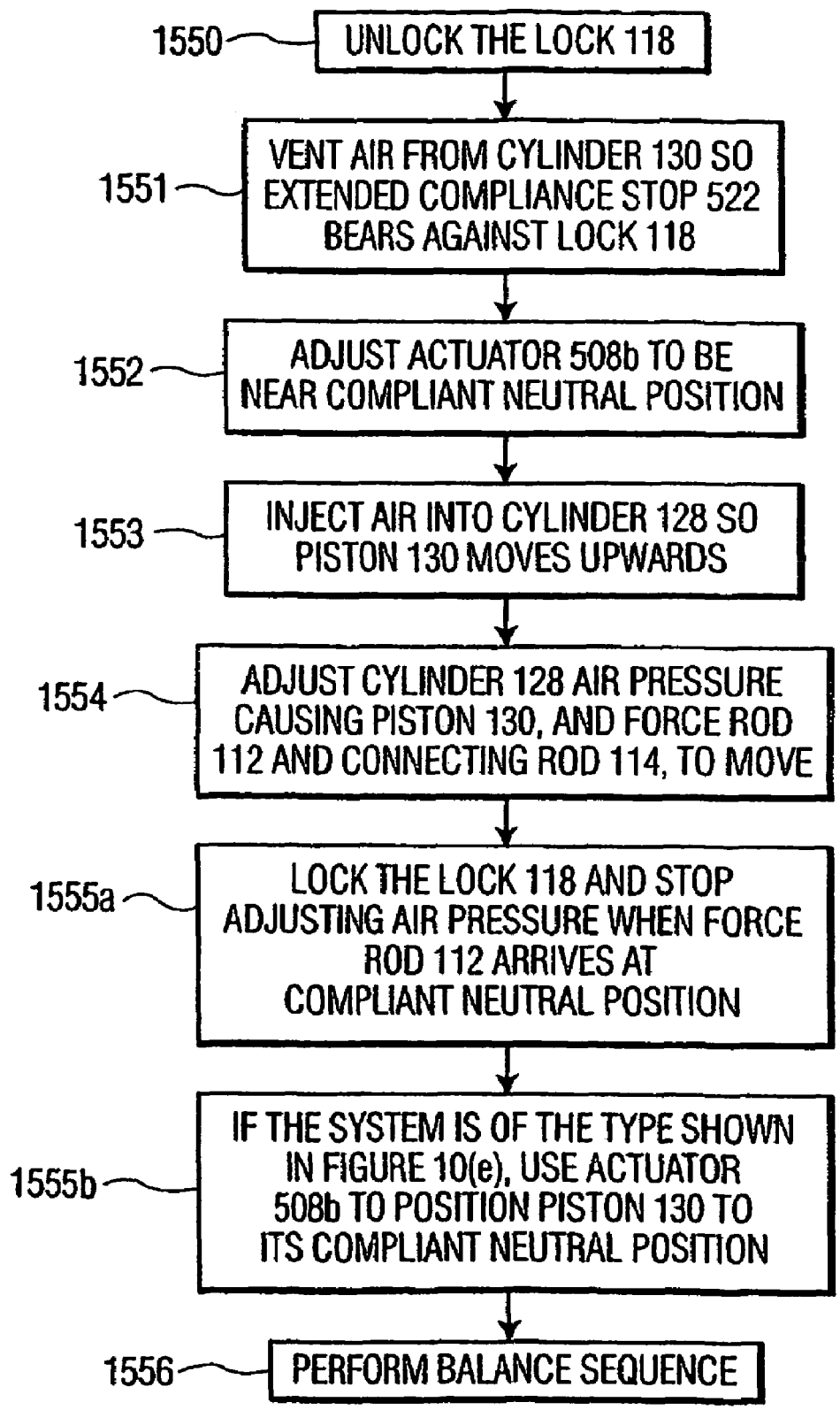
Figure 15G:
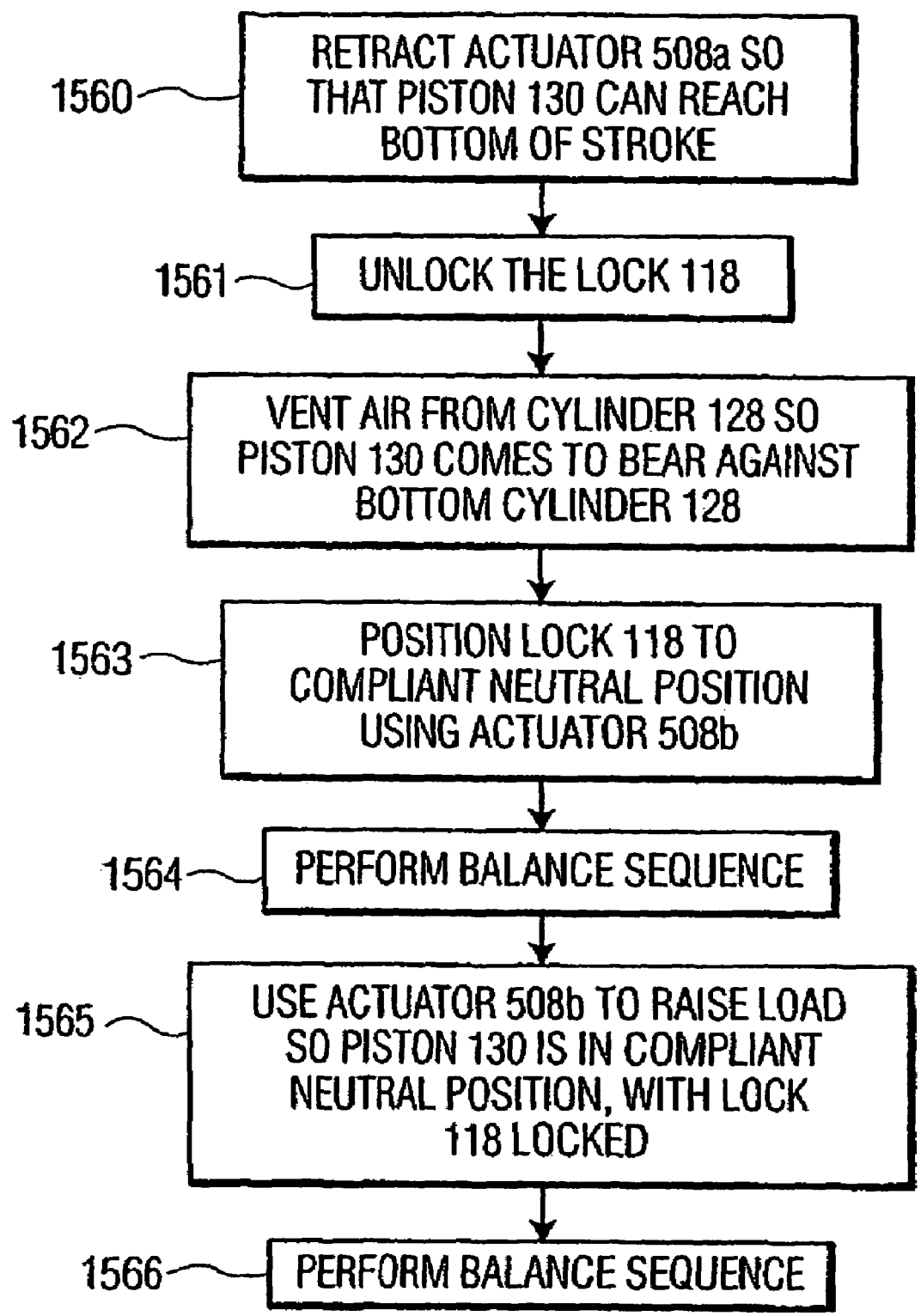
Figure 15H:
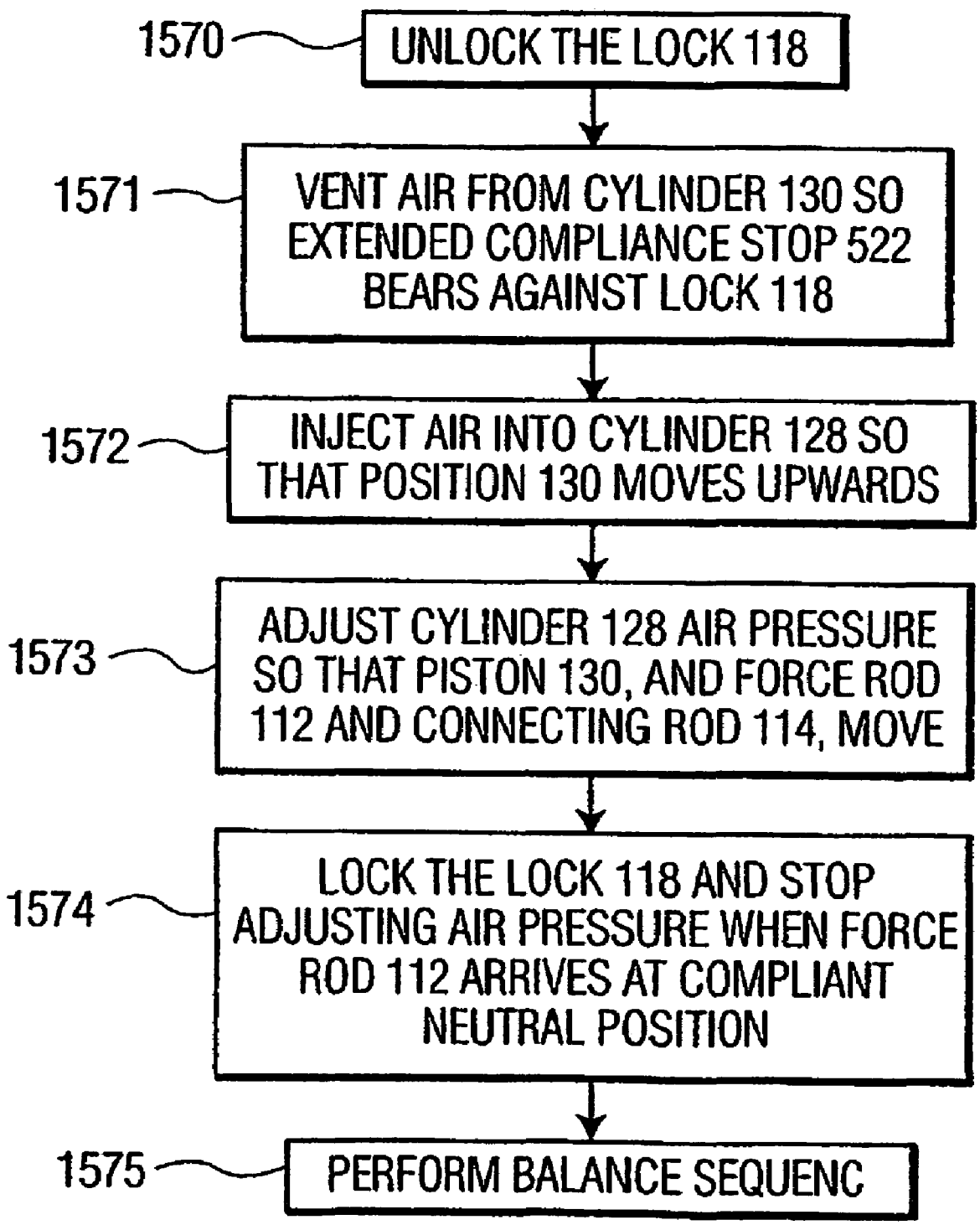
Figure 15I:
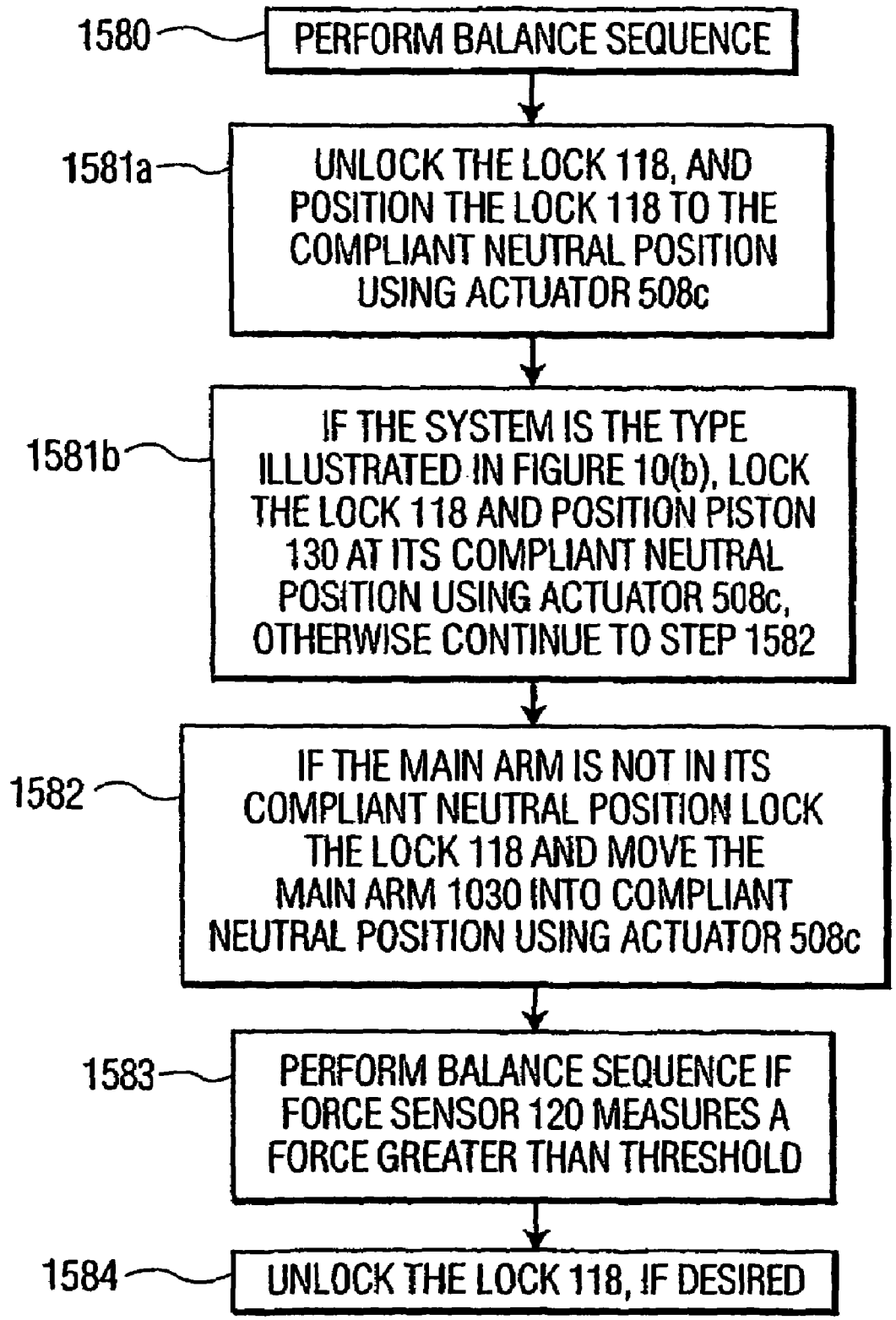
Figure 15J:
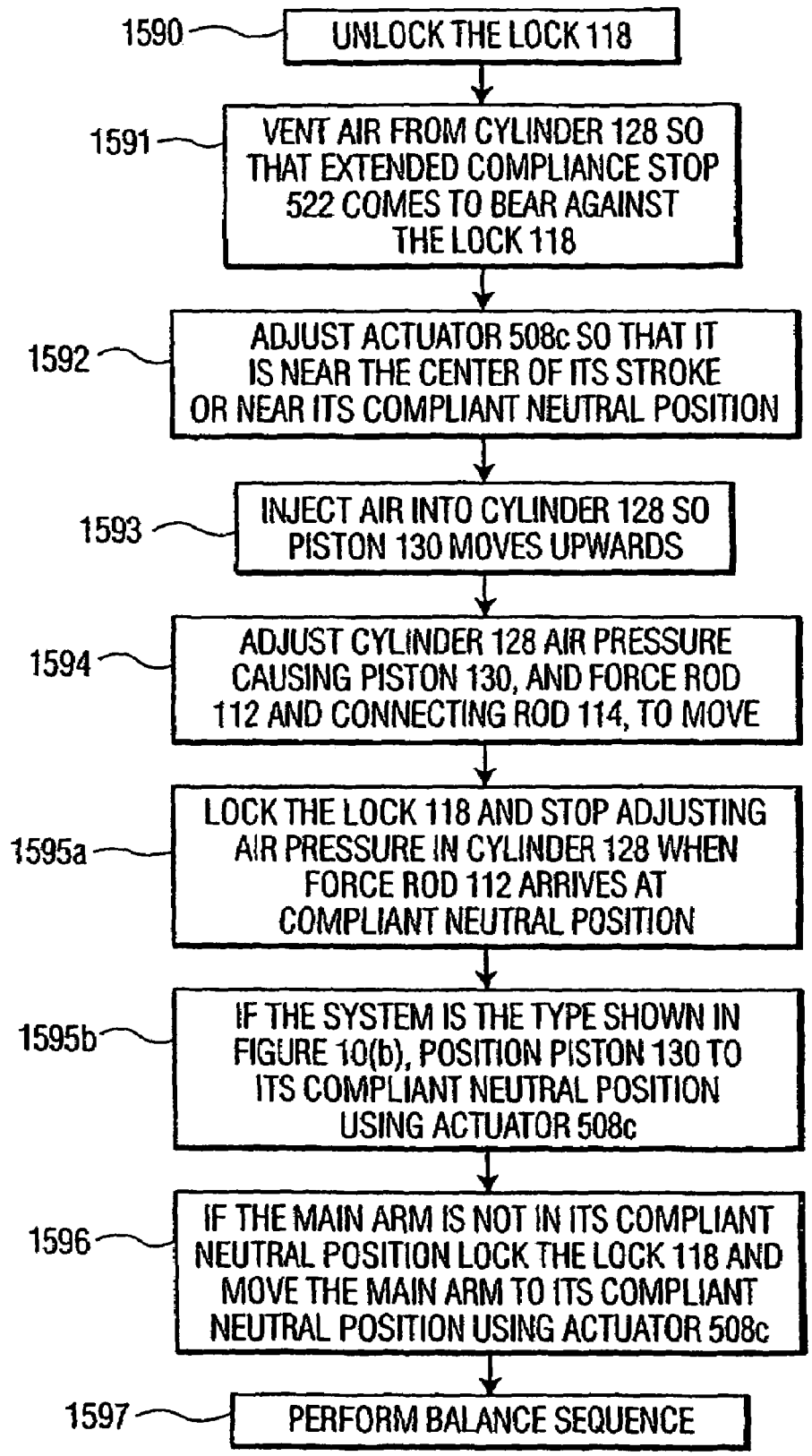
Figure 15K:
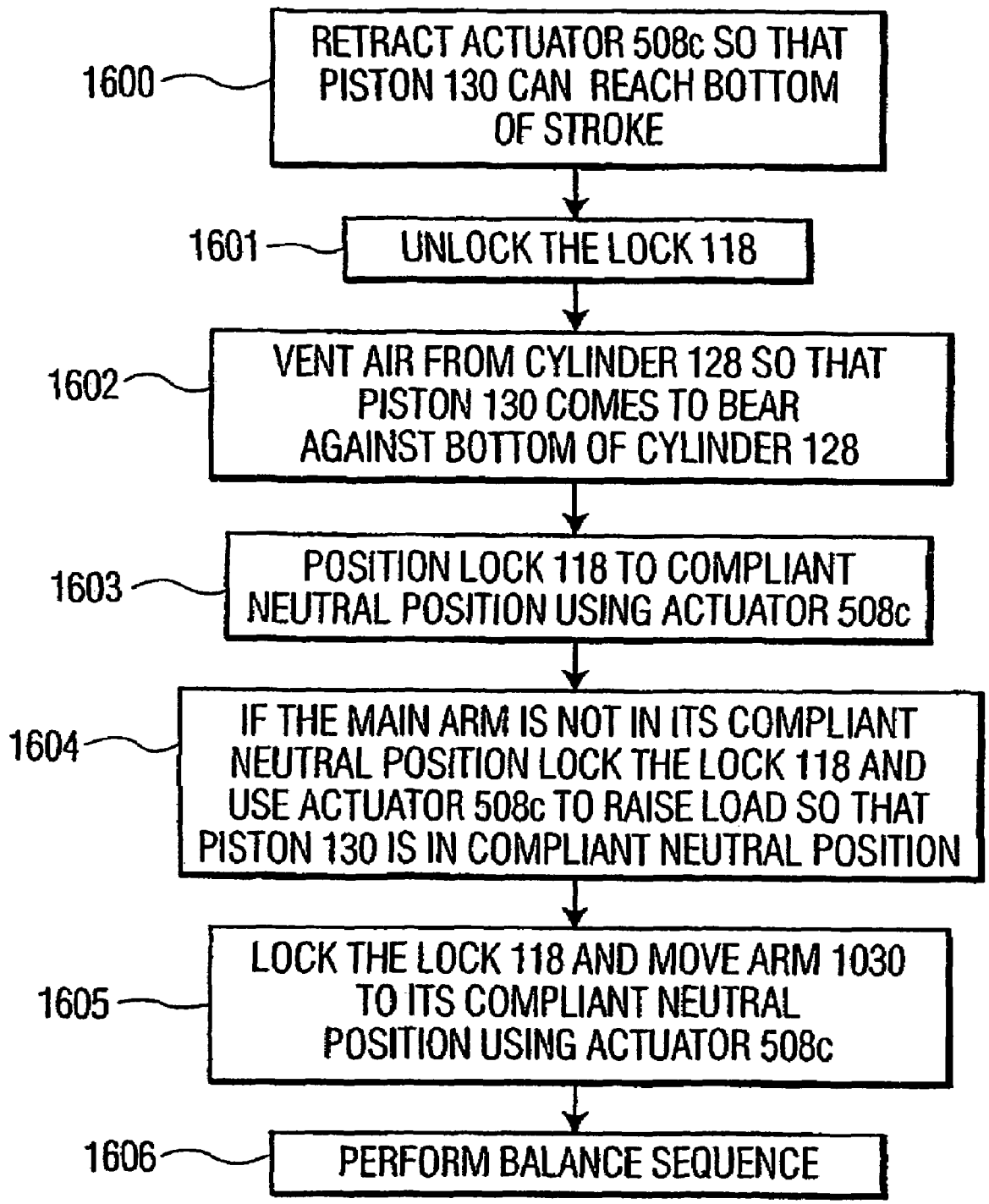
Figure 15I:
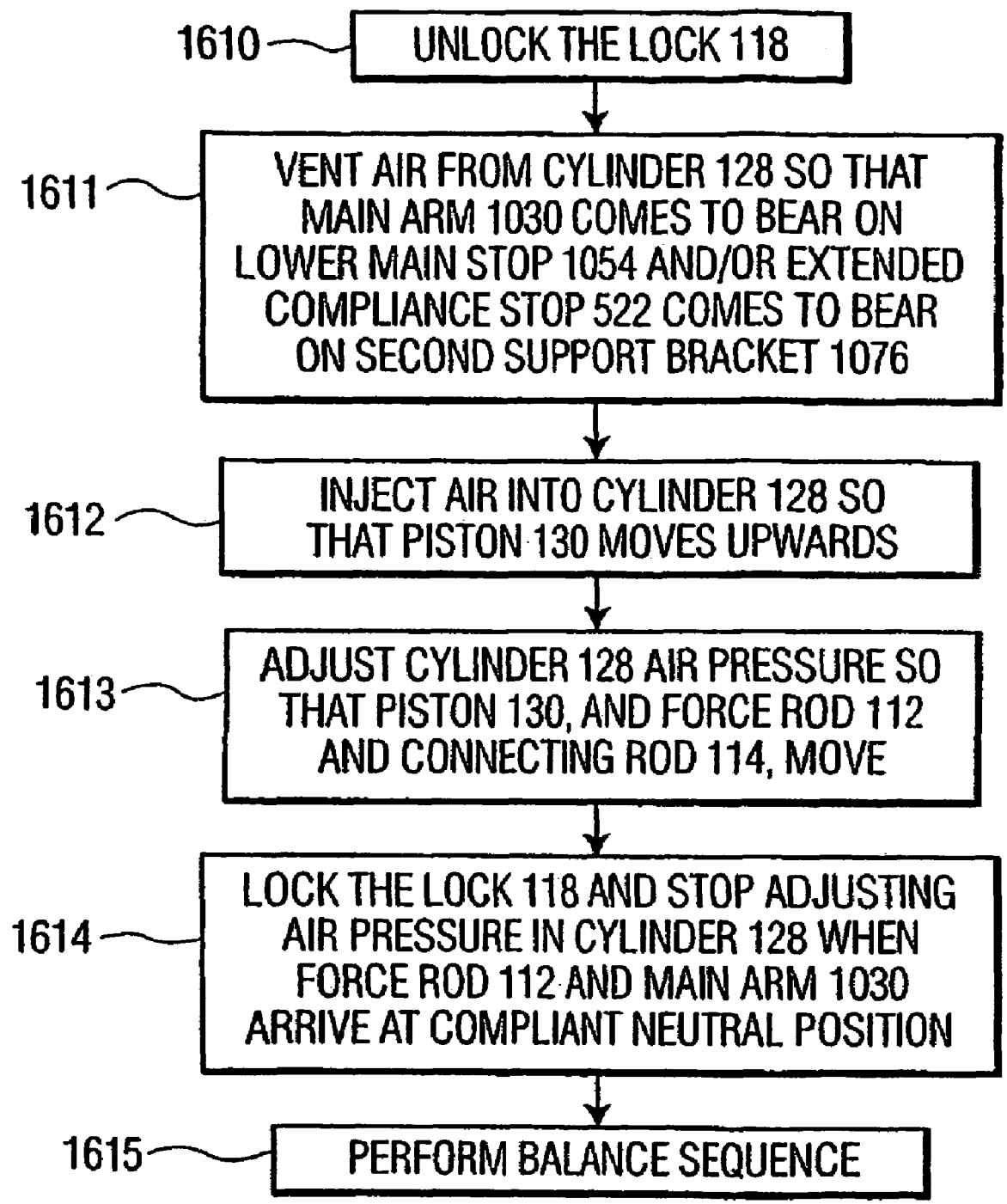
Figure 15M:
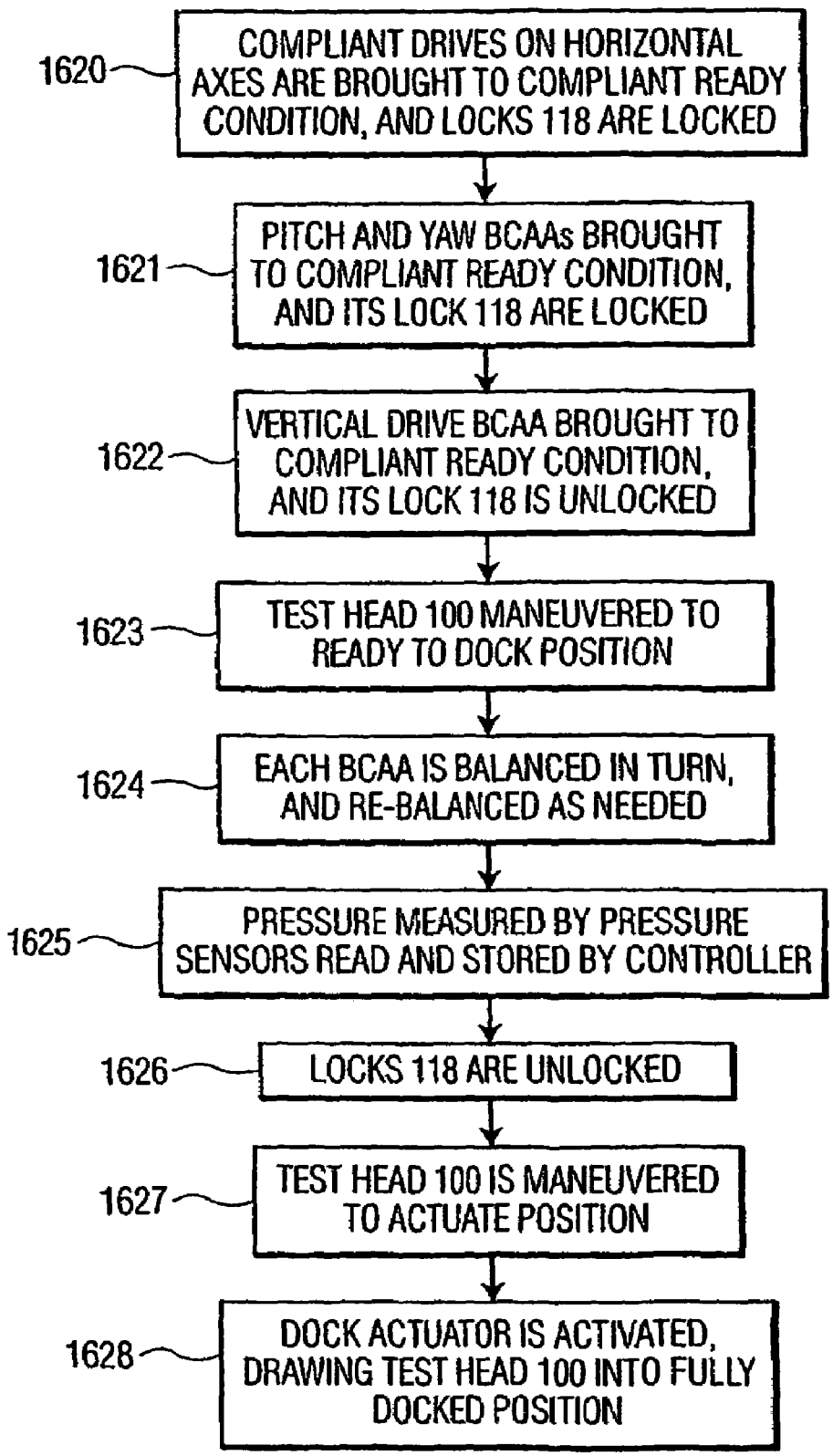
Figure 15N:
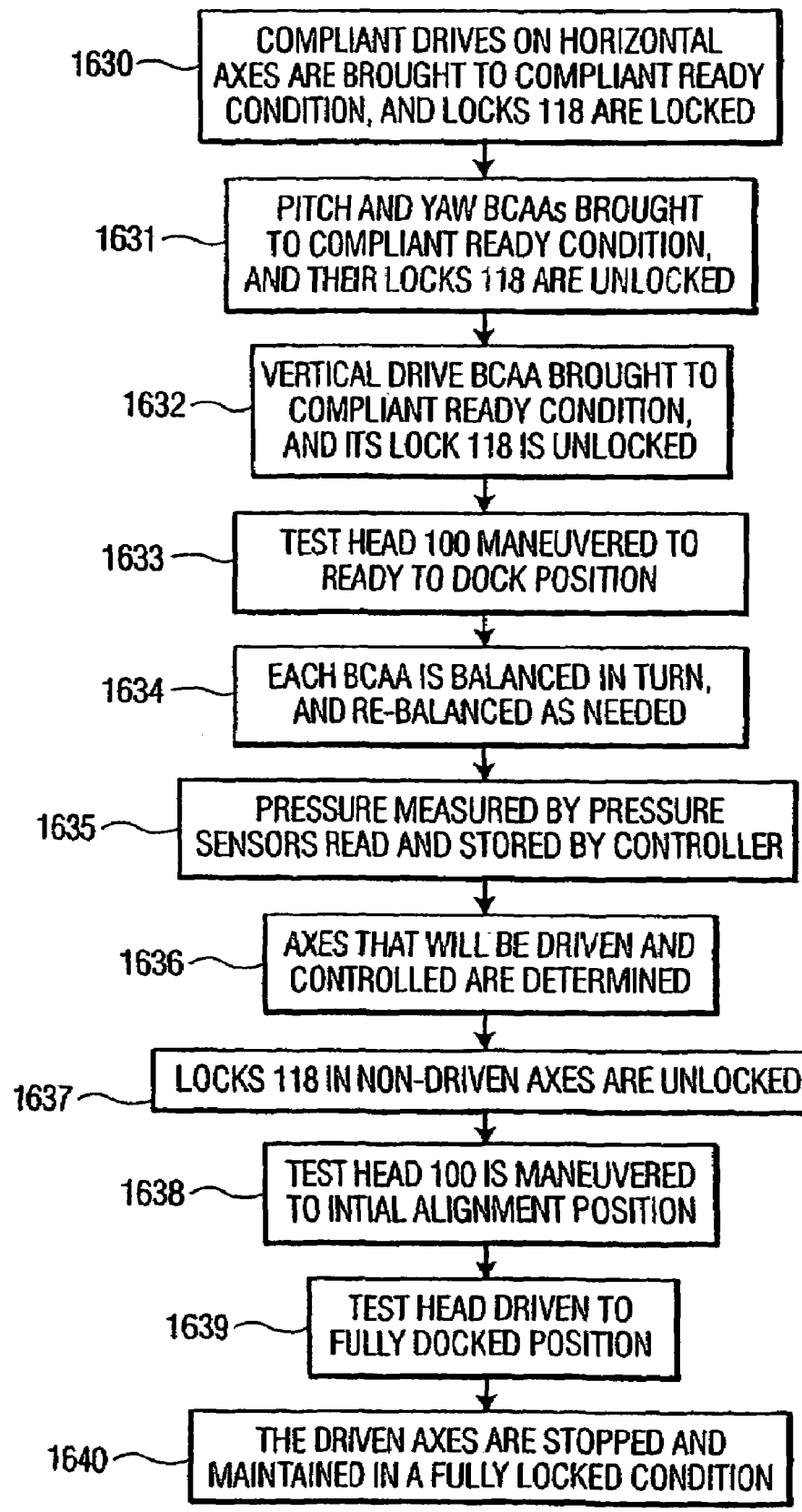

Compliant Ready Sequence 1 (as Illustrated in FIG. 15(e)) (Applicable to Both FIGS. 10d and 10e)

1. Perform balance sequence, as illustrated in step 1540.
2. Unlock the lock 118, as illustrated in step 1541.
3. Position the lock 118 to the compliant neutral position using the BCAA actuator 508b, as illustrated in step 1542a.
4. If the system is of the type shown in FIG. 10e, lock the lock 118 as illustrated in step 1542b and then position the piston 130 to its compliant neutral position using the BCM actuator 508b, as illustrated in an alternative embodiment in step 1542c.
5. If the force sensor 120 indicates that the balance has been disturbed or degraded (e.g., if the measured force is greater than the threshold force), repeat the balance sequence, as illustrated in step 1543.

6. If the lock 118 is locked then unlock the lock 118, as illustrated in step 1544.

Notice that in Compliant Ready Sequence 1 it is preferable that the threshold force for balance must be less than the combined static friction and pneumatic piston break away force. Otherwise, the lock 118 will move and come to bear against a compliance stop 522 or 524 when the lock 118 is unlocked in step 1541, and operation of the BCAA actuator 508*b* will not move the lock 118 with respect to the force rod 112. However, combined static friction and pneumatic piston break away force is typically in the range of 5 to 10 or more pounds, and it is possible to balance to within 1 to 3 pounds.

For reasons described later, it is preferred that the system be designed to meet the foregoing criterion. However, in the event that it is not possible or impractical to achieve this criterion, there are other possible alternative sequences to achieve a compliant ready condition. Two are now described.

The first alternative is to use the pneumatic cylinder 128 and piston 130 to position the lock 118 with a sequence of operations such as the following ("Compliant Ready Sequence 2"):

Compliant Ready Sequence 2 (as Illustrated in FIG. 15(*f*)) (Applicable to Both FIGS. 10*d* and 10*e*)

1. Unlock the lock 118, as illustrated in step 1550.
2. Vent air from the cylinder 130 so that the extended compliance stop 522 comes to bear against the lock 118, as illustrated in step 1551.
3. Adjust the BCM actuator 508*b* so that it is near the center of its stroke or near its desired compliant neutral position, as illustrated in step 1552. (This step requires the use of well known solutions including the use of position sensors 1046 to sense the position of the actuator's 508*b* driven element 514*b* relative to its stationary element 506*b*. In some instances actuators 508*b* are equipped with limit switches to detect when the driven element 514*b* reaches the end of its travel; these may be used in conjunction with timers in known ways to achieve the desired result.)
4. Inject air into the cylinder 128 increasing the cylinder air pressure to a point to cause the piston 130 to break away and move upwards, as illustrated in step 1553.
5. While monitoring the position of the force rod 112 relative to the lock 118 with the shown position sensor 1046, continue to adjust the cylinder 128 air pressure causing the piston 130, and consequently the connecting rod 114 and force rod 112, to continue to move, as illustrated in step 1554.
6. When the force rod 112 arrives at the compliant neutral position with respect to the lock 118, lock the lock 118 and stop adjusting the air pressure in the cylinder 128, as illustrated in step 1555*a*.
7. If the system is of the type shown in FIG. 10*e*, position the piston 130 to its compliant neutral position using the BCAA actuator 508*b*, as illustrated in an alternative embodiment in step 1555*b*.
8. Perform the Balance Sequence, as illustrated in step 1556.

The second alternative is to change the design slightly. In contradiction to the preference stated above to avoid bottoming out the piston 130, the system is arranged so that the piston 130 will bear against the lower end of the cylinder 128 if there is no air pressure in the cylinder 128 and the lock 118 is unlocked. In effect the piston 130 bearing against the bottom end of the cylinder 128 performs the function of the extended compliance stop 522, and the extended compliance stop 522 may therefore be eliminated from the system. (It is also noted that the retracted compliance stop 524 could be eliminated if the piston 130 is allowed to bear against the top of the cylinder 128 as a stop.) Then the following "Compliant Ready Sequence 3" is applicable.

Compliant Ready Sequence 3 (as Illustrated in FIG. 15(*g*)) (Applicable to Both FIG. 10*d* and 10*e*).

1. Retract the actuator 508*a* to a position that will allow the piston 130 to reach the bottom of its stroke within the cylinder 128, as illustrated in step 1560. (Depending upon design this could be determined by limit switches incorporated within the actuator 508*a*, by driving the actuator 508*a* in the retracting direction for a sufficient length of time to reach a fully retracted condition, or other known techniques.)
2. Unlock the lock 118, as illustrated in step 1561.
3. Vent air from cylinder 128 so that the piston 130 comes to bear against the bottom of the cylinder 128, as illustrated in step 1562.
4. Position the lock 118 to the compliant neutral position using the BCAA actuator 508*b*, as illustrated in step 1563.
5. Perform the Balance Sequence, as illustrated in step 1564.
6. Keeping the lock 118 locked, use the BCAA actuator 508*b* to raise the load to a position where the piston 130 is in a compliant neutral position (normally approximately centered) with respect to the cylinder 128, as illustrated in step 1565.
7. Perform the Balance Sequence again as the motion of the piston 130 could cause a slight imbalance to occur, as illustrated in step 1566.

In Compliant Ready Sequences 2 and 3, it is presumed that it is not guaranteed that the balance sequence threshold is not less than the static friction combined with the breakaway force. Consequently, the lock 118 should stay locked until a ready to dock position with the load partially supported by the dock apparatus (or other desired condition) is achieved. However, it is observed that if the lock 118 can be left unlocked while the load is being vertically positioned with the main actuator 508*a*, then the position sensor 1046 can be used to detect if the load encounters any obstructions. If an obstruction is encountered, the associated force on the load would cause motion of the force rod 112 relative to the lock 118. This motion could be detected by the position sensor 1046 and thus provide a signal to take appropriate action, such as stopping the main actuator 508*a*. Accordingly, it is preferred that the system be designed so that Compliant Ready Sequence 1 can be reliably used.

Figure 10F:
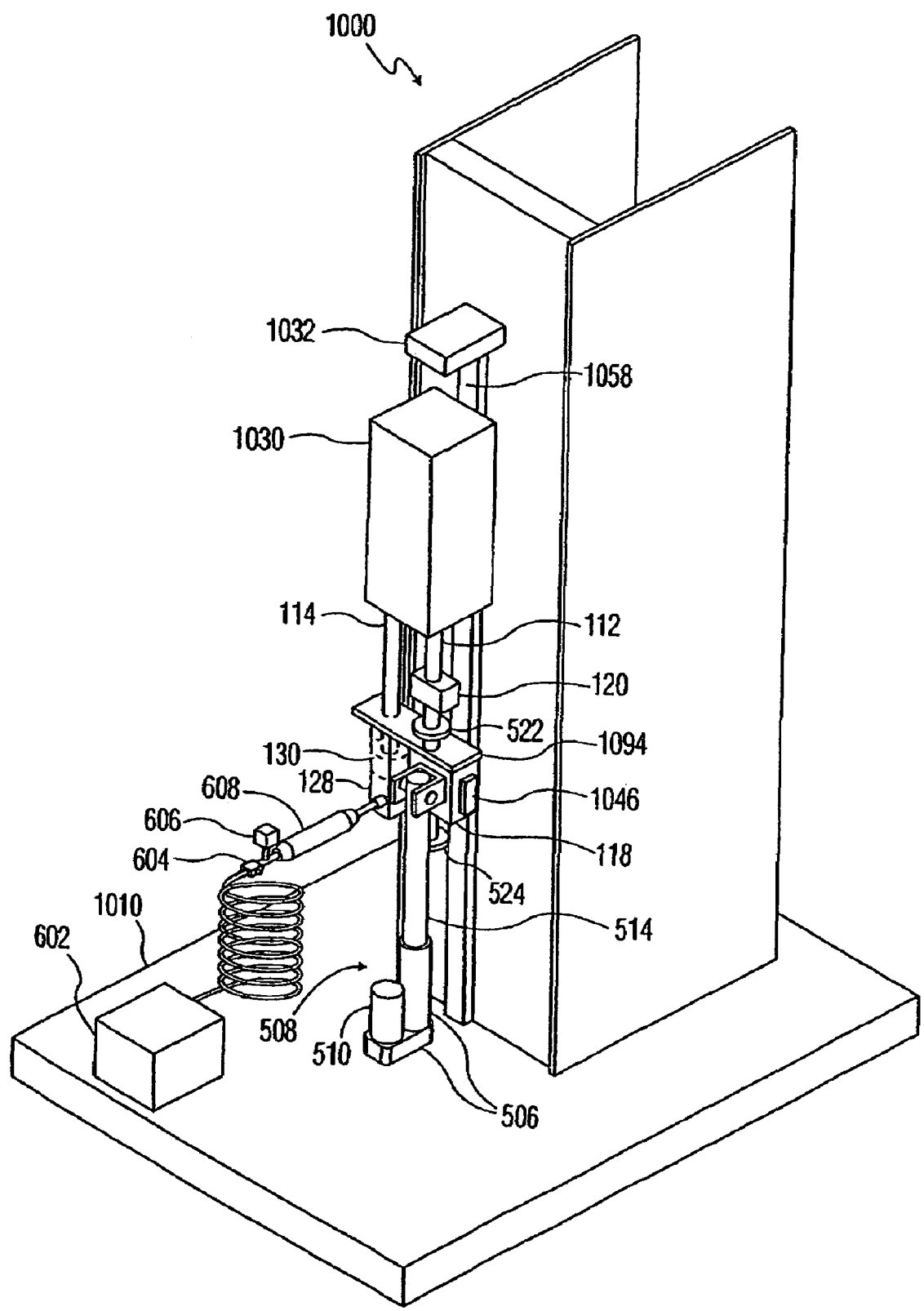
FIG. 10(f) is a perspective view of a compliant driving mechanism on a vertical axis in accordance with yet another exemplary embodiment of the present invention.

FIG. 10*f* also applies to a fixed vertical column 1000. The vertical axis is actuator 508 driven. A BCM of the type shown in FIG. 8(*a*) and FIG. 10*d* provides both the vertical drive as well as balance and compliance. Much of what has been said in the description of FIGS. 10*d* and 10*e* also applies to FIG. 10*f*, so in this section we concentrate mainly on what is new and what is different.

The system in FIG. 10*f* has a single linear actuator 508, which is equivalent to the linear actuator 508 of the BCAA in FIG. 8*a*. Further, it is equivalent in stroke and specification to the main linear actuator 508*a* in FIGS. 10*d* and 10*e*. The distal end of the actuator screw 514 is attached to the lock 118. The support bracket 1094 attaches the lock 118 to the single action pneumatic cylinder 128. The main arm 1030 is supported by the subassembly of the connecting rod 114 and piston 130, the subassembly of the force rod 112, force sensor 120, and lock 118, or the combination of the two depending upon the state of the system. The apparatus attached to the distal end of the linear actuator 508 and that is coupled to the main arm 1030 is equivalent to the balance mechanism of FIG. 1(*a*).

In order to put the main arm 1030 into a compliant ready condition, the following sequence may be used ("Compliant Ready Sequence 4"):

Compliant Ready Sequence 4 (as Illustrated in FIG. 15(*h*))
1. Unlock the lock 118, as illustrated in step 1570.
2. Vent air from the cylinder 128 so that the extended compliance stop 522 comes to bear against the lock 118, as illustrated in step 1571.
3. Inject air into the cylinder 128 increasing the cylinder air pressure to a point to cause the piston 130 to break away and move upwards, as illustrated in step 1572.
4. While monitoring the position sensor 1046, continue to adjust the cylinder air pressure causing the piston 130 and consequently the connecting 114 and force rods 112 to continue to move, as illustrated in step 1573.
5. When the force rod 112 arrives at the compliant neutral position relative to the lock 118, lock the lock 118 and stop adjusting air pressure in the cylinder 128, as illustrated in step 1574.
6. Perform the balance sequence, as illustrated in step 1575.

If the balance sequence force threshold is less than the combined static friction and break away force of the piston 130, then the lock 118 may be unlocked and left unlocked as the actuator 508 is used to drive the main arm 1030 and its supported load to the desired vertical location. As discussed previously, this is preferred. Otherwise the lock 118 should be kept locked until a ready to dock position with the load partially supported by the dock apparatus (or other suitable and desired condition) is achieved.

FIGS. 10*a* and 10*b* both have a manipulator with a telescoping column 1000 similar to the telescoping column described in PCT application PCT/US01/06456 due to Holt et al. In FIG. 10*a* a BCAA of the type shown in FIG. 8*a* is used to provide balance and compliance; whereas, a BCAA of the type shown in FIG. 6*a* is used for this purpose in FIG. 10*b*. The following discussion pertains to both figures in general. Specific differences based on the type of BCAA are pointed out where necessary.

The main arm 1030 is slidingly attached to the upper segment 1001 of the telescoping column 1000 using a linear guide rail 1058 and linear guide bearings(not shown). This provides a vertical vernier motion of the main arm 1030 of approximately .+−.1 inch relative to the upper segment 1000. Upper and lower main arm stops, 1032 and 1054 respectively, provide limits to the travel of the main arm 1030 relative to the upper segment 1000. The test head (not shown) is coupled to the main arm 1030 via any number of well-known means (also not shown). Thus the main arm 1030 supports the load.

A first linear actuator 508*a* moves the middle segment of the column 1002 vertically with respect to the fixed lower segment 1004 and base 1003. A second linear actuator 508*b* is mounted to a first support bracket 1034 attached to the middle segment 1002, and it moves the upper segment 1001 vertically with respect to the middle segment 1002. Extension and retraction of the telescoping column 1000 provides first vertical positioning of the load. The vernier motion of the main arm 1030 between the upper 1032 and lower stops 1054 is used for compliant vertical motion in docking.

A BCAA 508*c* is coupled between a second support bracket 1040 attached to the upper segment 1001 and the main arm 1030. A BCAA 508*c* of the type used in FIG. 8*a* is used in FIG. 10*a*, and a BCAA 508*c* of the type used in FIG. 6*a* is used in FIG. 10*b*. In either case, the BCAA 508*c* is used to the control the vertical vernier motion and to provide compliance over the full range of vertical vernier motion.

A compliant ready condition in this system is similar to that of a system with a fixed column 1000 such as in FIGS. 10*d* and 10*e*. In addition, however, it is necessary to position the main arm 1030 to a specified generally central location between the upper 1032 and lower main arm stops 1054 (or in the absence of a lower stop 1054 to a position that is a specified distance removed from the upper stop 1032). We refer to that position of the main arm 1030 as a complaint neutral position.

The conditions for a compliant ready condition may then be stated as follows:
1. The air pressure in the pneumatic cylinder 128 must be such that the connecting rod 114 and piston 130 bear essentially the entire load of the main arm 1030 and its load.
2. The lock 118 must be in a compliant neutral position with respect to the extended 522 and retracted 524 compliance stops (normally mid way between the two),
3. The piston 130 is in a compliant neutral position with respect to its cylinder 128, and
4. The main arm 1030 must be in a compliant neutral position with respect to upper 1032 and lower 1054 main arm stops (normally mid way between the two).

Achieving the joint positioning requirements of the lock 118 and piston 130 in items 2 and 3 of the above list in FIGS. 10*a* and 10*b* is the same as previously described in reference to FIGS. 10*d* and 10*e*. In particular, it can be achieved by design in FIG. 10*a* as the lock 118 is attached to the cylinder 128 through the bracket 1052, and either knowledge of the position of the BCAA actuator 508*c* or of the piston 130 is needed in FIG. 10*b*.

To provide a general solution to the need to jointly position the main arm 1030 with the combination of the lock 118 and piston 130, a position sensor 1056 is shown in FIGS. 10*a* and 10*b* that senses the position of the main arm 1030 relative to the upper segment 1001. It is noted that this sensor 1056 also effectively indicates the position of the piston 130 relative to the cylinder 128 in FIG. 10*b* (but not in 10*a*). Consequently, the sensors 1056 combined with position sensors 1046 shown are sufficient to provide all necessary position sensing for general solutions in both FIGS. 10*a* and 10*b*.

Alternatively, and in view of overall cost and, the system may preferably be designed so that the main arm 1030 is in its compliant neutral position when the BCAA actuator 508*c* is fully extended and the lock 118 is also in its compliant neutral position. With this constraint, the main arm position sensor 1056 may be deleted from both FIG. 10*a* and 10*b*. However, it will be necessary to include a means of detecting when the BCM actuator 508*c* is fully extended. Typical solutions to this were discussed in reference to FIGS. 10*d* and 10*e*.

The following sequence of operations may be used to place the apparatus in a compliant ready condition ("Compliant Ready Sequence 5")

Compliant Ready Sequence 5 (as Illustrated in FIG. 15(*i*))
1. Perform balance sequence, as illustrated in step 1580.
2. Unlock the lock 118 and position the lock 118 to the compliant neutral position using the BCAA actuator 508*c*, as illustrated in step 1581*a*.
3. If the system is of the type shown in FIG. 10*b*, then lock the lock 118 and position the piston 130 to its compliant neutral position using the BCAA actuator 508*c*, as illustrated in an alternative embodiment in step 1581*b*.

4. If the main arm 1030 is not already in its compliant neutral position (by design, for example), then lock the lock 118 and move the main arm 1030 to its compliant neutral position using the BCAA actuator 508c, as illustrated in step 1582.

5. If the force sensor 120 indicates that the force in the force rod 112 is greater than the threshold force, perform a balance sequence, as illustrated in step 1583.

6. If the lock 118 is locked, it may be unlocked, as illustrated in step 1584.

Notice that steps 1581 and 1584 require that the force threshold be less than the combined static friction and break-away force of the piston 130. As in the cases of FIGS. 10d and 10e, this is the preferred criterion for the system. With this being the case, the lock 118 may be unlocked and left unlocked as the main arm 1030 and its supported load is driven to the desired vertical location. Furthermore, as described in PCT application PCT/US01/06456 due to Holt et al, either of the two position sensors 1046 and 1056 can be used to detect motion of the main arm 1030 relative to the upper segment 1001 that is indicative of encountering an obstruction.

In the case that the system is designed such that the force threshold is not necessarily less than the combined static friction and break-away force of the piston 130, then Compliant Ready Sequence 2 or Compliant Ready Sequence 3 may be adapted to replace the first three steps of Compliant Ready Sequence 5. The resulting sequences are provided below. Notice that in this case it is generally necessary to keep the lock 118 locked while positioning the load, and the position sensors 1046 and 1056 cannot be used to detect obstructions to motion. In any case, however, the force sensor 120 may be used to detect obstructions to motion.

Compliant Ready Sequence 6 (as Illustrated in FIG. 15(*j*)) (Applicable to FIGS. 10a and 10b, where Pneumatic Cylinder 128 is Used in Positioning the Lock 118 and the Balance Threshold is Greater than Static Friction and Break Away Forces).

1. Unlock the lock 118, as illustrated in step 1590.

2. Vent air from the cylinder 128 so that the extended compliance stop 522 comes to bear against the lock 118, as illustrated in step 1591.

3. Adjust the BCAA actuator 508c so that it is near the center of its stroke or near its desired compliant neutral position, as illustrated in step 1592 (This step requires the use of well known solutions including the use of position sensors to sense the position of the actuator's driven element 514c relative to its stationary element 506c. In some instances actuators 508c are equipped with limit switches to detect when the driven element 514c reaches the end of its travel; these may be used in conjunction with timers in known ways to achieve the desired result.)

4. Inject air into the cylinder 128 increasing the cylinder air pressure to a point to cause the piston 130 to break away and move upwards, as illustrated in step 1593.

5. While monitoring the position of the force rod 112 relative to the lock 118 with the shown position sensor 1046, continue to adjust the cylinder air pressure causing the piston 130, and consequently the connecting rod 114 and force rod 112, to continue to move, as illustrated in step 1594.

6. When the force rod 112 arrives at the compliant neutral position with respect to the lock 118, lock the lock 118 and stop adjusting the air pressure in the cylinder 128, as illustrated in step 1595a.

7. If the system is of the type shown in FIG. 10b, position the piston 130 to its compliant neutral position using the BCAA actuator 508c, as illustrated in an alternative embodiment in step 1595b.

8. If the main arm 1030 is not already in its compliant neutral position (by design, for example), then lock the lock 118 and move the main arm 1030 to its compliant neutral position using the BCAA actuator 508c, as illustrated in step 1596.

9. Perform the Balance Sequence, as illustrated in step 1597.

Compliant Ready Sequence 7 (as Illustrated in FIG. 15(*k*)) (Applicable to FIGS. 10a and 10b, where Piston 130 can Bear on the Bottom of the Cylinder 128 and the Balance Threshold is Greater than Static Friction and Break Away Forces).

1. Retract the BCAA actuator 508c to a position that will allow the piston 130 to reach the bottom of its stroke within the cylinder 128, as illustrated in step 1600. (Depending upon design this could be determined by limit switches incorporated within the actuator 508c, by driving the actuator 508c in the retracting direction for a sufficient length of time to reach a fully retracted condition, or other known techniques.)

2. Unlock the lock 118, as illustrated in step 1601.

3. Vent air from cylinder 128 so that the piston 130 comes to bear against the bottom of the cylinder 128, as illustrated in step 1602.

4. Position the lock 118 to its compliant neutral position using the BCAA actuator 508c, as illustrated in step 1603.

5. Lock the lock 118 and use the BCM actuator 508c to raise the load to a position where the piston 130 is in its compliant neutral position (normally approximately centered) with respect to the cylinder 128, as illustrated in step 1604.

6. If the main arm 1030 is not already in its compliant neutral position (by design, for example), then lock the lock 118 and move the main arm 1030 to its compliant neutral position using the BCAA actuator 508c, as illustrated in step 1605.

7. Perform the Balance Sequence, as illustrated in step 1606.

FIG. 10c is also a manipulator having a telescoping column 1000 similar to the telescoping column described in PCT application PCT/US01/06456 due to Holt et al. As before, the main arm 1030 is slidingly attached to the upper segment 1001 using a linear guide rail 1058 and linear guide bearings(not shown). This provides a vertical vernier motion of the main arm of approximately .+−.1 inch relative to the upper segment 1001.

A first linear actuator 508a moves the middle segment 1002 of the column 1000 vertically with respect to the fixed lower segment 1004 and base 1003. A BCAA of the type shown in FIG. 8a is adapted to both move the upper segment 1001 with respect to the middle segment 1002 and to provide balance and compliance in the vertical vernier axis.

The stationary element 506b of the second linear actuator 1042 is attached to a first support bracket 1040 that is in turn attached to the middle segment 1002. The distal end of the actuator screw 514b is attached to the BCAA lock 118. The lock 118 is attached to a second support bracket 1076 that is also attached to the upper segment 1001. Accordingly, the linear actuator 508b drives the vertical motion of the upper segment 1001 relative to the middle segment 1002. The pneumatic cylinder 128 of the BCAA is also attached to the second support bracket 1076. The force rod 112 and the connecting rod 114 are used to support the main arm 1030.

It is seen that the apparatus including the second linear actuator 508*b,* pneumatic cylinder 128, piston 130, connecting rod 114, force rod 112, force sensor 120, position sensor 1056, compliance stops 522 and 524, etc. constitutes a BCAA of the type shown in FIG. 8*a*, with the additional feature of having the support bracket 1076 also attached to the movable upper segment 1001.

The conditions for the main arm 1030 being in a compliant ready condition are the same as those for FIGS. 10*a* and 10*b*. However, the situation is simpler because the lock 118 cannot be positioned independently of the upper segment 1001 as it can be in FIGS. 10*a* and 10*b*. The net result is that if the main arm 1030 is in its compliant neutral position, the lock 118 must also be in its compliant neutral position, and conversely. The following sequence may be used to achieve a compliant ready condition ("Compliant Ready Sequence 8")

Compliant Ready Sequence 8 (As Illustrated in FIG. 15(*l*))

1. Unlock the lock 118, as illustrated in step 1610.
2. Vent air from the cylinder 128 so that either the main arm 1030 comes to bear on the lower main arm stop 1054 and/or the extended compliance stop 522 comes to bear on the second support bracket 1076, as illustrated in step 1611. (Note the second support bracket 1076 and lower main arm stop 1054 are both fixed to the upper segment 1001 in this case.)
3. Inject air into the cylinder 128 increasing the cylinder air pressure to a point to cause the piston 130 to break away and move upwards, as illustrated in step 1612.
4. While monitoring the main arm position sensor 1056, continue to adjust the cylinder air pressure causing the piston 130 and consequently the connecting and force rods, 114 and 112 respectively, and main arm 1030 to continue to move upwards, as illustrated in step 1613.
5. When the force rod 112 and main arm 1030 arrive at their compliant neutral position, lock the lock 118 and stop adjusting air pressure in the cylinder 128, as illustrated in step 1614.
6. Perform a balance sequence, as illustrated in step 1615.

If the balance sequence force threshold is less than the combined static friction and break away force of the piston 130, then the lock 118 may be unlocked and left unlocked as the actuator 508*a* is used to drive the main arm 1030 and its supported load to the desired vertical location. Otherwise the lock 118 should be kept locked until a ready to dock position with the load partially supported by the dock apparatus (or other desired condition) is achieved.

From the above it is seen that one position sensor 1056 is sufficient in this case.

Figure 11:
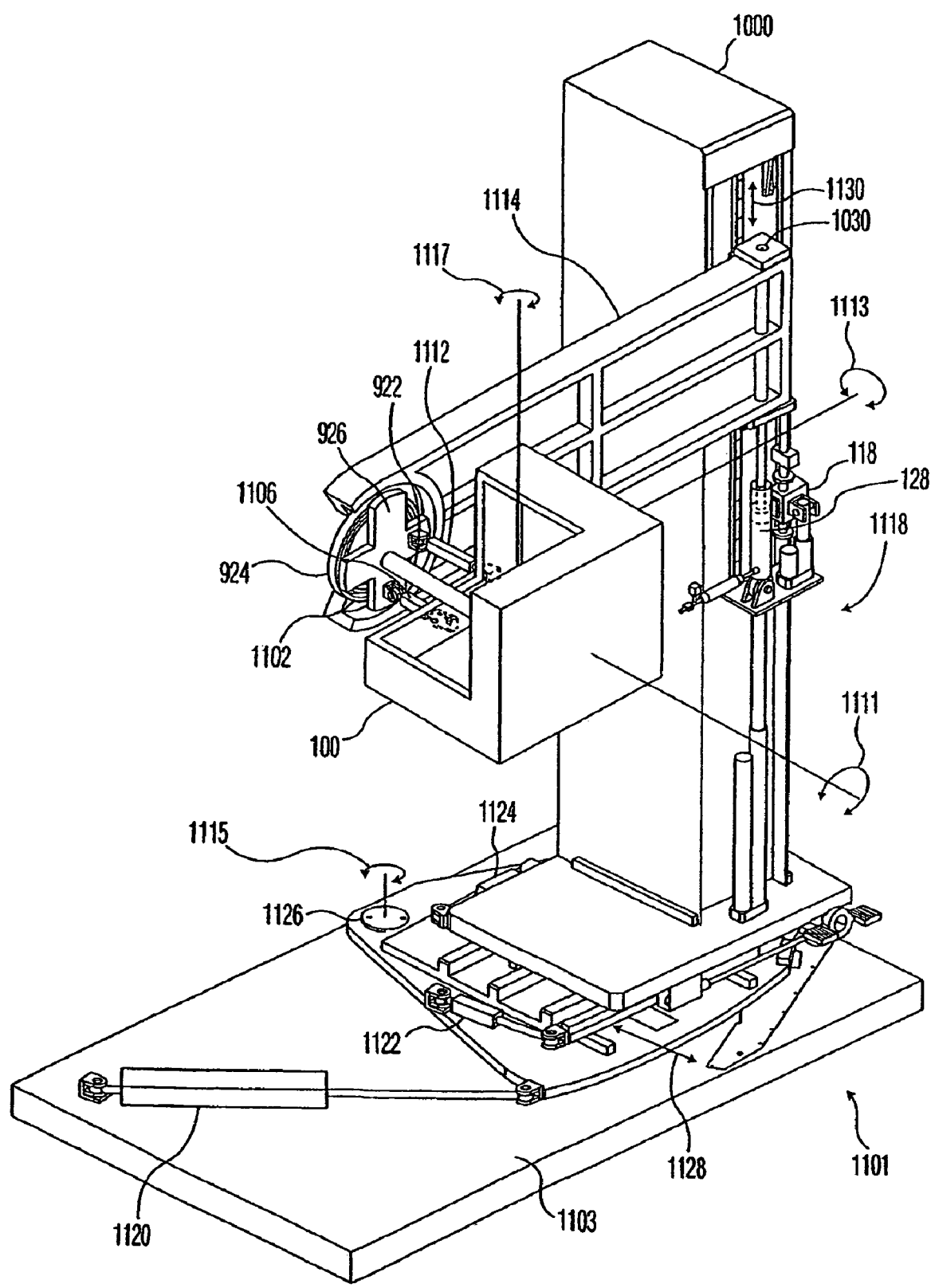
FIG. 11 is a perspective view of a test head manipulator having a plurality of compliant driving mechanisms in accordance with yet another exemplary embodiment of the present invention.

FIG. 11 illustrates several of the various exemplary embodiments of the invention utilized in a single test head manipulator 1101. The manipulator 1101 in FIG. 11 has a base 1103 as described in U.S. patent application Ser. No. 09/646,072 due to Holt et al., a fixed column 1000, and a main arm 1030 supporting a test head 100 of the type previously illustrated in FIG. 9(*b*). (Note the test head 100 in FIG. 11 is shown in a cut away view and the docking hardware—as well as the internal pitch and yaw rotation mechanisms—shown in FIG. 9(*b*) are not repeated in FIG. 11 for simplicity reasons.) The manipulator 1101 has seven motion axes, three translational axes and four rotational axes. The translational axes are in-out 1128, side-to-side 1126, and up-down (or vertical) 1130. The rotational axes are swing 1115 rotation of the base and pitch 1113, yaw 1117, and roll 1111 rotation of the test head 100. Typical motion requirements are .+−.10 inches in-out .+−.5 inches side-to-side, 30 inches vertical, 30 or more degrees swing, .+−.95 degrees roll, .+−.5 degrees pitch, and .+−.5 degrees yaw. In this embodiment, motion of all of the manipulator axes is powered by motor driven actuators. The actuators are controlled by a central controller(not shown) to effect movement of the test head 100 from one position and orientation to another within the manipulator's 1101 motion envelope. Any of a number of techniques for effecting control over the plurality of axes to control the movement may be utilized. Appropriate position sensors are used on all axes to provide feedback to the controller.

In this manipulator 1101, a cable pivot ring assembly 924 is mounted at the end of a support bracket 1114, which is attached to the main arm 1030. The test head 100 is supported by a test head support beam 922, which is fixed to a test head mount 926. The test head mount 926 is coupled to the rotatable ring 1102 of the cable pivot ring 924, such that the centerline of the support beam 922 passes through the center of the rotatable ring's 1102 rotation and is perpendicular to the plane of the rotatable ring 1102. The apparatus is configured to enable the test head 100 to rotate .+−.95 degrees about the axis defined by the centerline of the support beam 922; this is the roll axis 1111 of motion.

In FIG. 11, the roll axis 1111 passes through the center of gravity of the test head 100 so that the roll motion is substantially balanced and effectively weightless. Motion of the test head 100 about the roll axis may accordingly be powered with a motor-gearbox-clutch arrangement as described in U.S. patent application Ser. No. 09/646,072 due to Holt et al. When the motor(not shown) is not being driven the clutch is disengaged to allow balanced compliant motion about the roll axis 1111.

The pitch 1113 and yaw 1117 axes of the test head 100 do not pass through the test head's 100 center of gravity. A pitch BCM 932 and a yaw BCAA 930 as illustrated in FIG. 9(*a*) and previously discussed are coupled between the test head 100 and test head mount 926. These are represented schematically in FIG. 11 as mechanism 1106 and mechanism 1112 respectively. The details are the same as in FIG. 9(*a*). These two BCAA's 1106 and 1112 are used to position the test head 100 with respect to its pitch and yaw axes, 1113 and 1117 respectively, as well as to provide balanced, compliant motion for docking and/or manual maneuvering. A range of motion of .+−.5 degrees is provided in both the pitch and yaw axes, 1113 and 1117 respectively.

Vertical motion of the test head 100 may be provided by an arrangement that includes a BCM as previously discussed with alternative implementations shown in FIGS. 10(*d*), 10(*e*) and 10(*f*). In FIG. 11, the arrangement of FIG. 10(*e*) is explicitly shown as mechanism 1118. (Note that the flexible air tubing and high pressure air supply are not shown in FIG. 11.) It is observed that if a telescoping column were used in lieu of a fixed column 1000, an arrangement of one of the types shown in FIG. 10(*a*), 10(*b*) or 10(*c*) could be used. The system in FIG. 11 is designed such that the static friction plus the pneumatic cylinder 128 break away force is greater than the balance force threshold so that the test head 100 can be positioned vertically with the lock 118 unlocked.

The swing motion in the base 1103 is in the horizontal plane and effected by a compliant drive mechanism which is indicated schematically in FIG. 11 as mechanism 1120. Normally, motion in this axis is essentially balanced and not subject to external forces. In this case a compliant drive mechanism of the type shown in any of FIGS. 5(*a*), 5(*b*), 5(*c*) or 7 could be used in principle. Because the swing motion of approximately 30 degrees or more requires a substantially long stroke of the actuator, FIG. 5(*a*) or FIG. 7 would be preferred. However, in certain applications a thick, somewhat resilient test head cable (not shown) connecting the test head 100 to a test cabinet (not shown) can exert a position variable force effecting motion in this axis. In this situation a BCAA could be used as mechanism 1120 to provide drive as well as balanced compliance. A BCAA configuration such as is shown in FIG. 6(b) could be adapted. Also, a BCAA of the type shown in either FIG. 8(a) or 8(b) could similarly be adapted for use in this application.

Similarly, the in-out and side-to-side motions of the base 1103 are also in the horizontal plane. Compliant drive mechanisms for these axes are also indicated schematically in FIG. 11 as mechanism 1122 and mechanism 1124 respectively. Like the swing motion, motion in these axes is essentially balanced and not subject to external forces. The range of motion required in these axes is typically from .+-.5 inches to .+-.10 inches. The mechanism of FIG. 5(a) or FIG. 7 would accordingly be preferred to provide the required stroke. In the event that significant variable cable forces are present in the system, BCAA mechanisms of the types shown in FIGS. 6(a), 6(b), 8(a), or 8(b) could be adapted and utilized to advantage in the horizontal axes.

It is to be noted that the BCM and compliant drive mechanisms shown in FIG. 11 are shown in visible positions to foster clarity of description and discussion. In actual implementations certain mechanisms or portions of them might not be visible from a given viewing point. For example components of mechanisms 1120, 1122 and 1124 are typically located, along with other mechanisms, between the various plates that comprise the manipulators base 1103. Also, as a further example, mechanism 1118 could be located on one side or the other or the rear of the manipulator column 1105.

Information on Docking

An exemplary embodiment of actuator-driven docking is explained by reference to FIG. 11. In FIG. 11, the manipulator 1101 is used to bring the test head 100 into a ready to dock position and then a separate, independent docking actuator(not shown) draws the test head 100 into a final or fully docked position. Guide mechanisms of various types, for example guide pins and holes, kinematic mechanisms, etc., are known to assure that the test head 100 is properly and accurately aligned with the device handler/prober (not shown). The test head 100 must move compliantly with respect to the manipulator 1101 as the actuator is operated. When fully docked, a mechanism, which may be the actuator mechanism, latches the test head securely in position.

As test heads 100 have become larger, the basic idea of the '815 dock has evolved to provide docks having three or four sets of guide pins 912, guide pin receptacles 912a, and circular cams 910 interconnected by cables 915. FIGS. 12(a), 12(b), 12(c), and 12(d) of the present application illustrate a dock having 4 guide pin 912 and hole (receptacle) 912a combinations and four circular cams 910. Although such four point docks have been constructed having an actuator handle attached to each of the four cams 910, the dock shown incorporates a single actuator handle 914 attached to cable driver 917. When cable driver 917 is rotated by docking handle 914, the cable 915 is moved so that the four cams 910 rotate in a synchronized fashion. This arrangement places a single actuator handle in a convenient location for the operator. Also greater mechanical advantage can be achieved by appropriately adjusting the ratio of the diameters of the cams 910 to the diameter of the cable driver.

Figure 12A:
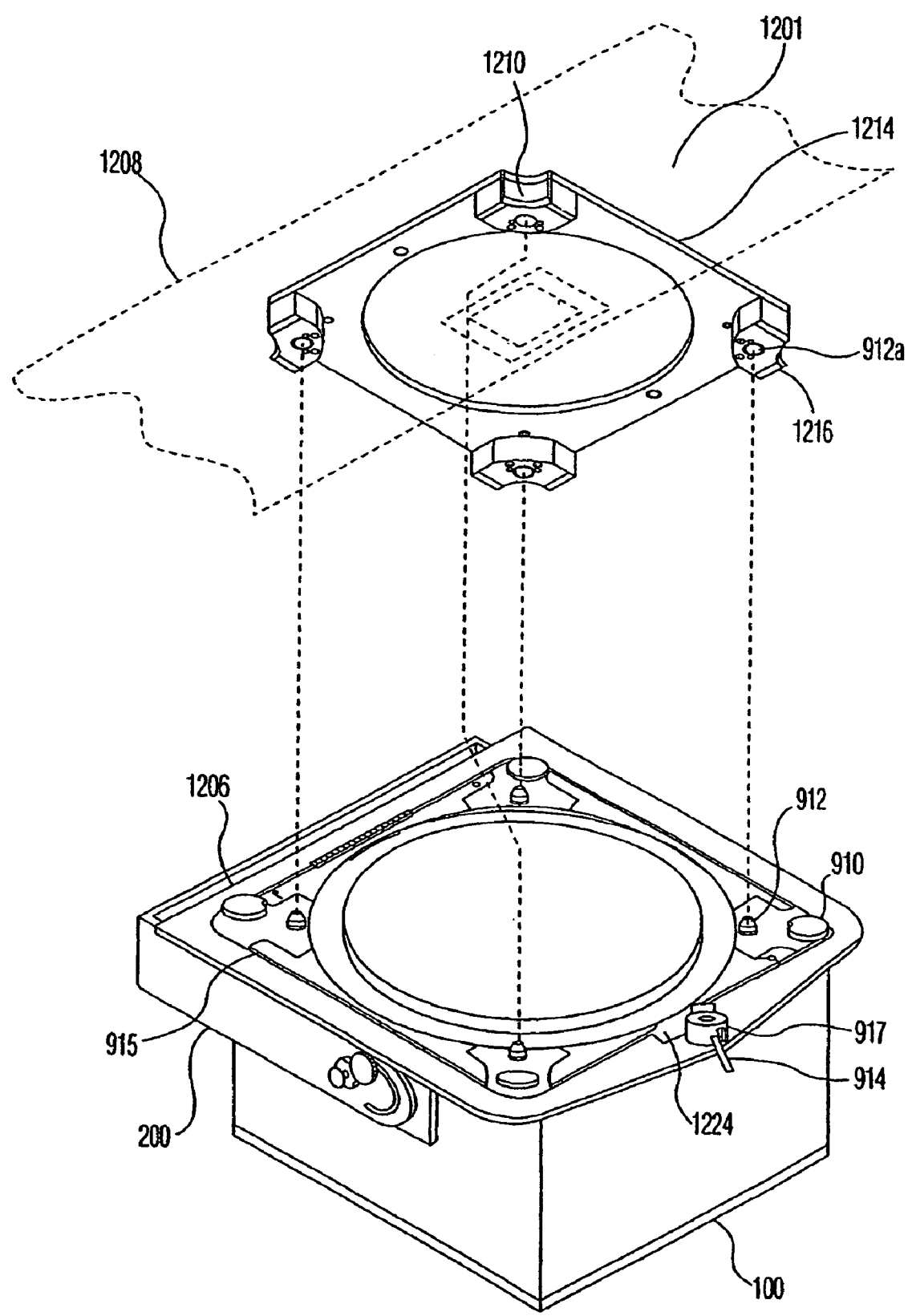
FIG. 12(a) is a perspective view of a docking apparatus for docking a test head with a handler in accordance with an exemplary embodiment of the present invention.
Figure 12B:
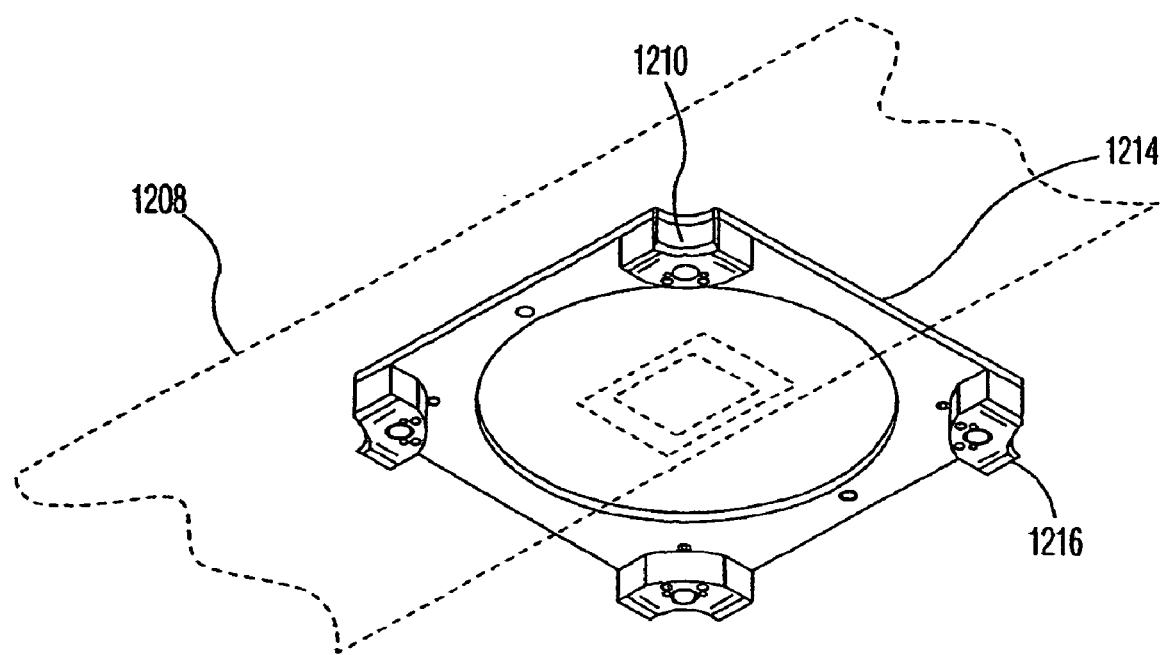
FIG. 12(b) is a perspective view of a docking apparatus coupled to a handler in accordance with an exemplary embodiment of the present invention.

FIGS. 12(a) through 12(d) are now considered in more detail. FIG. 12(a) shows in perspective a test head 100 held in a cradle 200, which is in turn supported by a manipulator (not shown). Also shown is a cut away segment of a device handler 1208 to which the test head 100 may be docked. FIG. 12(b) shows device handler 1208 in somewhat larger scale and greater detail. (The reader is reminded once again that the term "handler" is used without loss of generality to refer to any of the various test apparatuses including packaged device handlers, wafer probers, and the like.) Briefly looking ahead to the sectional view in FIG. 12(c), it is seen that the test head 100 has electrical interface 1226, and the device handler 1208 has a corresponding electrical interface 1228. Electrical interfaces 1226 and 1228 typically have hundreds or thousands of tiny, fragile electrical contacts that must be precisely engaged in a manner to provide reliable corresponding individual electrical connections when the test head is finally docked. As is shown in this exemplary case, the lower surface of device handler 1208 contains the handler electrical interface 1228, and the test head 100 is docked with a generally upward motion from below. Other orientations are possible and known including: docking to a top surface with a downward motion, to a vertical plane surface with horizontal motion, and to a plane that is at an angle to both the horizontal and vertical.

Returning to FIGS. 12(a) and 12(b), the complete four point docking apparatus is shown; portions of it are attached either to the device handler 1208 or to the test head 100. Attached to test head 100 is faceplate 1206. Four guide pins 912 are attached to and located near the four corners of faceplate 1206. Face plate 1206 has a central hole and is attached to test head 100 so that the test head electrical interface 1226 projects through the hole and guide pins 912 define an approximate rectangle that has an approximate common center with electrical interface 1226.

Gusset plate 1214 is attached to the lower surface of the device handler 1208. Gusset plate 1214 has a central hole and is attached to device handler 1208 so that the handler electrical interface 1228 projects through the hole. Four gussets 1216 are attached to gusset plate 1214, one located near each of its four corners. Each gusset 1216 has a guide pin hole or receptacle 912a bored in it. Each guide pin hole 912a corresponds to a respective guide pin 912. These are arranged so that when docked, each guide pin 912 will be full inserted into its respective guide pin hole 912a. Thus the guide pins 912 and guide pin holes 912a provide alignment between the test head and the device handler.

Four docking cams 910 are rotatably attached to the face plate 1206. Cams 910 are circular and are similar to those described in the '815 patent. In particular each has a side helical groove around its circumference with an upper cutout on the upper face. Each docking cam 910 is located in proximity to a respective guide pin 912 such that it is generally centered on a line extending approximately from the center of the test head electrical interface 1226 through the respective guide pin 912 such that guide pin 912 lies between cam 910 and the test head electrical interface 1226. The gussets 1216 and the corners of the gusset plate 1214 have circular cutouts such that when the guide pins 912 are fully inserted into guide pin holes 912a in the gussets, the circumference of each cam 910 is adjacent to and concentric with the circular cutout in its respective gusset 1216. This arrangement provides an initial course alignment between the docking components as the test head 100 is first maneuvered into position for docking with device handler 1208.

A circular cable driver 917 with an attached docking handle 914 is also rotatably attached to face plate 1206. Docking cable 915 is attached to each of the cams 910, and to cable driver 917. Pulleys 1224 appropriately direct the path of the cable to and from cable driver 914. Cable driver 917 can be rotated by means of applying force to handle 914. As cable driver 917 rotates it transfers force to cable 915 which in turn causes cams 910 to rotate in synchronism.

Figure 12C:
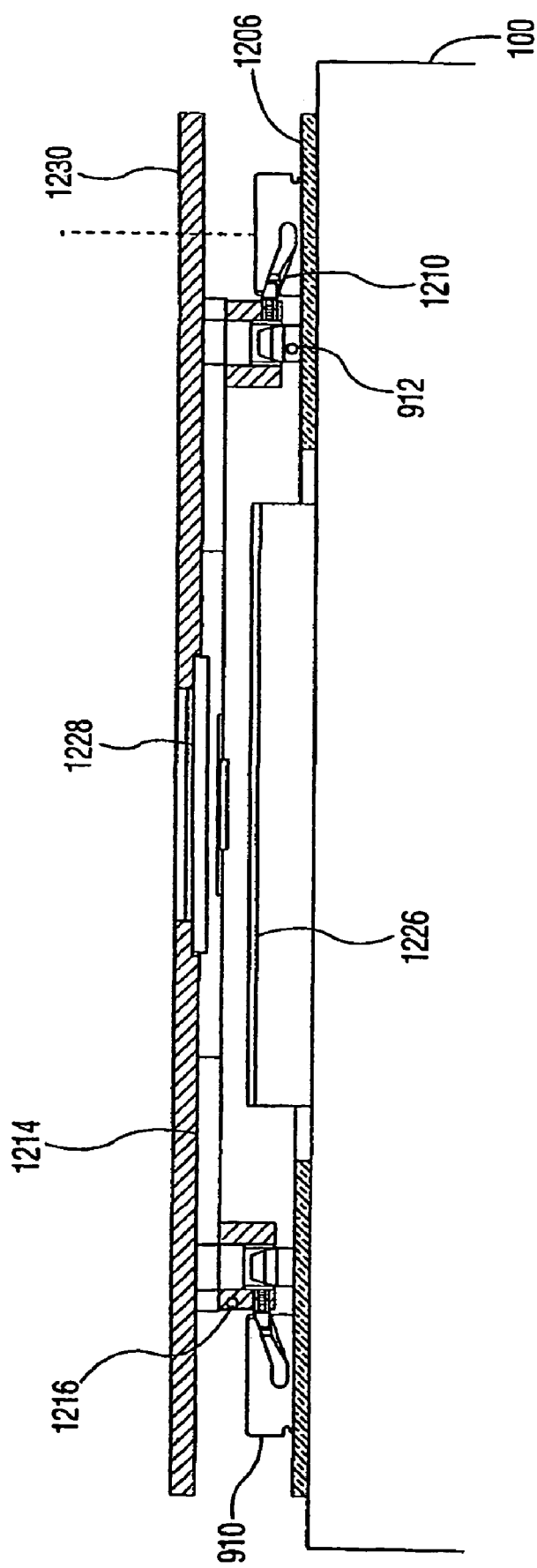
FIG. 12(c) is a sectional view of a docking apparatus for docking a test head with a handler in accordance with an exemplary embodiment of the present invention.

Extending from the circular cutout of each gusset 1216 is a cam follower 1210. Cam follower 1210 fits into the upper cutout on the upper face of its respective cam 910. FIG. 12(c) shows in cross section one stage in the process of docking test head 100 with handler 1208. Here guide pins 912 are partially inserted into guide pin holes 912a in gussets 1216. It is noted that in this exemplary case, guide pins 912 are tapered near their distal ends and are of constant diameter nearer to their point of attachment to face plate 1206. In FIG. 12(c) guide pins 912 have been inserted into guide holes 912a to a point where the region of constant diameter is just entering the guide pin holes 912a. Also in FIG. 12(c), each cam follower 1210 has been inserted into the upper cutout on the upper face of its respective cam 910 to a depth where it is at the uppermost end of the helical cam groove. In this configuration, the dock is ready to be actuated be applying force to the handle and rotating the cams. Accordingly this configuration may be referred to as the "ready to actuate" position.

Figure 12D:
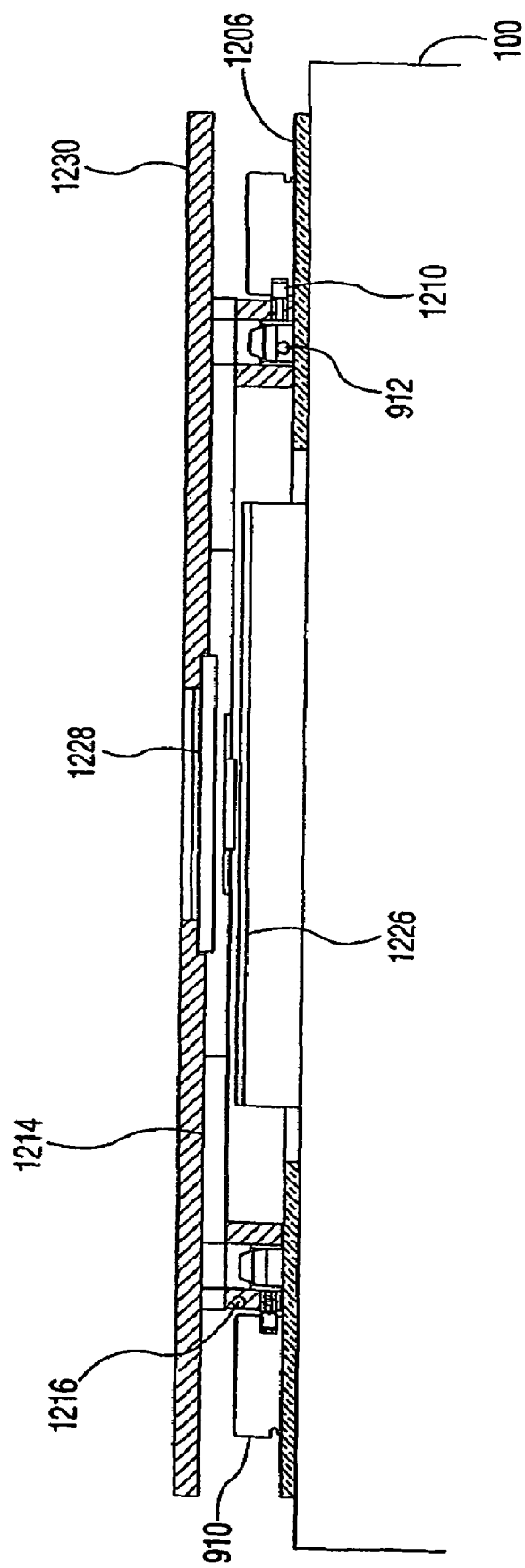
FIG. 12(d) is another sectional view of a docking apparatus for docking a test head with a handler in accordance with an exemplary embodiment of the present invention.
Figure 13A:
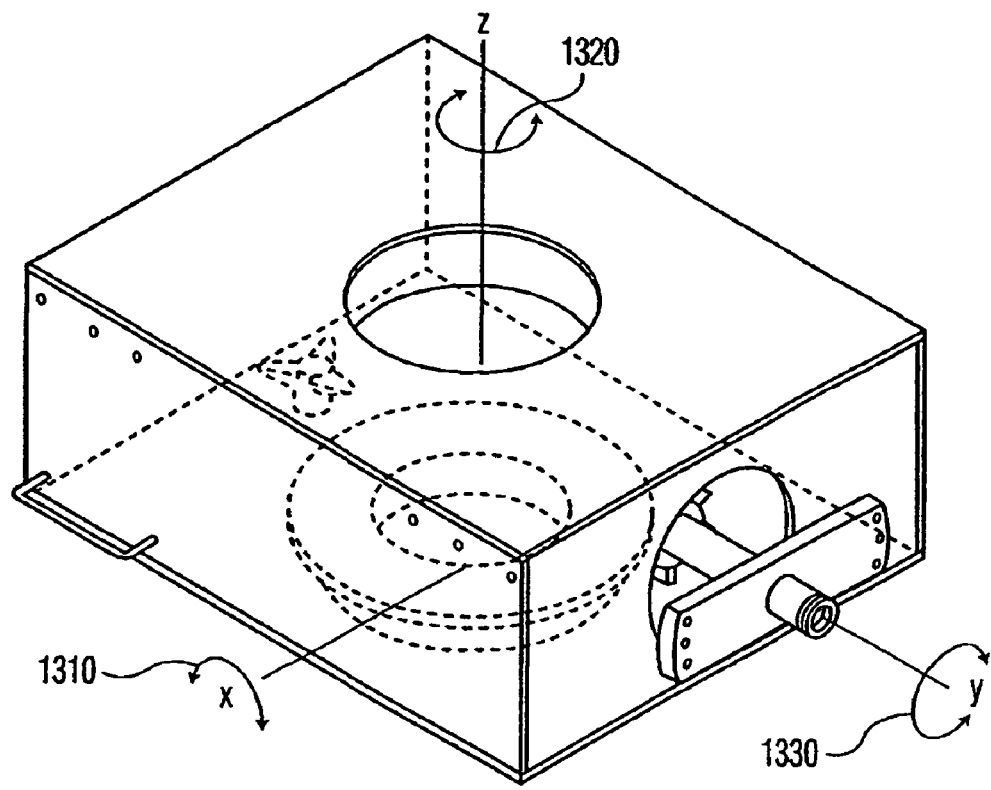
FIG. 13 is an assembly drawing for a prior art test head.
Figure 13B:
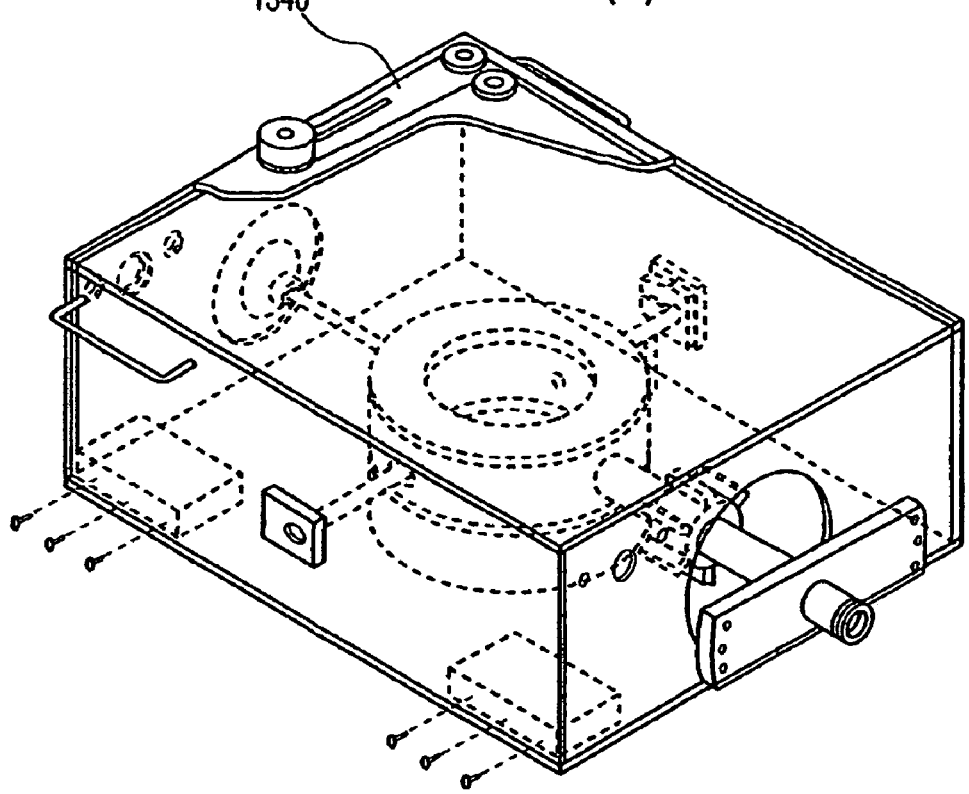
Figure 13C:
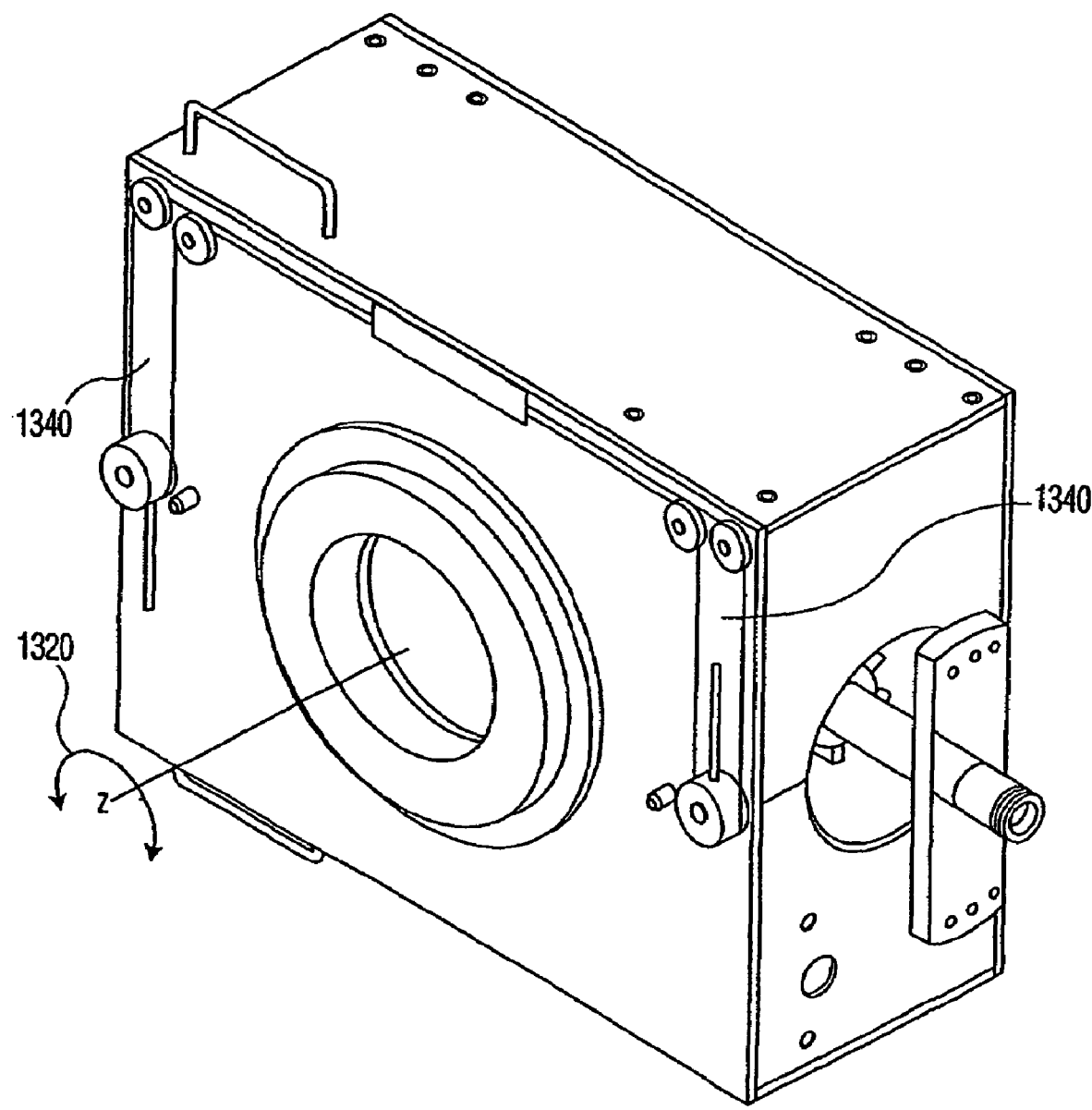

FIG. 12(d) shows in cross section the result of fully rotating cams 910. The test head 100 is now fully docked with handler 1208. It is seen that cams 910 have been rotated and have caused cam followers 1210 to follow the helical grooves to a point in closer proximity to faceplate 1206. In addition, guide pins 912 are fully inserted into their respective guide pin holes 912a. It is observed that the closeness of the fit between the constant diameter region of guide pins 912 and the sides of the respective guide pin holes 912a determines the final alignment between the handler electrical interface 1228 and the test head electrical interface 1226.

Figure 14:
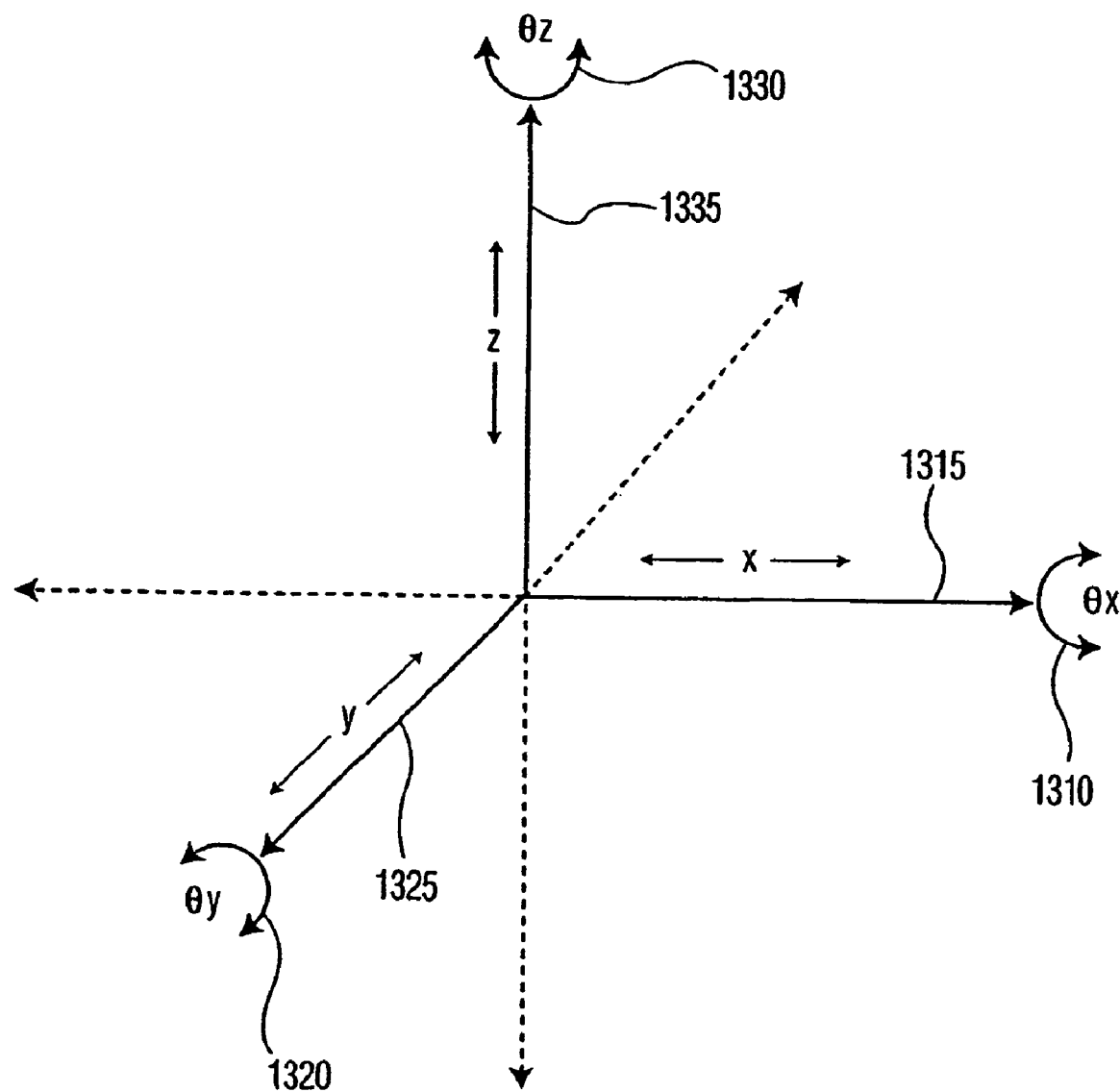
FIG. 14 is an illustration of six motion axes.

In light of the foregoing discussion, it is now appropriate to more fully discuss the docking process and define certain terms. The purpose of docking is to precisely mate the test head electrical interface 1226 with the handler electrical interface 1228. Each electrical interface 1226 and 1228 defines a plane, which is typically, but not necessarily, nominally parallel with the distal ends of the electrical contacts. When docked these two planes must be parallel with one another. In order to prevent damage to the electrical contacts, it is preferred to first align the two interfaces 1226 and 1228 in five degrees of freedom prior to allowing the electrical contacts to come into mechanical contact with one another. If in the docked position the defined planes of the interfaces are parallel with the X-Y plane of FIG. 14, alignment must occur in X, Y and Theta Z in order for respective contacts to line up with one another. Additionally, the two planes are made parallel by rotational motions in Theta X and Theta Y. The process of making the two electrical interface planes parallel with one another is called "planarization" of the interfaces; and when it has been accomplished, the interfaces are said to be "planarized" or "co-planar." Once planarized and aligned in X, Y and Theta Z, docking proceeds by causing motion in the Z direction perpendicular to the plane of the handler electrical interface 1228. In the process of docking, test head 100 is first maneuvered into proximity of the handler 1208. Further maneuvering brings the circular cutouts of the gussets 1216 into a first alignment with the cams 910. This position, or one just prior to it, may be considered to be the "ready to dock" position. More generally, "ready to dock" refers to a position where some first course alignment means is just barely engaged or approximately in position to be engaged. At this stage and depending upon design details, the distal end of the guide pins are ready to enter their respective guide holes. Still further maneuvering will bring the test head to a "ready to actuate position," which was discussed previously in terms of FIGS. 12(a) through (d). More generally, "ready to actuate" refers to a position where a test head has achieved a position where a docking apparatus may be actuated. At the ready to actuate position, approximate planarization and alignment in X, Y and Theta Z have been achieved. As the dock is actuated and the guide pins 912 become more fully inserted into their respective guide-pin holes 912a, alignment and planarization become more precise.

In general the ready to actuate position is a position where the alignment mechanisms in the two halves of the dock have become at least partially engaged and alignment in some, but not necessarily all, axes has been achieved. For example in docks of the type described in the '815 patent and those of the type shown in FIGS. 9(a) and (b) and 12(a) through (d), this is the position described above where the tapered guide pins 912 have become further inserted in the guide pin holes 912a and so that cam followers 1210 on the handler 1208 have become inserted in the docking cams 910. In so doing the, the test head 100 typically becomes aligned within a few thousandths of an inch and within approximately one degree of coplanarity with the target apparatus. As another example, in the dock described in U.S. Pat. No. 5,982,182 (included by reference), this is a position where kinematic contacts have engaged and the system is ready for final linear motion perpendicular to the target.

Solutions to the above are available with the balancing system described herein in FIGS. 1(a) through 4(b) (described in Ny et al., U.S. Provisional Application No. 60/234,598) and with the BCAA also described herein in FIGS. 6(a) through 9(b). These have several common aspects; in one view the balancing system is a component of a BCAA. Accordingly, BCAA's and/or balancing systems can be added to the manipulator and test head 100 as required to provide balance and compliance where needed or desired.

As described previously in this application, the test head 100 may be brought to and locked in a compliance neutral position prior to docking. The axis or axes may be balanced and made compliance ready immediately prior to final docking in close proximity to the docking system. Because this is accomplished with the lock(s) 118 locked, there is no risk of sudden, unexpected, potentially dangerous motion of the test head 100. Then with the system in a compliant ready state, the lock 118 is unlocked to allow compliant motion and docking proceeds.

As indicated earlier herein, pressure sensors (606a, 606b) may be included and arranged to measure the air pressure at each inlet of the pneumatic cylinder 128. The controller(not shown) receives signals from the pressure sensors indicating the measured pressure. The use of the pressure sensors to restore a balanced condition prior to undocking was previously described herein. Without this approach, normal operation is to undock the test head 100 with the balance system lock locked, which foregoes the opportunity for compliant motion while undocking.

The pressure sensors (606a, 606b) may also be used in a system to maintain a balanced condition during the entire time that the test head 100 is docked and while testing proceeds. To accomplish this, the test head 100 is brought to a position where it is ready to be docked. All of the axes having balancing systems or BCAAs are brought to a compliance ready condition. That is they are balanced and positioned in the compliance neutral region. The pressures in the pneumatic cylinder 128 are then measured and recorded by the controller. The locks 118 are then released and the test head 100 is docked. According to the type of docking system and the application, the locks 118 may or may not be re-locked when the test head 100 is finally docked. While the test head 100 is docked, the controller continuously monitors the pressures in the pneumatic cylinders 128, compares them to the recorded values, and operates the valves 604 so as to maintain the cylinder pressures essentially constant. This maintains an essentially constant force on the piston 130 and connecting rod 114 and keeps the system in the desired balanced condition. Clearly, the test head 100 may be undocked with compliant motion available in a balanced condition.

To be more specific, whether the docking system is of the latched or non-latched type will determine the modes of operation that are available. A latched dock offers the alternative between two modes of operation as follows:

1. Balance maintained (as described above) with locks 118 unlocked while the test head 100 is docked. Balance and the opportunity for compliant motion with the locks 118 unlocked is preserved while undocking.

2. Balance not maintained with locks 118 locked while the test head 100 is docked. There are two sub-options for undocking:

a. Balance is restored before undocking, and the opportunity for compliant motion with the locks 118 unlocked is preserved while undocking.

b. Balance is not restored and the locks 118 must be kept locked while undocking. This approach does not require pressure sensors.

In a non-latched docking system it is generally necessary to lock the locks 118 while the test head 100 is docked. Balance may or may not be restored prior to undocking depending upon the need for compliant motion.

Consider operation in a system that uses latched, actuator-driven docking. This is presently the most widely used type of system. Basic two-point docking apparatus, such as described in U.S. Pat. No. 4,589,815, can be extended to include three or four sets of guide pins 912, guide pin holes 912*a* and a cable driver as shown in FIGS. 9(*a*), 9(*b*), and 12(*a*) through (*d*), which were previously described. Such two, three and four point docks are widely used in industry for this purpose. Although such apparatus is actuated manually by the operator applying force to a docking handle 914, other types of docking actuators including motors, electrical or pneumatic linear actuators, and/or vacuum operated devices are known. Generally, the test head 100 will be docked with a packaged device handler, wafer prober, or possibly other apparatus, which are collectively referred to by the term handler 1208 or as the "target apparatus." The following sequence may be followed for docking:

The system is prepared to maneuver the test head 100 or load to a ready to dock position from a starting point that is apart from the target apparatus, as illustrated in FIG. 15(*m*).

a. The compliant drives and/or BCAAs on the horizontal (in-out, side-to-side, and swing) axes are brought to a compliant ready condition, and their locks 118 are locked, as illustrated in step 1620.

b. The pitch and yaw BCAAs are brought to a compliant ready condition, and their locks 118 are locked, as illustrated in step 1621.

c. The BCAA in the vertical drive mechanism is brought to a compliant ready condition (using Compliant Ready Sequence 1), and its lock 118 is unlocked, as illustrated in step 1622.

d. The test head or load 100 is now maneuvered to a ready to dock position with the target apparatus, as illustrated in step 1623. To do so, the controller controls the actuators to move the test head 100 along a path of motion to bring it to a ready to dock position. In general this is a position where alignment mechanisms in the two halves of the dock have come into close proximity or initial contact, but are not fully engaged. For example, in many types of docks having guide pins 912, this is a position where the docking guide pins 912 have come into proximity with or have just engaged their mating docking guide pin receptacles 912*a* in the target apparatus. The controller may use algorithms to effect this, or an operator may guide the process by using pushbuttons, joysticks, and/or other suitable input devices to the controller.

From Ready to Dock to Fully Docked e. Preparation: All axes of the manipulator having BCAAs are re-balanced. Each BCAA is balanced in turn, as illustrated in step 1624. Balancing a particular BCAA may upset the balance of some other BCAA. Accordingly, the process is repeated until the force sensor 120 of each BCAA indicates a balanced condition. (Typically this goal is achieved in three or less iterations, and usually in two iterations.)

f. If pressure sensors are incorporated in any of the BCAAs, the present pressure is read by the controller and stored in the controller's memory for later use, as illustrated in step 1625.

g. The locks 118 are all unlocked, allowing balanced-compliant motion in all axes, as illustrated in step 1626. (Note that, by design, the clutch of the roll axis motor is disengaged automatically whenever the motor is not actuated and the roll axis is not being driven as described in U.S. patent application Ser. No. 09/646,072 due to Holt et al. The test head 100 or load is now in a balanced-compliant condition and it can be maneuvered by external means with a force of typically less than 25 to 30 pounds.

h. The test head 100 is further maneuvered to a ready to actuate position. This is an overall motion of typically less than one inch, and maneuvering may be and typically is done manually. However, in a more sophisticated system the controller (not shown) may be used to urge the test head 100 into this ready to actuate position. To do so the controller urges the test head 100 along a straight line path that is perpendicular to the plane of the handler (or other target device) electrical interface 1228. The appropriate axis or axes for motion is or are selected (vertical for horizontal docking, in-out or side-to-side for vertical plane docking, or a combination of vertical and in-out or side-to-side for inclined docking), the lock(s) 118 locked, and the actuator(s) used to urge the test head 100 into position, whence the locks 118 are again unlocked. (The other axes are left unlocked to permit the necessary compliant motion, and this allows the test head 100 to become aligned as described above.)

i. The dock actuator is now activated, drawing the test head 100 into a fully docked position with the target apparatus 1201, as illustrated in step 1628. In a manually actuated dock such as the docking apparatus shown in FIG. 9(*a*), this is accomplished by applying force to the docking handle 914, which causes the docking cam 910 in FIG. 9(*a*) or the cable driver(part of unit 914) in FIG. 12(*a*) to rotate. In docks having powered actuators this is accomplished by appropriately energizing the actuator. As the test head 100 is drawn into final docked position, it is free to move compliantly in all six degrees of spatial freedom. If desired, although this is not always preferred, selected axes may have their locks 118 engaged to restrict compliant motion in corresponding degrees of freedom.

The design of the docking mechanism is typically such that the test head 100 is effectively latched in place when the docking actuator has reached its fully docked limit. Accordingly, the test head 100 is now fully docked, latched in position, and mechanically ready to test devices.

Operation in a manipulator-driven system with non-latched docking is now considered. In such a system, the manipulator must overcome the forces associated with docking. These forces typically arise from the need to compress hundreds or thousands of spring-loaded pogo pins and/or the need to couple hundreds or thousands of mating contacts in electrical connectors. With each such pogo pin or contact requiring a few grams or ounces of force, total docking forces of a few hundred pounds are often encountered. For manipulator driven docking, the manipulator drive mechanisms used in docking must be capable of overcoming the docking forces in addition to the forces required to move the test head or load 100 in free space. If the driven axes are balanced, the driving forces are reduced.

The use of BCAA mechanisms in axes that will be driven axes in manipulator driven docking is advantageous. First, the actuator driving the axis can typically be readily sized to have sufficient drive capability to overcome the docking forces in addition to the forces needed to maneuver the test head or load 100. Also if the axis in question is designed so that it can be maneuvered in a balanced condition with the lock 118 unlocked, the relative position sensor can be used to detect encounters with obstructions or obstacles (see, for example, discussion of FIGS. 10(*a*) through 10(*f*)). Additionally, the force sensor 120 may be used to detect encounters with obstacles and obstructions in cases where the test head 100 or maneuvering is performed with the lock 118 locked.

Recall that in actuator driven docking it is typical that the dock apparatus is equipped with guide pins 912 on one side and mating guide holes 912*a* on the other side to guide the test head 100 into alignment with the test site of the device handler (1208 in FIG. 12(*a*)) or prober. Two guide pins 912 that fit into two closely fitting holes 912*a* will provide alignment in five degrees of spatial freedom provided there is sufficient length of the pin 912 and depth of the hole 912*a*. If the surfaces being docked are planar, these degrees of freedom include X, Y and Theta in the plane and pitch and roll with respect to the plane. The remaining degree of freedom is the perpendicular distance between the two planes, which is controlled by the docking actuator mechanism. This technique may also be used in manipulator-driven docking; however, other techniques are also known such as that disclosed in the previously discussed [Graham et al.].

A procedure for manipulator driven docking is outlined below, and is illustrated in a flowchart in FIG. 15(*n*). This procedure follows the general form of the previous procedure for actuator driven docking.

1) The system is prepared to maneuver the test head or load 100 to a ready to dock position from a starting point that is apart from the target apparatus.

a) The compliant drives and/or BCAAs on the horizontal (in-out, side-to-side, and swing) axes are brought to a compliant ready condition, and their locks 118 are locked, as illustrated in step 1630.

b) The pitch and yaw BCAAs are brought to a compliant ready condition, and their locks 118 are locked, as illustrated in step 1631.

c) The BCAA in the vertical drive mechanism is brought to a compliant ready condition (using Compliant Ready Sequence 1), and its lock 118 is unlocked, as illustrated in step 1632.

2) The test head or load 100 is now maneuvered to a ready to dock position with the target apparatus, as illustrated in step 1633. To do so, the controller controls the actuators to move the test head 100 along a path of motion to bring it to a ready to dock position, where the docking apparatus of the two halves have come into proximity with or have just engaged their mating pieces. The controller may use algorithms to effect this, or an operator may guide the process by using pushbuttons, joysticks, and/or other suitable input devices to the controller.

3) From Ready to Dock to Fully Docked a) Preparation: All axes of the manipulator having BCAAs are re-balanced. Each BCAA is balanced in turn, as illustrated in step 1634. Balancing a particular BCM may upset the balance of some other BCAA. Accordingly, the process is repeated until the force sensor of each BCAA indicates a balanced condition. (Typically this goal is achieved in three or less iterations, and usually in two iterations.)

b) If pressure sensors are incorporated in any of the BCAAs, the present pressure is read by the controller and stored in the controller's memory for later use, as illustrated in step 1635.

c) The axes that will be driven and controlled are determined, as illustrated in step 1636. These may be predetermined by design in application specific installations, but in a general situation the equipment to which the test head 100 is being docked will determine them. Typically the selected axes will at least enable motion along a path that is perpendicular to the docking plane of the handler or prober, which may be horizontal, vertical, or inclined at an angle to the horizontal. In certain applications it might also be desirable to drive and control axes that effect the planarization of the two surfaces being brought together.

d) The locks 118 in the non-driven and non-controlled axes are all unlocked, allowing balanced-compliant motion in these axes while moving to the fully docked position, as illustrated in step 1637. The locks 118 of the axes that will be driven and controlled are kept in a locked condition. (Note that, by design, the clutch of the roll axis motor is disengaged automatically whenever the motor is not actuated and the roll axis is not being driven as described in U.S. patent application Ser. No. 09/646,072 due to Holt et al. (Also note that if the roll axis is to be driven as part of the docking motion, then it is required to be equipped with a means to enable non-torque limited operation as described above.). The test head or load 100 is now in a balanced-compliant condition.

e) The test head 100 is further maneuvered to a position of initial alignment as determined by sensors and/or the partial insertion of tapered guide pins 912 into guide pin receptacles 912*a,* as illustrated in step 1638. In so doing, the test head 100 becomes aligned to within a few thousandths of an inch and within approximately one degree of planarity with the target apparatus. This is an overall motion of typically less than one inch, and in a manipulator driven system maneuvering is typically performed by using the controller to urge the test head 100 into this initial alignment position. To do so the controller urges the test head 100 along a straight line path that is perpendicular to the plane of the docking area on the target apparatus. If axes other than the axes selected in step 2)c) above are used in this step, then they must be locked prior to the motion and unlocked again following the motion (The other axes are left unlocked to permit the necessary compliance.)

f) The test head 100 is driven into a fully docked position with the target apparatus, as illustrated in step 1639. The axes selected in step 1636 above are driven and controlled by the system controller to move the test head 100 along an appropriate path into its fully docked position. As the test head 100 is driven into final docked position, it is free to move compliantly in all of the non-selected axes. However, if desired, certain non-selected axes may have their locks 118 engaged to restrict compliant motion in corresponding degrees of freedom; however, this is generally not a preferred mode of operation. As this motion takes place, appropriate position sensors are monitored. As a minimum one or more position sensors are required to signal when the test head 100 has arrived at its fully docked position. Other sensors may be utilized if necessary to maintain and improve the alignment and planarization of the test head 100 as it is moved into docked position, provided that appropriate axes are driven and controlled during the procedure.

4) The driven axes (selected in 1636 above) are stopped and maintained in a fully locked condition, when the test head 100 is fully docked, as illustrated in step 1640. They must remain in this condition during subsequent testing and use of the test head 100, unless a latching mechanism is provided in the docking hardware to maintain the test head 100 in its docked position. Such a latch could be controlled by the controller and activated upon the signal indicating that the docked position has been achieved.

Alternative techniques of maintaining the docked position of the test head with the test head apparatus include locking or not locking some or all of the manipulator motion axes. An additional technique is maintaining the balanced condition of the test head 100 by monitoring and maintaining the pressures in the cylinders 128 of the BCM's.

In the methods for docking, two intermediate positions of the test head 100 are identified in each case: ready to dock in both cases and ready to actuate in actuator driven docking and the corresponding position of initial alignment in manipulator driven docking. In certain cases, the two intermediate positions may be one in the same. Also in certain docks, mechanical catches may be utilized to capture and hold the test head 100 in either or both of these intermediate positions. These catches, when activated, prevent the test head 100 from moving away from the obtained docked position docking position, but allow it to move to the next docking position. The use of these catches augments the above methods rather than creating new methods.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

The invention claimed is:

1. A method of docking an electronic test head held in a test head manipulator to an electronic device handler, said method comprising the steps of: measuring a magnitude of an imbalance force about at least one of a plurality of motion axes of said test head manipulator; and providing a counter force to said imbalance force until said imbalance force is substantially zero.

2. A method of docking an electronic test head to an electronic device handler, said method comprising the steps of: measuring a magnitude of an imbalance force about at least one of a plurality of motion axes of said test head; providing a counter force to said imbalance force until said imbalance force is substantially zero; and moving said test head towards a docking position relative to said device handler while said counter force is applied.

3. A method of docking an electronic test head held in a test head manipulator to an electronic device handler, said method comprising the steps of: measuring a magnitude of an imbalance force about at least one of a plurality of motion axes of said test head manipulator; providing a counter force to said imbalance force until said imbalance force is substantially zero; and moving said test head towards a docking position relative to said device handler while said counter force is applied.

4. A method of docking a test head to a handler, said method comprising the steps of: measuring an imbalance force about at least one of a plurality of motion axes of said test head; providing a counter force to said imbalance; and aligning at least one of a plurality of alignment structures attached to one of said test head and said handler to at least one of a plurality of alignment receptacles attached to another of said test head and said handler, said step of aligning being completed while said counter force is provided.

5. A method of docking a test head with a device handler, said method comprising the steps of: providing an apparatus which includes:
   a controller,
   a docking apparatus that has an actuator controlled by the controller and which defines an interface plane,
   a test head manipulator that has: two or more degrees of motion that allow the test head to be planarized with the device handler with respect to the interface plane, one or more driven axes of motion controlled by the controller that allow the test head to be moved along and about an axis that is perpendicular to the interface plane; manipulating the test head to a ready to dock position; driving the test head along said axis to a ready to actuate position; and operating the actuator to pull the test head into a fully docked position, and a balancing unit for measuring an imbalance force about one of the driven axes and for providing a counter force to said imbalance force to planarize the test head.

6. The method of claim 5, further comprising the step of: latching the test head when in the fully docked position.

7. The method of claim 5, further comprising the step of: locking the driven axes when the test head is in the fully docked position.

8. The method of claim 5, wherein one or more axes corresponding to said two or more degrees of freedom are balanced.

9. The method of claim 5, wherein one or more axes corresponding to said two or more degrees of freedom are compliant.

10. The method of claim 5, wherein one or more axes corresponding to said two or more degrees of freedom are driven and controlled by the controller.

11. The method of claim 5, wherein one or more of the driven axes are compliant.

12. The method of claim 5, wherein one or more of the driven axes are balanced.

13. The method of claim 12, wherein one or more of the balanced axes are balanced by a balancing unit.

14. A method of docking a test head with a device handler, said method comprising the steps of: providing an apparatus which includes: a controller, a docking apparatus that defines an interface plane, a test head manipulator that has: two or more degrees of motion that allow the test head to be planarized with the device handler with respect to the interface plane, one or more driven axes of motion controlled by the controller that allow the test head to be moved along an axis that is perpendicular to the interface plane; measuring an imbalance force about said axis; providing a counterforce to said imbalance force to planarize the test head; manipulating the test head to a ready to dock position; and driving the test head along said axis to a fully docked position.

15. The method of claim 14, further comprising the step of: latching the dock when in the fully docked position.

16. The method of claim 14, further comprising the step of: locking the driven axes when the test head is in the fully docked position.

17. The method of claim 14, wherein one or more axes corresponding to said two or more degrees of freedom are compliant.

18. The method of claim 14, wherein one or more axes corresponding to said two or more degrees of freedom are driven and controlled by the controller.

19. The method of claim 14, wherein one or more of the driven axes are compliant.

20. The method of claim 1, additionally comprising the step of: maintaining said counter force while said test head is docked.

21. The method of claim 1, additionally comprising the step of: recording the amount of said counter force.

22. The method of claim 1, additionally comprising the step of: reapplying said counter force before undocking said test head.

23. The method of claim 1, additionally comprising the step of: applying said counter force with a pneumatic cylinder.

24. The method of claim 23, additionally comprising the steps of: measuring and recording the air pressure which generated said counter force.

25. The method of claim 23, additionally comprising the step of: maintaining the air pressure applied to said pneumatic cylinder while said test head is docked.

26. The method of claim 23, additionally comprising the steps of: restoring and reapplying the air pressure to said pneumatic cylinder before undocking said test head.

27. The method of claim 2, additionally comprising the step of: maintaining said counter force while said test head is docked.

28. The method of claim 2, additionally comprising the step of: recording the amount of said counter force.

29. The method of claim 2, additionally comprising the step of: reapplying said counter force before undocking said test head.

30. The method of claim 2, additionally comprising the step of: applying said counter force with a pneumatic cylinder.

31. The method of claim 30, additionally comprising the steps of: measuring and recording the air pressure which generated said counter force.

32. The method of claim 30, additionally comprising the step of: maintaining the air pressure applied to said pneumatic cylinder while said test head is docked.

33. The method of claim 30, additionally comprising the steps of: restoring and reapplying the air pressure to said pneumatic cylinder before undocking said test head.

34. The method of claim 3, additionally comprising the step of: maintaining said counter force while said test head is docked.

35. The method of claim 3, additionally comprising the step of: recording the amount of said counter force.

36. The method of claim 3, additionally comprising the step of: reapplying said counter force before undocking said test head.

37. The method of claim 3, additionally comprising the step of: applying said counter force with a pneumatic cylinder.

38. The method of claim 37, additionally comprising the steps of: measuring and recording the air pressure which generated said counter force.

39. The method of claim 37, additionally comprising the step of: maintaining the air pressure applied to said pneumatic cylinder while said test head is docked.

40. The method of claim 37, additionally comprising the steps of: restoring and reapplying the air pressure to said pneumatic cylinder before undocking said test head.

41. The method of claim 4, additionally comprising the step of: maintaining said counter force while said test head is docked.

42. The method of claim 4, additionally comprising the step of: recording the amount of said counter force.

43. The method of claim 4, additionally comprising the step of: reapplying said counter force before undocking said test head.

44. The method of claim 4, additionally comprising the step of: applying said counter force with a pneumatic cylinder.

45. The method of claim 44, additionally comprising the steps of: measuring and recording the air pressure which generated said counter force.

46. The method of claim 44, additionally comprising the step of: maintaining the air pressure applied to said pneumatic cylinder while said test head is docked.

47. The method of claim 44, additionally comprising the steps of: restoring and reapplying the air pressure to said pneumatic cylinder before undocking said test head.

48. The method of claim 8, additionally comprising the step of: maintaining a counter force provided by said balancing unit to balance said one or more balanced axes while said test head is docked.

49. The method of claim 8, additionally comprising the step of: recording the amount of a counter force provided by said balancing unit to balance said one or more balanced axes.

50. The method of claim 8, additionally comprising the step of: reapplying a counter force provided by said balancing unit to balance said one or more balanced axes before undocking said test head.

51. The method of claim 8, additionally comprising the step of: applying a counter force provided by said balancing unit to balance said one or more balanced axes with a pneumatic cylinder.

52. The method of claim 51, additionally comprising the steps of: measuring and recording the air pressure which generated said counter force.

53. The method of claim 51, additionally comprising the step of: maintaining the air pressure applied to said pneumatic cylinder while said test head is docked.

54. The method of claim 51, additionally comprising the steps of: restoring and reapplying the air pressure to said pneumatic cylinder before undocking said test head.

55. The method of claim 13, additionally comprising the step of: maintaining a counter force provided by said balancing unit to balance said one or more balanced axes while said test head is docked.

56. The method of claim 13, additionally comprising the step of: recording the amount of a counter force provided by said balancing unit to balance said one or more balanced axes.

57. The method of claim 13, additionally comprising the step of: reapplying a counter force provided by said balancing unit to balance said one or more balanced axes before undocking said test head.

58. The method of claim 13, additionally comprising the step of: applying a counter force provided by said balancing unit to balance said one or more balanced axes with a pneumatic cylinder.

59. The method of claim 58, additionally comprising the steps of: measuring and recording the air pressure which generated said counter force.

60. The method of claim 58, additionally comprising the step of: maintaining the air pressure applied to said pneumatic cylinder while said test head is docked.

61. The method of claim 58, additionally comprising the steps of: restoring and reapplying the air pressure to said pneumatic cylinder before undocking said test head.

62. The method of claim 14, wherein one or more axes corresponding to said two or more degrees of freedom are balanced, additionally comprising the step of: maintaining a counter force provided by said balancing unit to balance said one or more balanced axes while said test head is docked.

63. The method of claim 14, wherein one or more axes corresponding to said two or more degrees of freedom are balanced, additionally comprising the step of: recording the amount of a counter force to balance said one or more balanced axes.

64. The method of claim 14, wherein one or more axes corresponding to said two or more degrees of freedom are balanced, additionally comprising the step of: reapplying a counter force balance said one or more balanced axes before undocking said test head.

65. The method of claim 14, wherein one or more axes corresponding to said two or more degrees of freedom are balanced, additionally comprising the step of: applying a counter force to balance said one or more balanced axes with a pneumatic cylinder.

66. The method of claim 65, additionally comprising the steps of: measuring and recording the air pressure which generated said counter force.

67. The method of claim 65, additionally comprising the step of: maintaining the air pressure applied to said pneumatic cylinder while said test head is docked.

68. The method of claim 65, additionally comprising the steps of: restoring and reapplying the air pressure to said pneumatic cylinder before undocking said test head.

* * * * *

UNITED STATES PATENT AND TRADEMARK OFFICE
CERTIFICATE OF CORRECTION

PATENT NO.         : 7,340,972 B2                                              Page 1 of 1
APPLICATION NO.    : 11/376584
DATED              : March 11, 2008
INVENTOR(S)        : Nil O. Ny et al.

It is certified that error appears in the above-identified patent and that said Letters Patent is hereby corrected as shown below:

At Column 61, line 25, "counter force provided by said balancing unit to balance said" should read --counter force to balance said--

At Column 62, line 9, "counter force balance" should read --counter force to balance--

Signed and Sealed this

Second Day of September, 2008

JON W. DUDAS
*Director of the United States Patent and Trademark Office*